United States Patent [19]

Del Rosso

[11] Patent Number: 4,689,615
[45] Date of Patent: Aug. 25, 1987

[54] DISPLAY OF DATA SOURCE TRENDS

[75] Inventor: Victor Del Rosso, Ithaca, N.Y.

[73] Assignee: Hi-Speed Checkweigher Co., Inc., Ithaca, N.Y.

[21] Appl. No.: 548,567

[22] Filed: Nov. 3, 1983

[51] Int. Cl.⁴ .............................................. G09G 1/00
[52] U.S. Cl. .................................. 340/722; 340/721; 340/753; 364/567; 177/25
[58] Field of Search .............. 340/762, 756, 722, 753, 340/754, 721, 717; 364/567, 568; 177/25, 26, 30, 31

[56] References Cited

U.S. PATENT DOCUMENTS

| | | | |
|---|---|---|---|
| 4,009,566 | 3/1977 | Ho | 340/762 |
| 4,183,025 | 1/1980 | Kutaragi et al. | 340/722 |
| 4,216,462 | 8/1980 | McGrath et al. | 340/870.11 |
| 4,318,447 | 3/1982 | Northoutt | 364/567 |
| 4,328,874 | 5/1982 | Gumberich et al. | 364/567 |
| 4,344,493 | 8/1982 | Salmonsen et al. | 364/567 |
| 4,381,505 | 4/1983 | Dien | 340/756 |
| 4,419,734 | 12/1983 | Wolfson et al. | 364/567 |
| 4,441,567 | 4/1984 | Hinano | 364/567 |
| 4,466,500 | 8/1984 | Masher et al. | 364/567 |
| 4,508,186 | 4/1985 | Sashiki et al. | 364/567 |
| 4,512,428 | 4/1985 | Bollivant | 364/568 |
| 4,549,620 | 10/1985 | Dee et al. | 364/567 |

OTHER PUBLICATIONS

Hall, Microprocessors and Digital Systems, 1980, pp. 107–108.
Stephen Ehrhardt & F. A. Romann; Trend Tracker Program; May 25, 1983; Pertinent Pages, A11.

*Primary Examiner*—Marshall M. Curtis
*Attorney, Agent, or Firm*—Bean, Kauffman & Bean

[57] ABSTRACT

A visual display of the trend of a data source is provided through the use of bar-graph techniques and digital display means controlled by a computer system which analyzes the output of the data source in accordance with criteria established by an operator.

30 Claims, 12 Drawing Figures

DISPLAY OF DATA SOURCE TRENDS

THE INVENTION

This invention relates to a means to visually present the trend of data representing a variable through the use of bar-graph and digital techniques.

BACKGROUND OF THE INVENTION

Modern technology has created a demand for rapid analysis of data trends to enable an operator to arrive at rapid, accurate command decisions. An example of an environment requiring rapid data analysis of this type may be found in the high speed technology of consumer packaging wherein accurate and repeatable weights or volumes of consumer goods must be monitored without interrupting or slowing down the productivity of the packaging line.

A typical example of the need for high speed checking occurs in an automated packaging line for a food product. In such a line, each package must contain a precise amount of material to comply with truth in consumer product labeling laws, to avoid losses to the supplier resulting from over filling, and to avoid customer dissatisfaction resulting from under filling. In a typical automated packing facility subject to the preceding problems, a material to be packaged is metered into containers and the weight or volume of each filled container is checked. The metering devices for filling each container are accurate but subject to variations in the form of trends diverging from the target quantity to be metered. These trends result from a variety of sources such as equipment calibration changes due to wear, power source variations or any number of factors which affect the ability of the metering devices to accurately perform their functions. Additional sources of variations are in the products themselves, that is, changes in density, granular size or mix of a product may seriously alter the ability of the metering device to accurately fill the containers.

Variations in the ability of the metering device to fill containers is generally exhibited as a relatively slow trend which, if noted early enough, may be corrected without seriously interrupting the packaging line. If not noted, the gradual change or trend away from the target value will suddenly manifest itself as a serious interruption in the high speed package processing system due to all of the packages suddenly being outside allowable limits.

Another problem which occurs in checking high speed packaging systems resides in the fact that in many systems the packages travel through the assembly line so rapidly that, although accurate contents quantity checks are made, an operator cannot read the results of a weight or volume check. This is due to the very rapid presentation necessitated by the speed at which each package passes the check point. If the operator can read the check value, it is often difficult to recognize a deviation or activate a control to remove the faulty package from the line within the time available.

OBJECTIVES OF THE INVENTION

In view of the inability of prior art display systems to indicate trends, it is a primary objective of the present invention to provide an indicator which will analyze data and accurately display the trend of the data with respect to a target value.

In view of the inability of known indicators to provide an instantaneous, real time average value for a selected number of data inputs, another objective of the present invention is to accumulate a preselected number of data samples and provide a display of the average value thereof until replaced by a following sample.

A still further objective of the present invention is to provide a visual display means in combination with a data processing system adapted to present the data trend relative to a target point via bar-graph techniques.

A still further objective of the present invention is to provide a numerical display of the average value of a predetermined number of quantity measurements.

Another objective of the present invention is to provide a bar-graph indication of data trends combined with a numerical presentation of the quantitative measurement represented by the data.

A still further objective of the present invention is to provide a data processing system including operator control means to adapt the system to analyze input data in accordance with one or more of a number of parameters and provide a display means indicative of trends relative to said selected values.

A further objective of the present invention is to provide a means for operator control of a data processing system whereby an operator may select an arbitrary sample rate for which the system will present average values on a real time basis, displaying one average value until a second value is computed.

A still further objective of the present invention is to provide a data processing system capable of receiving data from a weighing means and providing a bar-graph display indicative of the net weight sensed by the weighing means.

A further objective of the present invention is to provide a data processing and display system for processing data from a weighing means and providing a bar-graph display of deviations from a target weight.

Another objective of the present invention is to provide a data processing system adapted to receive data from a weighing means of the type adapted to sequentially weigh a plurality of items passing a station and provide real time cumulative totals therefrom.

A further objective of the present invention is to provide a data processor and display system which will provide either instantaneous data relating to each package weighed by a checkweigher or averaged data relating to a predetermined number of packages weighed by a checkweigher.

Another objective of the present invention is to provide a bar-graph display capable of functioning in an equivalent or proportional mode. In the equivalent mode, magnitude is presented linearly with each graph segment representing an equal value. In the proportional mode, magnitude is presented as a non-linear display having quasi logarithmic qualities.

The foregoing and other objectives of the invention will become apparent in light of the drawings, specification and claims contained herein.

SUMMARY OF THE INVENTION

Presented herein is a multifunctional display means for presenting quantitative data based on inputs from a source. The quantitative data are presented in numerical format by four 7-segment digit indicators and graphically by a 24-segment LED bar display. The numerical presentation may represent a target value, real data, an average or sum. The graphic presentation may selectively present data as an absolute function with the segments of the bar representing the data in a linear fashion or alternately as a non-linear, proportional function to compress those areas of the graph of least significance while expanding the areas of most significance. The bar-graph display may also be used to present deviations from a target value with the bar indicating to either side of the central target value. In this mode of operation, the bar-graph presentation again may be linear or non-linear in accordance with the desires of the operator.

The various modes of display may represent in individual data occurrence such as the weight of a single package, the trend of a plurality of occurrences, or the average value of a predetermined number of occurrences.

The different functions are accomplished through an operator programmable data processing system comprised of a microprocessor with associated programmable read-only memories and random-access memories adapted to provide driving signals via controllable latching circuits to digital display devices and LED bar-graph segments.

The quantitative data is coupled to the data processor by a universal asynchronous receiver-transmitter which is selectively coupled to the data processor via a switching means responsive to operator controls for adapting the system to a wide variety of source devices having a variety of data formats.

DESCRIPTION OF THE INVENTION

Figure 1:
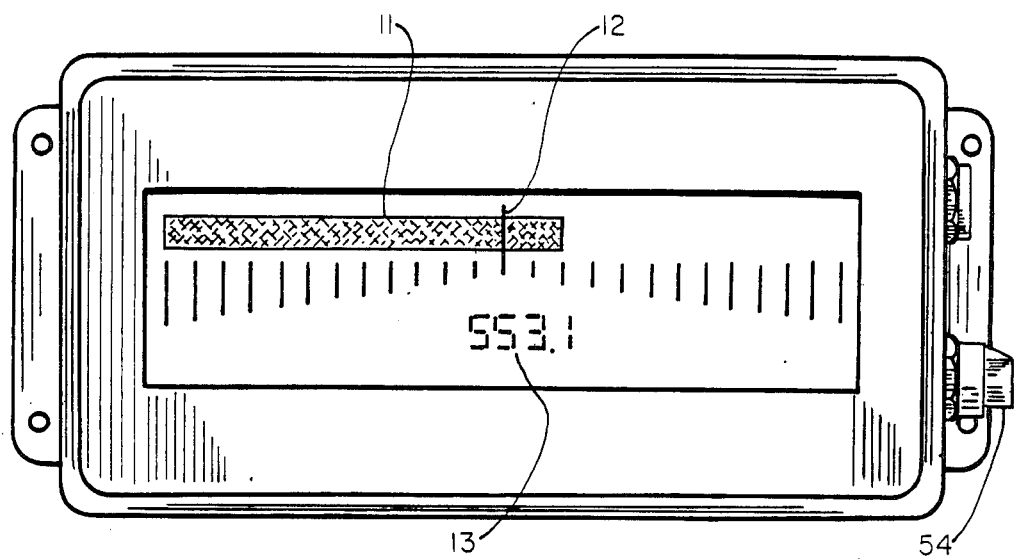
FIG. 1 is a front view of a typical Trend Tracker display.

FIG. 1 is a front view of the Trend Tracker display. The graphic portion of the display is comprised of twenty-four 0.0350 inch LED elements 11 arranged to form a horizontal bar-graph presentation. A central scribe mark 12 bisects the LED display and provides a central reference point when the display is functioning in a deviation from target value mode. As illustrated, the bar-graph display is indicating a maximum negative deviation from target value, if the system is in a deviation mode.

Immediately below the center of the bar-graph display comprised of the twenty-four LED segments 11, is a numerical display comprised of four 7-segment digital display elements 13. The numerical display 13 is controlled separately from the bar-graph display 11 and therefore the values represented do not necessarily have to coincide or be representative of an identical mode of data consideration.

Figure 2:
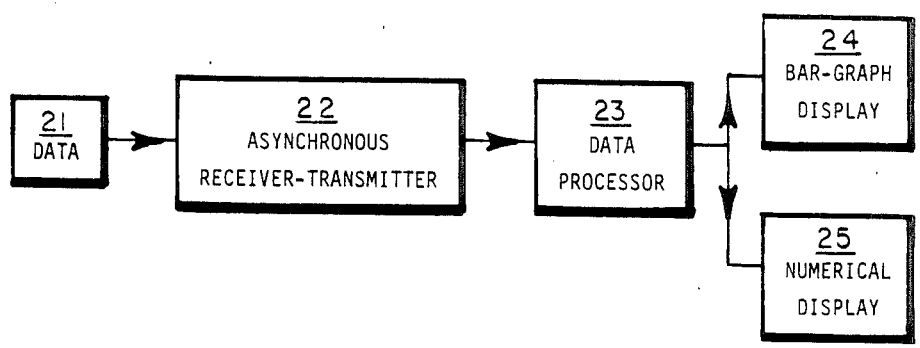
FIG. 2 is a block diagram of the Trend Tracker circuitry.

FIG. 2 is a block diagram of the basic Trend Tracker circuitry illustrating the interrelationship of the primary elements of the system. A data event function 21 derived from a source such as a checkweigher is applied with a serial bit stream to an asynchronous receiver-transmitter 22 which is electronically configured via operator controls to be compatible with the format of the data received from 21. The asynchronous receiver-transmitter converts the serial data into a parallel output word which is applied to data processor 23 which processes the received data and provides outputs to drive the LED bar-graph display 24 and numerical display 25.

Figure 3:
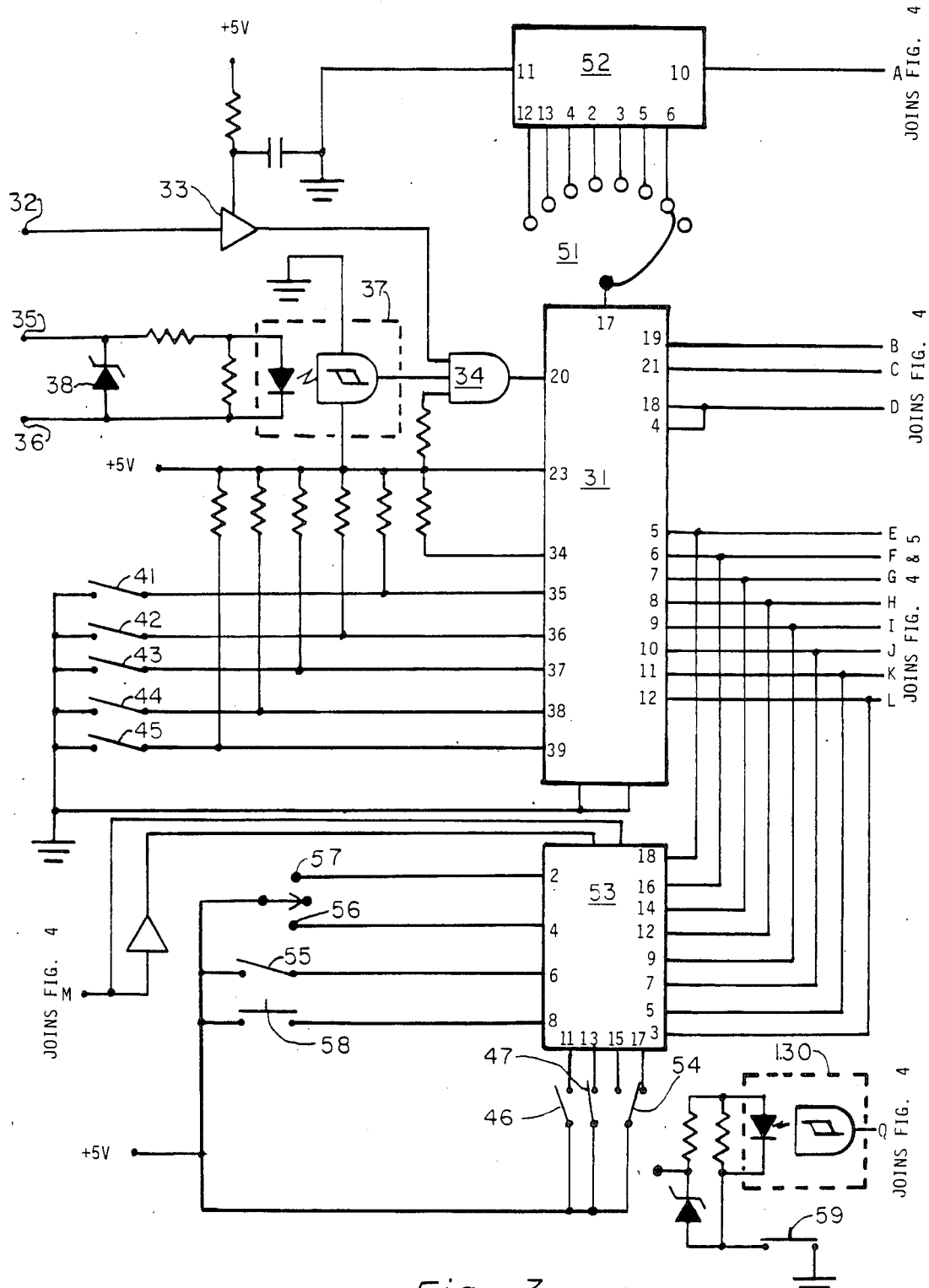
FIG. 3 is a schematic diagram of the universal asynchronous receiver-transmitter and input circuitry section of the Trend Tracker.

The asynchronous receiver-transmitter and associated input circuitry section of the Trend Tracker illustrated as 22 in FIG. 2 is illustrated in detail in FIG. 3. The nucleus of this section of the Trend Tracker is provided by an asynchronous receiver-transmitter such as an Intersil Model IM6402 universal asynchronous receiver-transmitter (UART) which is adapted for interfacing the data processor with asynchronous serial data sources.

Asynchronous serial data received at input jack 32 is applied to the multiplexer within UART 31 via an interface amplifier 33 and a three-input positive AND gate 34 which drives the serial data input pin 20 of UART 31. The interface amplifier 33 in the exemplary circuit presented herein is provided by a Texas Instruments type SN75189A and the positive AND gate is provided by a type 7411 three-input positive logic AND gate which is incorporated in the circuit in a trued function, that is all three inputs are high and a high is presented to UART 31 at pin 20. When data is received at one of the input pins to AND gate 34, it is represented as a logic low and this is reflected through the gate to input pin 20 of UART 31 as a data bit.

AND gate 34 is actually provided a negative or function in that whenever any one of its inputs is driven low, the output will be driven low. Thus the gate provides means for additional channels to supply serial digital data comprised of negative logic pulses to UART 31. In FIG. 3, a current loop is illustrated as an alternate input channel. The current loop is comprised of input jacks 35 and 36 which provide an input via a photon coupled isolator 37. Photon coupled isolator 37 may be provided by a GE type H11L1 and the radiating diode thereof is protected from over voltage surges by zener diode 38.

Format control of the serial data received at pin 20 of UART 31 is accomplished through a control register within that integrated circuit which is controlled by six inputs applied to pins 34 through 39. Five of the inputs are controllable by the operator via five single-pole single-throw switches which may be DIP switches. These switches, 41 through 45, remove the logic high from their associated pin by grounding that input when closed. DIP switches 41 through 45 are placed in the desired open or closed position when the Trend Tracker is mated to a data source and remain in the set position until such time that a different data source having a different format is connected to the Trend Tracker or the format of the existing data source is modified.

Figure 4:
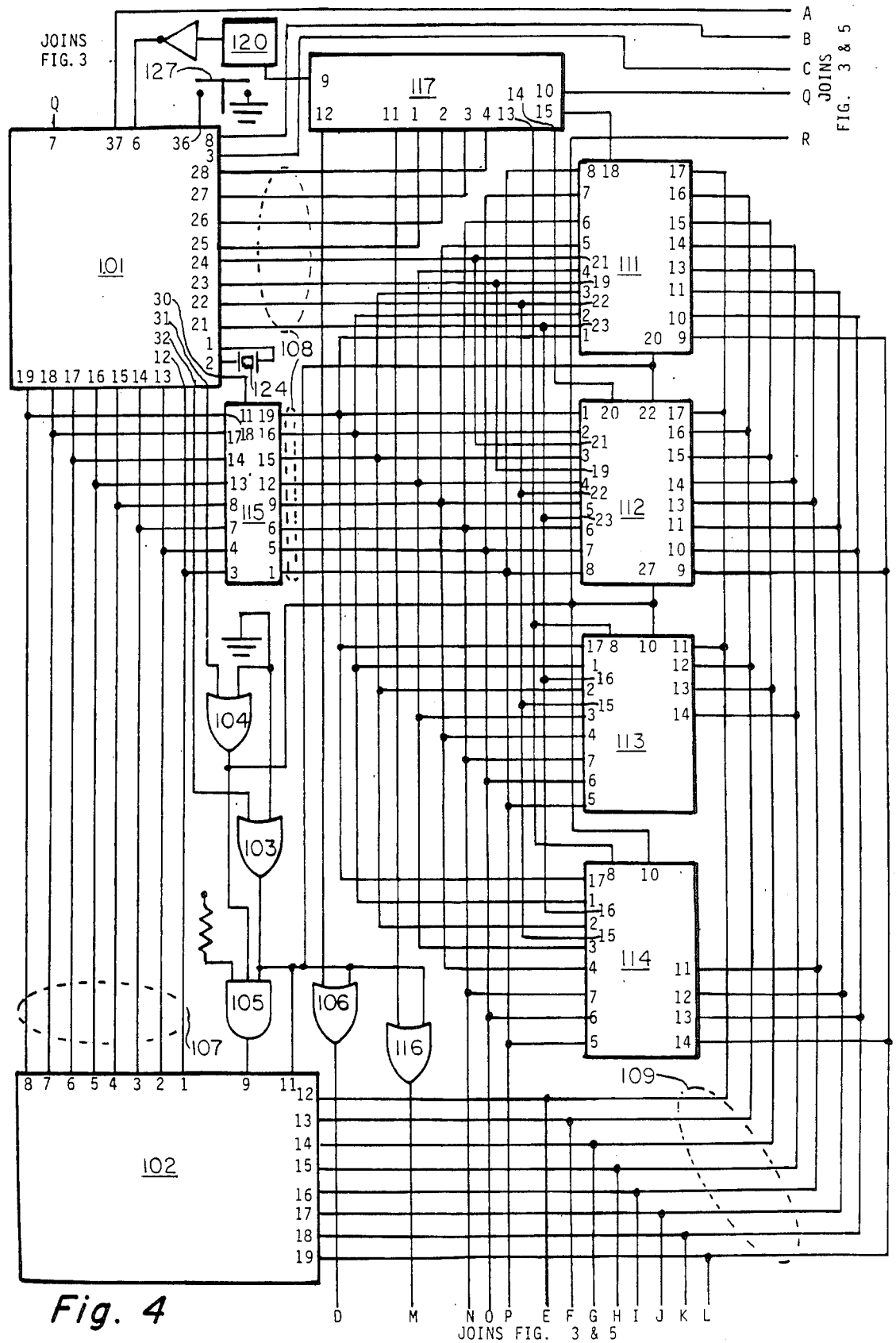
FIG. 4 is a detailed schematic diagram of the data processor section of the Trend Tracker.

Timing of UART 31 is provided by jumper 51 and divider 52 which selectively couple timing pulses from the data processor of FIG. 4 to the receiver timing and control circuit without UART 31 via pin 17. Divider 52 is provided by a type CD4040B ripple-carry binary divider in the illustrated embodiment which receives a timing pulse train from the data processor at input pin 10 and supplies twelve buffered output pulse trains of different timing characteristics. Seven of these pulse trains are coupled through jumper 51 to allow further matching of the system to the data source. In summary, DIP switches 41 through 45 provide a means to adapt UART 31 to the incoming format and jumper 51 provides a means to adjust the internal timing of the UART to match that of the received data.

The serial data received by UART 31 is converted to an eight-bit parallel word which is coupled to the data processor circuitry illustrated in FIG. 4.

The input circuitry section of the Trend Tracker illustrated in FIG. 3 also includes the various controls utilized by the operator to set the mode of system operation and limits. These controls are coupled to the data processor circuitry illustrated in FIG. 4 via the line driver 53 of FIG. 3 which is a type 74LS241 controlled by OR gate 116 (FIG. 4) in the illustrated embodiment. Parameter roll forward/reverse switch 54 functions in combination with a run/setup switch 55, data increment and decrement switches 56 and 57 respectively and enter switch 58 which are also coupled to the data processor via line driver 53. In a preferred embodiment of the present invention, run/setup switch 55 is a SPDT PC mount switch, increment switch 56, and decrement switch 57 are the two momentary positions of a single SPDT PC mount switch which has a center off position and enter switch 58 is a normally open push-button switch.

When the run/setup switch is closed, the data processor is placed in the setup mode and is responsive to the three-position parameter roll forward/reverse switch 54, the increment and decrement switches 56 and 57, and the enter push-button switch 58. When active, the parameter roll forward/reverse switch 54 selects the below listed functions by carrying the system to roll forward or reverse through the functions and a visual indication of function selection or data is provided by the numerical display as indicated in Table 1.

TABLE 1

| SELECTION | MODE/PARAMETER LIST | NUMERICAL DISPLAY |
|---|---|---|
| 1 | Actual Equivalent | BGAE |
| 2 | Actual Proportional | BGAP |
| 3 | Deviation Equivalent | BGdG |
| 4 | Deviation Proportional | BGdP |
| 5 | Actual for 7 Segment | SEGA |
| 6 | Deviation for 7 Segment | SEGd |
| 7 | Average Factor | AF/current average factor |
| 8 | Decimal Point Position | dpp/current dec. pt. position |
| 9 | Sensitivity | SENS flashed followed by current sensitivity of LEDs |
| 10 | Net Target Weight | NtGt flashed followed by current target weight |

When the run/setup switch 55 is placed in the setup position, the numerical display will indicate which of the above listed mode/parameters is selected. The selection may be changed by placing the parameter roll forward/reverse switch 54 to the roll forward or roll reverse position until the desired parameter is reached. The system may then be programmed to perform in accordance to this selected program by depressing enter push-button 58. If a numeric parameter is required for the particular mode/parameter selected, the value is adjusted through the use of the increment and decrement switches 56 and 57. Once the proper value has been selected for the mode/parameter, the enter push-button 58 is depressed, and entry of the data is signified by the numerical display flashing the value off and on once to acknowledge data input.

The first six selections, as indicated in Table 1, that are available via the parameter roll forward/reverse switch 54 are mode selections and no value is required for their entry. In programming the system, the desired mode is selected and the enter push-button switch 58 is depressed. The programming is then advanced via switch 54 to the next required programming entry selection. The first six selections in Table 1 are mode selections and no value is required during their entry. However, these mode selections are further modified through DIP switches 47 and 48 of FIG. 3. The functions of these two DIP switches with respect to program variations are indicated in Table 2.

TABLE 2

| DESIRED FORMAT | HOW TO SELECT IT MODE/PARAMETER LIST | |
|---|---|---|
| BG | | SWITCH 48 |
| BGAE Avg | BGAE | ON |
| BGAE Ins | BGAE | OFF |
| BGAP Avg | BGAP | ON |
| BGAP Ins | BGAP | OFF |
| BGdE Avg | BGdE | ON |
| BGdE Ins | BGdE | OFF |
| BGdP Avg | BGdP | ON |
| BGdP Ins | BGdP | OFF |
| SEG | | SWITCH 47 |
| SEGA Avg | SEGA | ON |
| SEGA Ins | SEGA | OFF |
| SEGd Avg | SEGd | ON |
| SEGd Ins | SEGd | OFF |

Selection 7, average factor, requires a numerical value to be set via the increment and decrement switches 56 and 57 before the enter push-button switch 58 is pressed.

When the decimal point position or selection 8 is selected by switch 54, the numerical display provides a numerical indication indicative of the decimal position. The display represents the number of decimal places after the decimal point. Thus, if 0 is entered in the data processor, the decimal point will be at the extreme right of the numerical display and if 3 is entered into the data processor, the decimal point will be at the extreme left of the numerical display. In this programming mode, the displayed values must be limited to within the range of 0 through 3. The decimal position is selected through the use of the increment and decrement switches 56 and 57 as previously explained and when the number representing the proper decimal point positions has been achieved, enter push-button 58 is depressed and the data will flash on and off once to indicate acceptance of the programmed data.

The sensitivity parameter is a numeric value giving, in units of actual weight, the number of units of weight above or below target which the package must be in order to light the first LED away from target. In other words, if the target weight is 1000 grams and the sensitivity is 2 grams, then the package weight must exceed by 2 grams from the target weight before the Trend Tracker would light one LED above target. In equivalent display mode, the sensitivity of each LED is identical. Therefore, if the sensitivity were 2 grams the range of the display would be from 24 grams above target to 22 grams below (in the actual weight format) or to 24 grams below (in the case of deviation format). Proportional mode is used to expand the range of the display while retaining sensitivity in the region of the target weight. This is accomplished by taking the LED sensitivity given by the user as the sensitivity of the LEDs adjacent to the target weight but the LEDs away from target grow increasingly less sensitive. This is accomplished by multiplying the sensitivity given by the user by a specified amount for each LED. The multiplier grows larger away from target. The net effect in the case of a 1000 gram target weight and a 2 gram sensitivity factor is that the first LED above target is lit at a package of 1002 grams. The second is lit at 1004 grams, then 1008, 1014, 1020, 1030, 1040, 1060, 1080, 1100, 1150, and 1200 grams for the twelfth LED above target. In actual net weight format the range will be from (target weight $-75\times$ sensitivity) to (target weight $+100\times$ sensitivity). In deviation mode the range extends to $-100\times$ sensitivity below target weight. The multipliers are, from target weight outwards, as follows: 1, 2, 4, 7, 10, 15, 20, 30, 40, 50, 75, 100. Note that this is an arbitrary scale selected not by a logarithmic or any other mathematical function, but selected for user-friendliness i.e. the multipliers are familiar, intuitively understandable values.

The target weight parameter is enterable in two different ways. First, it may be entered with the parameter, value and enter switches as described above. Second it may be entered while processing weights during the run mode by pressing the target strobe button, switch 59, on the side of the Trend Tracker box. Pressing this button causes the weight most recently accepted to the Trend Tracker to become the target weight. The operator can, with this target strobe button, pass a sample package equal to target weight over the scale, observe the value of the sample package at the Trend Tracker 7-segment display and then press the target strobe to select that value as target weight. Additionally, if the Trend Tracker is linked to HIGH SPEED's COMPUTAWEIGH II (previously known as SERIES VII), the target weight selected at the keyboard of the COMPUTAWEIGH It will be automatically sent to the Trend Tracker to serve as the Trend Tracker's target weight. This automatic value may be overridden by either the setup mode switches or target strobe button.

The Trend Tracker is configurable to show either instantaneous changes in package weight or trends averaged over N packages, where the value of N is set by the user with the parameter called average factor. Information for the bar graph and 7-segment displays is calculated from the average weight of the last N packages giving a rolling average. The average factor may be set to any integer between 1 and 99. In this way, the Trend Tracker can track an instanteous trend, a short term trend or a long term trend of up to the last 99 packages.

Additionally, the user may, while running packages and in the run mode, defeat the averaging in either the bar-graph or the 7-segment display by turning off switches 48 or 47 respectively, see Table 2. By altering the position of these two switches, the user may toggle between viewing instantaneous information and averaged information.

The setup parameters which define the display format are stored in non-volatile memory—Electrically Erasable Programmable Read Only Memory or EEPROM. This information is not lost when power is turned off. Therefore the device can be set up at the factory to whatever display format, sensitivity, and scaling the customer specifies (within the capability of the device), and shipped in a state that does not require the customer to set up the device. Furthermore the customer can turn off the device or move it from place to place without losing set up information.

The Trend Tracker is thus programmed to analyze and display data in accordance with an operators desires and will so analyze and display data when the run/setup switch is placed in the run position.

The output of the universal asynchronous receiver-transmitter 31 of FIG. 3 is provided at pins 5 through 12 of that integrated circuit and coupled to central processing unit (CPU) 101 of the data processor in FIG. 4 via a bidirectional data flow circuit 102. The bidirectional data flow circuit 102 is provided by a type AM73/8304B type Octal 3-state bidirectional bus transceiver in the illustrated embodiment. This bus receiver has two 8-channel ports that function in reciprocal modes to provide selective bidirectional data transmission.

The 8-bit parallel data word from UART 31 or line driver 53 of FIG. 3 is electrically coupled to the port of bidirectional bus transceiver 102 comprised of pins 12 through 19 via bus 109. The other port of 102 is comprised of pins 1 through 8 and it is connected to the input/output port of CPU 101, which is comprised of pins 12 through 19, via bus 107. The CPU 101 is an Intel type 8085A single chip 8-bit n-channel data processor in the illustrated embodiment.

When CPU 101 requires input data to set the various program functions, they are obtained via line driver 53 of FIG. 3 as previously explained and when CPU 101 requires input data to calculate display parameters, the data is obtained from UART 31 of FIG. 3. Either of these data sources are coupled to the input/output port of the CPU via the bidirectional bus transceiver 102 in response to a read control command from pin 32 of CPU 101 which is applied to the transmit/receive input control pin 11 of bidirectional bus transceiver 102 via OR gate 103. OR gate 103 is a type 74LS32 two-input OR gate in the preferred embodiment illustrated.

The chip disable input at pin 9 of the bidirectional bus transceiver 102 is responsive to a control output from CPU 101 provided at pin 31, through OR gate 104 (a type 74LS32) and AND gate 105, a type 7411 three-input positive AND gate.

The inputs from UART 31 and line driver 53 of FIG. 3 are provided over an eight line parallel bus 109 to the bidirectional bus transceiver 102 as previously explained. This bus also couples the CPU program from programmable read-only memories 111 and 112, which in the illustrated embodiment are provided by Intel type 2732A ultraviolet erasable PROMs having eight 4K-channels, to the CPU.

The system utilizes an eight-channel random-access memory comprised of two four-channel random-access memory devices 113 and 1114 which are Intersil type IM6514 CMOS static RAMs. Bus 109 is coupled to the input/output ports of those RAMs. Thus all data stored in PROMs 111 and 112 or RAMs 113 and 114 may be coupled via bus 109 to the central processing unit 101 via bidirectional bus transceiver 102 and bus 109.

Figure 5:
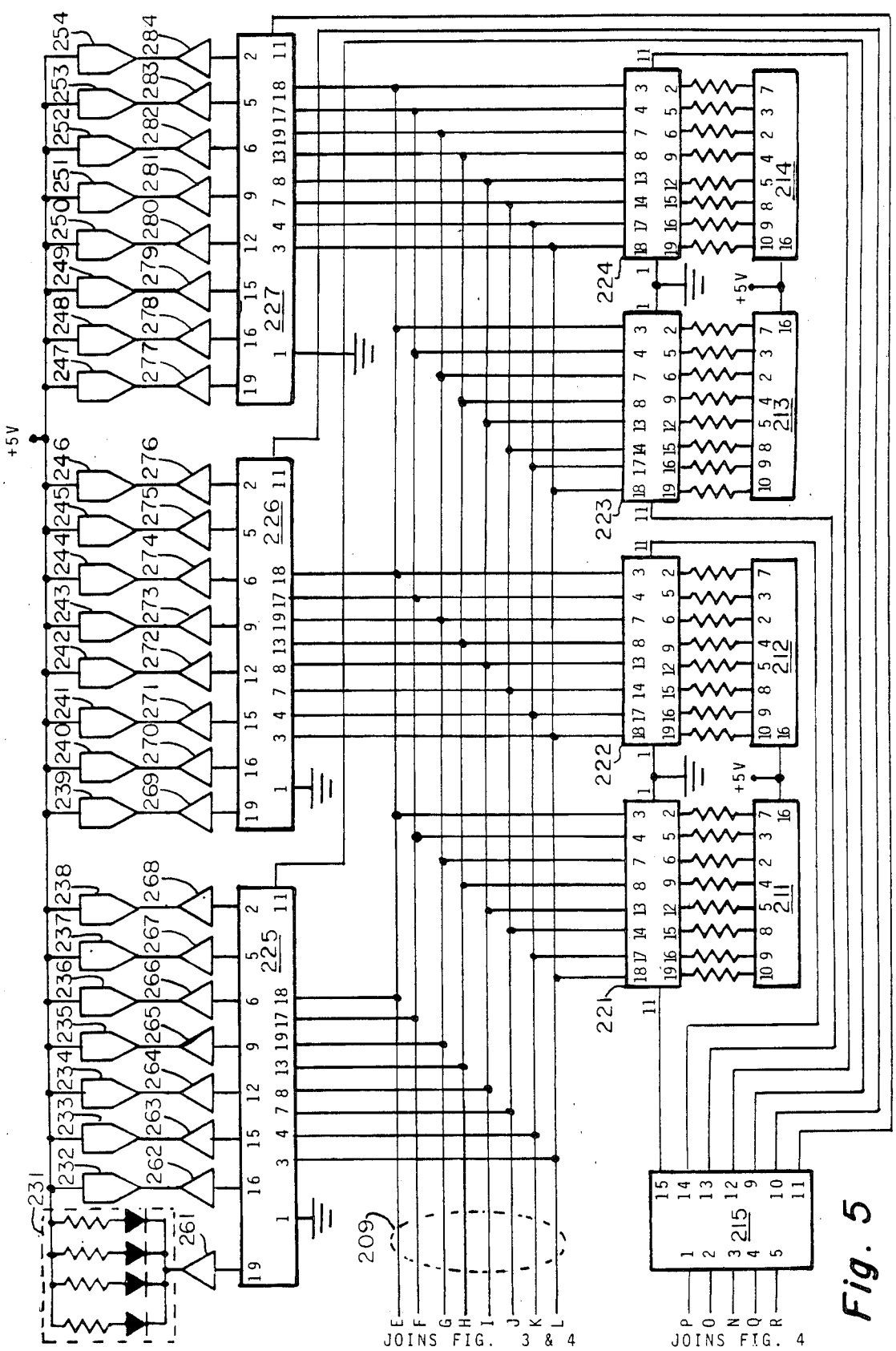
FIG. 5 is a schematic diagram of the display section of the Trend Tracker.

The CPU side of the bidirectional bus transceiver 102 is connected to the CPU via bus 107 which also couples the input/output ports of the CPU to an eight-channel latch 115, which in the illustrated embodiment is provided by a 74LS373 Octal D-type latch, which holds the control data output of CPU 101 and presents it via bus 108 to multiplexer 1117, a type 74LS138 line multiplexer which supplies control signals to the bar-graph and numerical displays of FIG. 5. Bus 108 is also connected between the address and control inputs of PROMs 111 and 112 and RAMs 113 and 114, and the address bus of CPU 101.

A type 555 timer 120 provides an input to the trap pin of CPU 101 which provides watch dog timing functions based on the RC time constant provided for by capacitor 121 and resistor 122. In the illustrated embodiment, the timer 120 is restarted every 10 MS by an input from decoder 117. If not restarted within this time period, the timer provides a control input to CPU 101 which causes the start of a recovery routine.

System timing is provided by a 2.4576 Mhz crystal 124 which is coupled to the timing input pins 1 and 2 of CPU 101.

System reset is provided by push-button switch 125 and associated circuitry which grounds reset pin 36 of CPU 101 when the switch is depressed.

The system is synchronized with the sequential functions being analyzed and displayed through restart commands received at pins 7 or 8 of the CPU. The pin 8 restart input is from UART 31 of FIG. 3 while the pin 7 restart input is provided, when necessary, by a target strobe input coupled to but isolated from pin 7 by photon coupled isolator 130 which is a G.E. Optoelectronics type H11L1 in the illustrated embodiment.

OR gate 106, a type 74LS32 gate in the illustrated embodiment, provides a control signal to UART 31 of FIG. 3 from the CPU 101 of FIG. 4. This control function enables the 8-bit parallel output of UART 31, making the data available on bus 109 on command.

Bus 109 of FIG. 4 connects to bus 209 of FIG. 5 and provides data for driving the numeric and graphic displays.

The numeric display is comprised of four digits, 211 through 214, each of which is a 7-segment numeric LED display such as a General Instruments Man 6760. Data for driving the numeric display is coupled from the CPU via buses 109 and 209 to octal latches 221 through 224 which in the illustrated embodiment are type 74LS373 octal latches, which, when set, maintain the numeric display constant while new data is being processed to update the display. This control of the display via latches 221 through 224 is exercised by latch enable commands received from decoder 215 which receives control inputs from CPU 101 and multiplexer 117 of FIG. 4.

Bus 209 also provides input data to the bar-graph display comprised of twenty-four light-bar modules 231 through 254 which, in the illustrated embodiment are Hewlett Packard type 2620 modules, each having four light emitting areas represented schematically by the four diodes in each module illustrated in FIG. 5.

Each light-bar module, 231 through 254, is energized through a high voltage and current Darlington array such as produced by Texas Instruments in their interface circuit type ULN2003A. The interface circuits, 261 through 284, couple the outputs from octal latches 225, 226 and 227 to the light-bar modules.

Octal latches 225 through 227 are 74LS373 octal latches controlled by decoder 215 outputs to present light-bar module driving data received from CPU 101. They hold the data for energizing the display while the system is calculating update display information.

The various functions provided by the Trend Tracker are accomplished under direction of CPU 101 in accordance with a program stored in the programmable read-only memories 111 and 112. This program was filed in the U.S. Copyright Office on Oct. 21, 1983 and subsequently assigned Registration Number TX 1-258-143, appended hereto as Appendix A. It accomplishes the functions illustrated by the flow diagrams presented in FIGS. 6 through 12.

Figure 6:
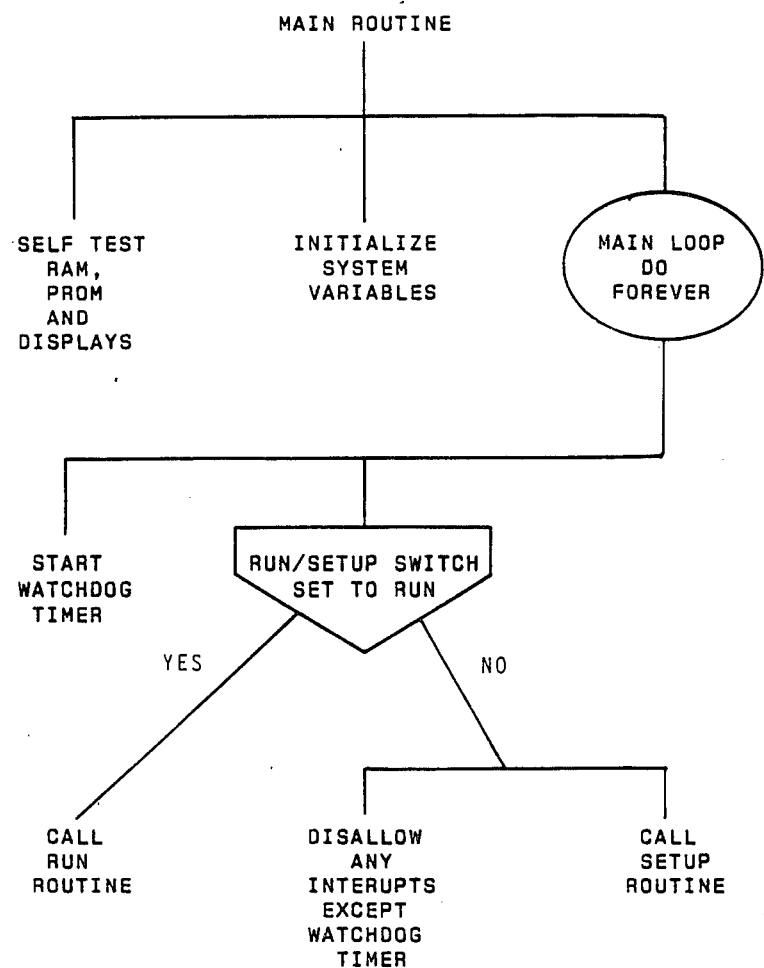
FIG. 6 is a logic tree diagram of the Trend Tracker main routine.

FIG. 6 presents the Trend Tracker main routine. When the system is energized, a start sequence is initiated to place the system in the correct posture to receive setup or run data and tests of RAM, program ROMs and displays are accomplished to ensure that the system program is accurate and the systems facilities available. The main loop is also initiated. This is a recirculating loop which is continually repeated until the system is shut down or the watch dog timer times out.

At the beginning of the main loop sequence, the watch dog timer is started and the run/setup switch position is determined.

The watch dog timer, as previously described, is a function of CPU 101 in combination with clock 120 which prevents erroneous displays in the event of a malfunction. This is accomplished by setting the time increment of the watch dog timer for a time slightly in excess of that required for an ongoing process. If the timer times out, the process is interrupted and the start sequence and programmable read-only memory check sum tests are repeated. When the start sequence and tests are completed satisfactorily, the main loop is again initiated. If either the start sequence of system self tests fails, a message is displayed to identify the problem and the main loop is inhibited until the system problems are corrected.

Figure 7:
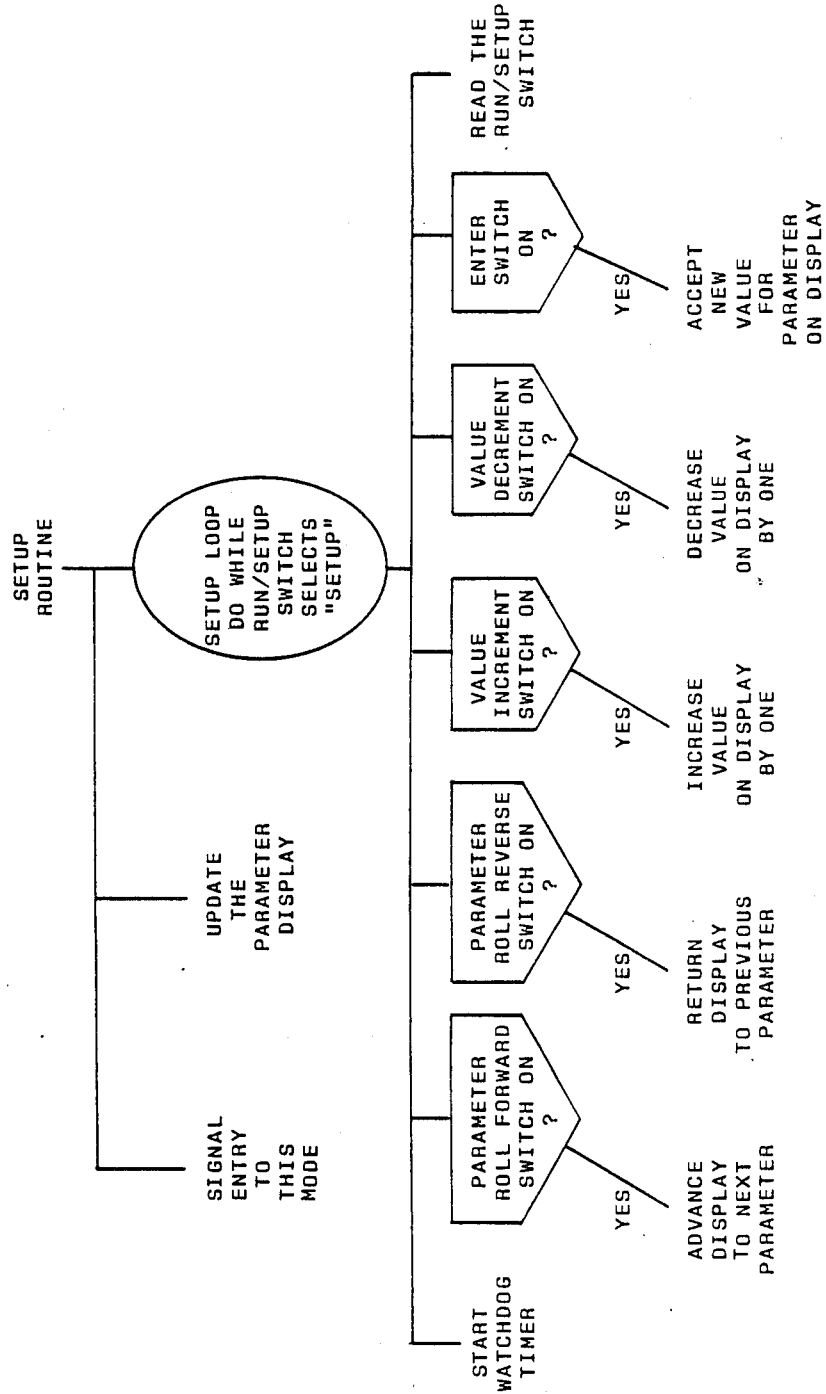
FIG. 7 is a logic tree diagram of the Trend Tracker setup routine. p

Interrogation of the run/setup switch causes the main loop to branch into the setup routine or run routine. If the switch is in the setup mode, the setup routine of FIG. 7 is initiated and the interrupt flags are set to disallow interrupts from the host. If the switch is in the run position, the run routine of FIG. 8 is initiated and the interrupt control flags are set to allow interrupts from the host.

The setup routine of FIG. 7 is comprised of reading the parameter roll forward/reverse switches, the value increment/decrement switches and the enter switch. The parameter roll forward/reverse switches select the particular parameter desired from a stored list of all of the parameters and their values. The name of the parameter selected is displayed at the 7-segment display. Some parameters are numeric, giving the target weight, decimal point position, average factor, and LED sensitivity. Some are non-numeric, giving the display format as actual net weight versus deviation weight and equivalent scaling versus proportional scaling.

For parameters with numeric values, the current value of the parameter is also displayed as well as the name of the parameter. The value increment/decrement switches are used to alter the value of the numeric parameter on display. When the desired value is displayed for any given parameter, the user presses the enter switch, causing the displayed parameter to assume the displayed value. In the case of non-numeric parameters, pressing the enter switch causes the display format to assume the particular attribute described—e.g. deviation from target, proportional scaling. Operator feedback is provided by the change of parameter names and values when the parameter roll and value switches are used. In the case of the enter switch, feedback takes the form of a momentary blinking of the bar-graph LEDs.

Figure 8:
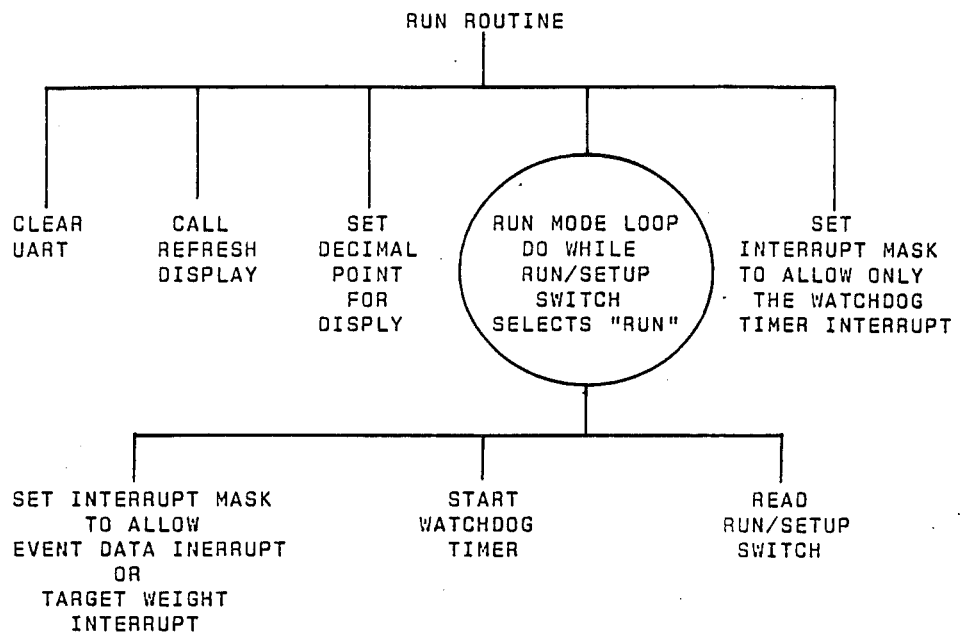
FIG. 8 is a logic tree diagram of the Trend Tracker run routine.
Figure 9:
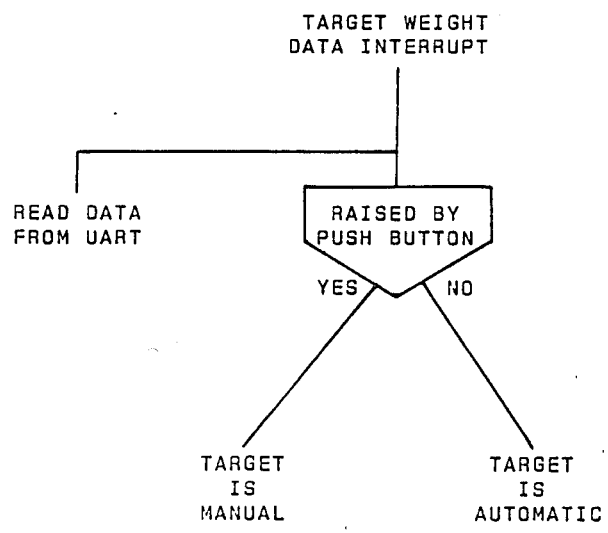
FIG. 9 is a logic tree diagram of the basic target data arithmetic sub-routine.
Figure 10:
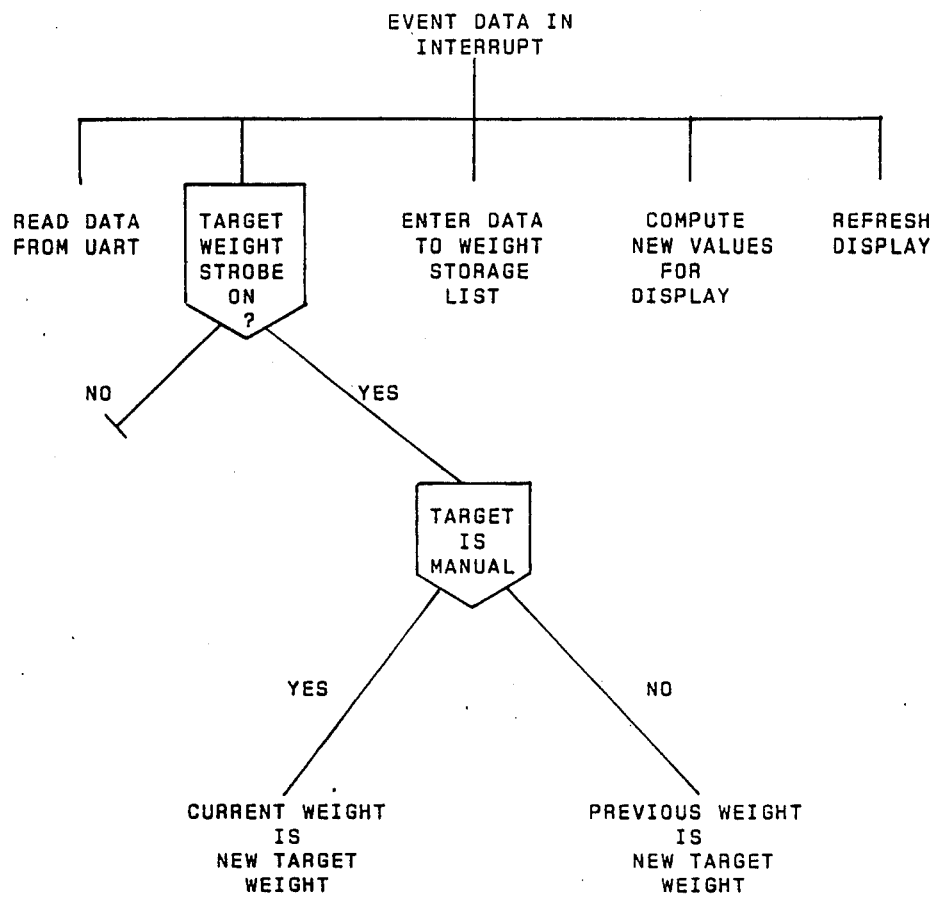
FIG. 10 is a logic tree diagram of the basic routine for the host event data arithmetic sub-routines.

When the run routine is selected by the run/set logic illustrated in FIG. 6, the run routine illustrated in FIG. 8 is activated and target weight and event data interrupts of FIGS. 9 and 10 are enabled. The run routine determines the bar-graph and numerical display modes selected and calls the appropriate sub-routines for providing the selected bar-graph and numerical displays in a run mode loop. The UART is cleared to receive new data and the refresh display routine is called to process the new data in accordance with the run mode loop which restarts the watch dog timer and sets the target weight data in interrupt and event data in interrupt routines of FIGS. 9 and 10.

The target weight data in interrupt causes the system to function in the run mode or if the targe strobe button, push-button switch 59, has been depressed, the setup routine is run in so far as the target weight is reset as a function of the new data in the UART.

The event data in interrupt routine of FIG. 10 also determines the status of the target strobe push-button. If the target strobe is on and the system is in a manual mode, the data currently in the UART is loaded on top of a Fifo register as the new target weight. If the system is in an automatic mode, the previous weight on the top of the Fifo register is considered as the new target weight.

The data read from the UART during the event data in interrupt routine of FIG. 10 is entered in a data to weight storage list and new values are computed for the display in accordance with the routine selected by the run mode loop.

Figure 11:
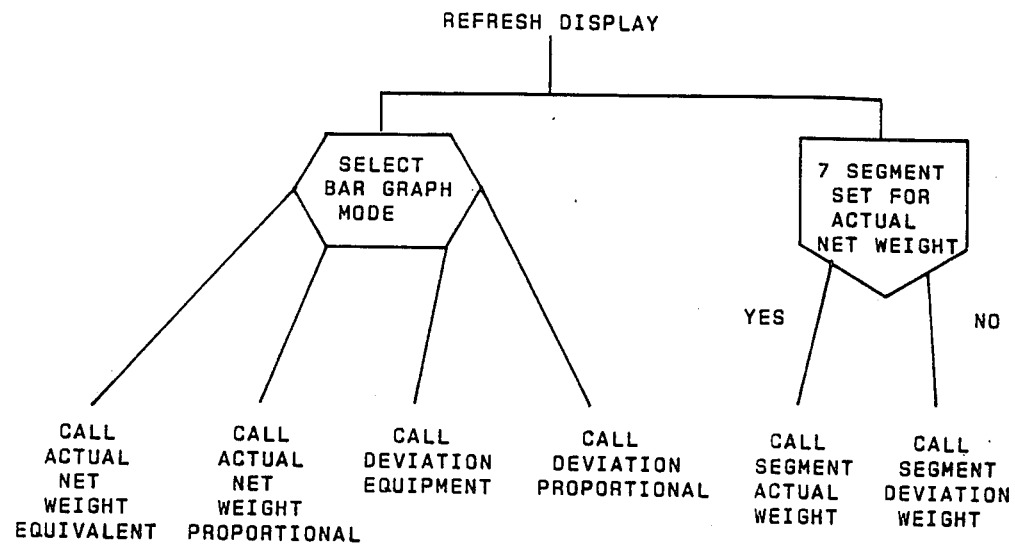
FIG. 11 is a logic tree diagram of the display update routine.

The refresh display routine of FIG. 11 is activated during the event data in interrupt and a bar-graph mode and 7-segment function is selected in conjunction with the run mode loop.

In the case of the bar-graph display, the number of segments illuminated, starting from left to right, is proportional to the weight of the product in the absolute mode when the host is a weighing device. A product weight falling at target would cause the left half of the bar to be illuminated. Products heavier than target would cause more segments to the right to be illuminated, and products lighter than target would cause fewer of the segments, starting from the left, to be illuminated. The sensitivity, or the number of weight units required to increment the bar one segment, is digitally adjustable via switches on the circuit board as previously discussed. For example, on a checkweigher displaying weight in whole grams, the Trend Tracker may be adjusted such that any number of grams between 1 and 9999 would be required to increment the display one segment. In this mode, the Trend Tracker bar-graph display will jump around with each and every product weighed. This provides a dynamic display which is easily interpretable by the human eye.

When the mode selected requires comparative displays corresponding to deviations from target data or requires averages, the compute new value sub-routines are called and the save and restore registers are again used for calculating the desired display data. Once the data has been processed, the bar-graph and numerical display registers are updated in response to the event data routine of FIG. 10 calling the refresh display routine of FIG. 11.

When the host system is a weighing device in the automatic mode, each weight is compared to the previously declared target weight and bar-graph segments corresponding to the deviation of the new product weight from target are illuminated. i.e., products heavier than target cause segments to the right of center to be illuminated, products lighter than target cause segments to the left of center to be illuminated and products within an increment size of target cause the center two segments to be illuminated. The horizontal sensitivity of the display is digitally adjusted internally through the use of switches as previously explained.

The bar-graph always responds to each new actual quantity. The display is usually discernible to the naked eye, but it may be desirable when product standard deviation is large, to display the average information rather than the instantaneous. Internal switches, as previously explained, allow an operator to program an average sample size from 1 to 99. In this way, the bar-graph indications will reflect the short term trend rather than instantaneous quantities.

The numerical display utilizes the same basic event data sub-routines as the bar-graph display to provide event, average or total data and actual deviation or average deviation from target. Although the same basic data is used, the indications of the numerical display are independent of the bar-graph display mode. The refresh display call of FIG. 10 activates the refresh display routine of FIG. 11. In this routine, a first branch determines whether the numerical display is to be actual or deviation. If the result of the query is net, the stored result of the arithmetic routine providing the current net function (event, average or total) of the host data is used to update the registers controlling the numerical display. If the deviation mode is selected, the data presented to the numerical display registers is called from the arithmetic sub-routine previously discussed which provides deviation data. The update display routine also determines which bar-graph display has been selected. Four different bar-graph displays are provided as previously discussed and dependent upon which function is selected, the data stored by the appropriate arithmetic sub-routine is called to update the registers energizing the bar-graph display.

Figure 12:
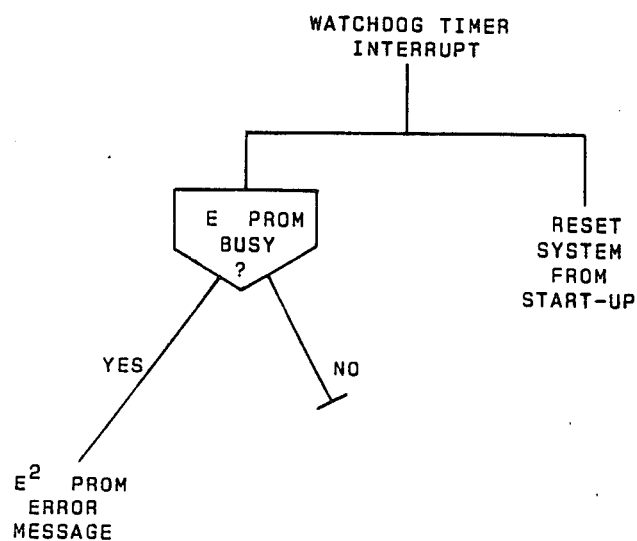
FIG. 12 is a logic tree diagram of the watch dog timer routine.

After the completion of the setup routine of FIG. 7 or update display routine of FIG. 11, the watch dog timer routine of FIG. 12 is accomplished. If the timer has not timed out, the main loop is repeated. If the timer has timed out, the start sequence and tests are initialized and if a failure occurs, the system stops until manually restarted.

Random access memories 113 and 114 provide working storage areas for performing the various standard mathematical sub-routines required to compare UART provided data with preset parameters to develop the data values for refreshing the displays for deviation modes of operation. The RAMs are also used as Fifo registers in combination with standard arithmetic routines for determining average values to be used as data inputs to refresh the displays based upon a predtermined number of data events.

While preferred embodiments of this invention have been illustrated and described, variations and modifications may be apparent to those skilled in the art. Therefore, I do not wish to be limited thereto and ask that the scope and breadth of this invention be determined from the claims which follow rather than the above description.

```
ISIS-II 8080/8085 MACRO ASSEMBLER, V3.0          TRNTRK
TREND TRACKER 8080 SOURCE CODE

LOC  OBJ        LINE     SOURCE STATEMENT

1  $DEBUG NOMACROFILE XREF NOSYMBOLS
                  2  $TITLE('TREND TRACKER 8080 SOURCE CODE')
                  3         NAME    TRNTRK
                  4
                  5
                  6  ;*********************************************
                  7  ;        T R E N D   T R A C K E R
                  8  ;*********************************************
                  9
                 10
                 11  ;PROGRAM:    A2-65-001 REV A AND A2-65-002 REV A
                 12  ;DATE:       MAY   25, 1983
                 13  ;WRITTEN:    STEVEN EHRHARDT      F. A. ROMANN
                 14
                 15  ;COPYRIGHT 1983 BY HI-SPEED CHECKWEIGHER, INC.
                 16  ;                  605 WEST STATE ST.
                 17  ;                  ITHACA, NY 14850
                 18  ;
                 19  $EJECT
                 20  ;                    *ABSTRACT*
                 21  ;
                 22  ; The TrendTracker is a smart remote display device.  This version is
                 23  ; designed to display any of 8 different bargraphs and any of 4 different
                 24  ; numeric displays.  The bargraph display is chosen to be 1. either
                 25  ; actual net weight or deviation from target, 2. either instantaneous-showing
                 26  ; every weight-- or averaged-showing average of last N weights, and 3. equivalent
                 27  ; or proportional. Equivalent means each LED represents the same amount of
                 28  ; weight.  Proportional means that LEDS are progressively less sensitive as
                 29  ; they are farther from the center (target weight) position.  The numeric
                 30  ; displays are 1. either actual net weight or deviation from target and  2. either
                 31  ; instantaneous or averaged.
                 32  ;
                 33  ; The user entered parameters select the bar graph and 7 segment display modes,
                 34  ; set the average factor (N referred to above for average mode), the target weight,
                 35  ; the decimal point position, and the sensitivity of the centermost LEDs (12 & 13).
                 36  ; The sensitivity factor is used to calibrate the display.
                 37  ;
                 38  ; Four interrupts are active.  The TRAP interrupt occurs on timeout of the
                 39  ; watchdog timer.  RST 5.5, serviced by ISREMV, occurs when E2PROM has finished
                 40  ; programming.   RST 6.5, serviced by ISRDAT occurs when data arrive from the
                 41  ; host-presumably a checkweigher.  RST 7.5, serviced by ISRTGT, occurs when the
                 42  ; target weight button is pressed AND, if connected to a SERIES VII checkweigher,
                 43  ; whenever a NET TGT WT is entered to the SERIES VII keyboard.
                 44  ;
                 45  ; Two ICE files are generated from this code: 65002A.ICE (from 0 - 0FFFH) and
                 46  ; 65002A.IC2 ( from 7000 - 7FFFH).
                 47  ;
                 48  ;STATUS MESSAGES                            ERROR MESSAGES
                 49  ;
                 50  ;StAc   stack area of RAM ok                HF 1   RAM failure
                 51  ;Pro1   prom1 checksum ok                   HF 2   checksum error
                 52  ;Pro2   prom2 checksum ok                   HF 3   E2PROM failure
                 53  ; rA    RAM ok                              or 1   net wt out of display range
                 54  ;                                           or 2   tgt wt out of display range
                 55
                 56  $EJECT
                 57  $INCLUDE(:F4:EQUTTA.T7)
=                58  $EJECT
```

```
LOC OBJ        LINE     SOURCE STATEMENT

=  59 $TITLE('EQUATES FOR TREND TRACKER')
         =  60 ;
         =  61 ;FILE         EQUIA.TRT
         =  62 ;             STEVEN EHRHARDT        25 MAY 83
         =  63 ;
         =  64 $EJECT
         =  65 ;        ******************
         =  66 ;          --SYSTEM EQUATES--
         =  67 ;        ******************
         =  68
         =  69 ;MEMORY DIVIDED INTO RAM, PRIM, AND EEPROM
         =  70
0010     =  71 STKAMT   EQU    10H         ;# OF STACK LOCS TO TEST
2000     =  72 RAMSTAD  EQU    2000H       ;RAM STARTING ADRS
03F0     =  73 RAMAMT   EQU    03F0H       ;1K RAM TO TEST
0000     =  74 ROM1     EQU    0           ;BASE ADDRESS OF ROM1
7000     =  75 ROM2     EQU    7000H       ;BASE ADDRESS OF ROM2
1000     =  76 ROMLGTH  EQU    1000H       ;HOW BYTES IN ROM
7FFF     =  77 ENDLOC   EQU    7FFFH       ;CHECKSUM LOCATION
1000     =  78 EPRSTRT  EQU    1000H       ;STARTING ADDRESS OF EEPROM
000C     =  79 ICTLGT   EQU    12          ;LENGTH OF INIT TABLE
0007     =  80 IDSLGT   EQU    7           ;LENGTH OF DISPLAY TABLE
0001     =  81 PNUM     EQU    1           ;# OF PROMS TO DO CRC CHECK ON
         =  82
         =  83 $EJECT
         =  84 ;************************************************;
         =  85 ;EQUATES FOR 7 SEGMENT DISPLAY TRANSLATION
         =  86 ;THESE HELP ENCODE MESSAGES IN A MORE READABLE FASHION
         =  87 ;ALPHABETIC EQUATES
         =  88 ;UPPERCASE FOLLOWED BY U, LOWERCASE BY L
         =  89 ;************************************************;
0011     =  90 AU       EQU    11H
00C1     =  91 BL       EQU    0C1H
0063     =  92 CU       EQU    63H
00E5     =  93 CL       EQU    0E5H
0085     =  94 DL       EQU    85H
0061     =  95 EU       EQU    61H
0071     =  96 FU       EQU    71H
0043     =  97 GU       EQU    43H
0091     =  98 HU       EQU    91H
00D1     =  99 HL       EQU    0D1H
009F     = 100 IU       EQU    9FH
00DF     = 101 IL       EQU    0DFH
0087     = 102 JU       EQU    87H
00E3     = 103 LU       EQU    0E3H
00F3     = 104 LL       EQU    0F3H
00D5     = 105 NL       EQU    0D5H
0003     = 106 OU       EQU    03H
00C5     = 107 OL       EQU    0C5H
0031     = 108 PU       EQU    31H
00F5     = 109 RL       EQU    0F5H
0049     = 110 SU       EQU    49H
00E1     = 111 TL       EQU    0E1H
0083     = 112 UU       EQU    83H
00C7     = 113 UL       EQU    0C7H
0076     = 114 YU       EQU    76H
00FF     = 115 SPC      EQU    0FFH        ;SPACE
00FD     = 116 MIN      EQU    0FDH        ;MINUS (NEGATIVE) SIGN
00FE     = 117 POINT    EQU    0FEH        ;DECIMAL POINT
         = 118 ;NUMBERS
0003     = 119 S0       EQU    03H
```

```
LOC  OBJ        LINE        SOURCE STATEMENT

009F          = 120 S1        EQU     9FH
0025          = 121 S2        EQU     25H
000D          = 122 S3        EQU     0DH
0099          = 123 S4        EQU     99H
0049          = 124 S5        EQU     49H
0041          = 125 S6        EQU     41H
001F          = 126 S7        EQU     1FH
0001          = 127 S8        EQU     01H
0019          = 128 S9        EQU     19H
              = 129
              = 130 $EJECT
              = 131 ;*****************************
              = 132 ;     I/O EQUATES
              = 133 ;*****************************
              = 134 ;LOCATIONS OF 7SEGMENT DISPLAY AND BARGRAPH DISPLAY
              = 135 ;
3000          = 136 HOST       EQU     3000H          ;INPUT PORT ADRS FROM HOST
              = 137
5000          = 138 SEGDSP     EQU     5000H          ;ADDRESS OF 7SEG DISPLAY
0004          = 139 MSGLGTH    EQU     4              ;LENGTH OF 7SEG DISPLAY
              = 140
5004          = 141 BARDSP     EQU     5004H          ;ADDRESS OF BAR GRAPH DISPLAY
0003          = 142 BARLGTH    EQU     3              ;LENGTH OF BAR GRAPH DISPLAY
              = 143 ;
6000          = 144 WDTMR      EQU     6000H          ;ADDRESS OF WATCHDOG 555 TIMER
              = 145
              = 146 ;LOGICAL DEFINITION OF SWITCHES
              = 147 ;
4000          = 148 SWITCHES   EQU     4000H          ;LOCATION OF USER SWITCHES
0001          = 149 DXSPSW     EQU     01H            ;BIT 0 OF SWITCHES=DECR PARAMETER VALUE
0002          = 150 IXSPSW     EQU     02H            ;BIT 1 OF SWITCHES=INCR PARAMETER VALUE
0004          = 151 S7AVIN     EQU     04H            ;BIT 2 OF SWITCHES=7SEG INSTANTANEOUS(0)/AVERAGE(1)
0008          = 152 BGAVIN     EQU     08H            ;BIT 3 OF SWITCHES=BARGRAPH INSTANTANEOUS(0)/AVERAGE(1)
0010          = 153 ENTSW      EQU     10H            ;BIT 4 OF SWITCHES=ENTER KEY
0020          = 154 RSSWITCH   EQU     20H            ;BIT 5 OF SWITCHES=RUN/SETUP MODE SELECT
0040          = 155 DXVPSW     EQU     40H            ;BIT 6 OF SWITCHES=DECR PARAMETER SELECT
0080          = 156 IXVPSW     EQU     80H            ;BIT 7 OF SWITCHES=INCR PARAMETER SELECT
              = 157 $EJECT
              = 158 ;***************************************************************
              = 159 ;TIMING FOR READING SWITCHES, MASKS FOR ISOLATING PARTICULAR BITS OF SWITCHES
              = 160 ;***************************************************************
0020          = 161 RUNPOS     EQU     20H            ;RS SWITCH HIGH FOR RUN MODE
0000          = 162 SETUPOS    EQU     00H            ;RS SWITCH LOW FOR SETUP MODE
0005          = 163 SWDELAY    EQU     5              ;MILLISECONDS DELAY FOR SWITCH DEBOUNCE
0003          = 164 REPCTR     EQU     3              ;NUMBER OF REPETITIONS NEEDED TO DEBOUNCE
00FF          = 165 SLOW       EQU     255            ;MS FOR LONG DELAY OF PARAMETER DISPLAY
0006          = 166 VALIDS     EQU     06             ;ID NUMBER OF FIRST PARM TO GET NUMERIC VALUES
6301          = 167 AFLIMS     EQU     6301H          ;MAX AND MIN VALUES FOR AVERAGE FACTOR
0300          = 168 DPPLIMS    EQU     0300H          ;MAX AND MIN VALUES FOR DECIMAL PT POSITION
000A          = 169 PARMCNT    EQU     10             ;NUMBER OF INPUT PARAMETERS
0004          = 170 ACTSEG     EQU     04H            ;SEGMENT SET TO ACTUAL IN SEGCTL
0005          = 171 DEVSEG     EQU     05H            ;SEGMENT SET TO DEVIATION IN SEGCTL
0004          = 172 LASTBG     EQU     4              ;POSITION OF LAST BARGRAPH DISP PARAMETER
0006          = 173 LAST7S     EQU     06             ;POSITION OF LAST 7SEG DISP PARAMETER
0006          = 174 AVGPOS     EQU     06             ;AVERAGE FACTOR IS 7TH -SELFARCTL WILL SAY 6
0007          = 175 DCPPOS     EQU     07             ;DEC PT POS WITHIN LIST OF PARMS
0008          = 176 SENPOS     EQU     08             ;POSITION OF SENSITIVITY FACTOR AMONG PARAMETERS
0009          = 177 TOTPOS     EQU     09             ;POSITION OF TOT WT AMONG PARAMETERS
              = 178 ;
              = 179 ;***************************************************************
              = 180 ;MASKING FOR PARTICULAR BITS OF SYSTEM CONTROL BYTE (SYSCTL)
```

| LOC OBJ | LINE | | SOURCE STATEMENT | |
|---|---|---|---|---|
| | = 181 | ;*********************************************** | | |
| 0001 | = 182 TGTON | EQU | 01H | ;ALLOW INTS FROM HOST IN SYSCTL BYTE |
| 00FE | = 183 TGTOFF | EQU | 0FEH | ;DISALLOW INTS FROM HOST IN SYSCTL BYTE |
| 0002 | = 184 E2BUSY | EQU | 02H | ;EEPROM IN PROCESS OF WRITING |
| 00FD | = 185 E2REDY | EQU | 0FDH | ;EEPROM READY TO BE USED--NOT IN PROCESS OF WRITING |
| 0004 | = 186 VALON | EQU | 04H | ;ALLOW USE OF VALUE SWITCH |
| 00FB | = 187 VALOFF | EQU | 0FBH | ;DISALLOW USE OF VALUE SWITCH |
| 00F7 | = 188 INRNG | EQU | 0F7H | ;VALUE FOR DISPLAY WITHIN RANGE OF DISPLAY |
| 0008 | = 189 OVRNG | EQU | 08H | ;VALUE TOO LARGE FOR DISPLAY |
| 0010 | = 190 AUTGST | EQU | 10H | ;TARGET STROBE FROM SERIESVII |
| 00EF | = 191 MATGST | EQU | 0EFH | ;TARGET STROBE FROM PUSHBUTTON |
| 0020 | = 192 NTERON | EQU | 20H | ;TARGET WEIGHT OUT OF DISPLAY RANGE |
| 00DF | = 193 NTEROF | EQU | 0DFH | ;TARGET WEIGHT WITHIN DISPLAY RANGE |
| | = 194 | | | |
| | = 195 $EJECT | | | |
| | = 196 ;*********************************************** | | | |
| | = 197 ; MEMORY MAP OF RAM SPACE IN TREND TRACKER | | | |
| | = 198 ;*********************************************** | | | |
| | = 199 | | | |
| 2000 | = 200 RAMBASE | EQU | 2000H | |
| 2000 | = 201 WTFIFO | EQU | RAMBASE | ;300 BYTES OF FIFO FOR NET WTS |
| 2258 | = 202 FRONT | EQU | RAMBASE+600 | ;POINTER TO FIFO FRONT |
| 225A | = 203 REAR | EQU | FRONT+2 | ;POINTER TO FIFO REAR |
| 225C | = 204 ASCBUF | EQU | REAR+2 | ;INPUT BUFFER FOR DATA FROM HOST |
| 2262 | = 205 ASCCTR | EQU | ASCBUF+6 | ;COUNTS INCOMING BYTES |
| 2264 | = 206 DECBUF | EQU | ASCCTR+2 | ;DECIMAL BUFFER LEAVE BLANK IN FRONT OF IT |
| 2274 | = 207 SYSCTL | EQU | DECBUF+16 | ;SYSTEM CONTROL FLAGS |
| 2275 | = 208 SELPARCTL | EQU | SYSCTL+1 | ;PARAMETER SELECTED AT THE MOMENT IN SETUP |
| 2276 | = 209 DEVDIR | EQU | SELPARCTL-1 | ;DIRECTION OF DEVIATION FROM TARGET +/- |
| 2277 | = 210 FPTMP1 | EQU | DEVDIR+1 | ;TEMPORARY FLOATING POINT VALUE |
| 227D | = 211 FPTMP2 | EQU | FPTMP1+6 | ;ANOTHER ONE |
| 2283 | = 212 FPTMP3 | EQU | FPTMP2+6 | ;AND ANOTHER |
| 2289 | = 213 FPWTS | EQU | FPTMP3+6 | ;FLOAT IMAGE OF AVERAGE FACTOR |
| 228F | = 214 FPSEN | EQU | FPWTS+6 | ;FLOAT IMAGE OF SENSITIVITY |
| 2295 | = 215 FPTGT | EQU | FPSEN+6 | ;FLOAT IMAGE OF TARGET WEIGHT |
| 229B | = 216 INFFLT | EQU | FPTGT+6 | ;BUFFER TO NORMALIZE DATA TO FLOAT PT |
| 22A1 | = 217 OTFFLT | EQU | INFFLT+6 | ;BUFFER TO NORMALIZE DATA TO FLOAT PT |
| 22A7 | = 218 FPAVG | EQU | OTFFLT+6 | ;FLOAT IMAGE OF CURRENT AVERAGE |
| 22AD | = 219 FPDEV | EQU | FPAVG+6 | ;FLOAT IMAGE OF CURRENT DEVIATION |
| 22B3 | = 220 FPLAST | EQU | FPDEV+6 | ;FLOAT IMAGE OF MOST RECENT WEIGHT |
| 22B9 | = 221 BARBUF | EQU | FPLAST+6 | ;BUFFER FOR BAR GRAPH |
| 22BC | = 222 SEGBUFFER | EQU | BARBUF+3 | ;BUFFER FOR 7SEG DISPLAY |
| 22C0 | = 223 UPDBUF | EQU | SEGBUFFER+4 | ;UNPACKED DECIMAL BUFFER |
| 22C6 | = 224 UPDAD | EQU | UPDBUF+6 | ;ADDRESS OF DECIMAL VARIABLE ON DISPLAY |
| 22C8 | = 225 UPDFP | EQU | UPDAD+2 | ;ADDRESS OF FLOAT IMAGE IN RAM |
| 22CA | = 226 MINMAX | EQU | UPDFP+2 | ;MINIMUM AND MAXIMUM VALUES FOR CURRENT PARAMETER |
| 22CC | = 227 EEPCOPY | EQU | MINMAX+2 | ;COPY OF DATA JUST WRITTEN TO EEPROM |
| 22CD | = 228 EEFADD | EQU | EEPCOPY+1 | ;EEPROM ADDRESS JUST WRITTEN |
| 22CF | = 229 CURDVAL | EQU | EEFADD+2 | ;DECIMAL IMAGE OF CURRENT PARAMETER |
| 22DB | = 230 NUMLEDS | EQU | CURDVAL+12 | ;NUMBER OF LEDS TO LIGHT UP |
| 22DC | = 231 NUMWTS | EQU | NUMLEDS+1 | ;NUMBER OF WEIGHTS IN FIFO RIGHT NOW |
| 22DD | = 232 ASCPTR | EQU | NUMWTS+1 | ;PTR TO NEXT FREE SPACE IN ASCII BUFFER |
| 22DF | = 233 EXPON | EQU | ASCPTR+2 | ;EXPONENT FOR ASCII TO FLOAT CONVERSION |
| 22E0 | = 234 CURFVAL | EQU | EXPON+1 | ;CURRENT PARAMETER VALUE |
| 22E1 | = 235 ENDFIFO | EQU | CURFVAL+1 | ;CURRENT END OF FIFO |
| 22E3 | = 236 FULLFLAG | EQU | ENDFIFO+2 | ;FFH IF FIFO FULL, ELSE 0, INITIALLY 0 |
| 22E4 | = 237 RATE | EQU | FULLFLAG+1 | ;DETERMINES SPEED OF VALUE SWITCH |
| 22E6 | = 238 FRSTDG | EQU | RATE+2 | ;ADDR FIRST DEC DIGIT TO DISPLAY |
| 22E8 | = 239 LASTDG | EQU | FRSTDG+2 | ;" LAST " " " |
| 22EA | = 240 ROUNDG | EQU | LASTDG+2 | ;ADDR ROUNDING DIGIT OF DEC DISPLAY |
| 22EC | = 241 RFPAVG | EQU | ROUNDG+2 | ;FLOAT COPY OF ROUNDED OFF AVERAGE WT |

```
LOC OBJ        LINE    SOURCE STATEMENT

23FE           = 242 STACKTOP      EQU     23FEH          ;TOP OF STACK
               = 243 $EJECT
               = 244
               = 245 ;************************************
               = 246 ;MEMORY MAP OF EEPROM IN TREND TRACKER
               = 247 ;************************************
               = 248
1001           = 249 BARCTL        EQU     1001H          ;BAR GRAPH DISPLAY CONTROL BYTE
1002           = 250 SEGCTL        EQU     1002H          ;7 SEGMENT DISPLAY CONTROL BYTE
1003           = 251 AVGFAC        EQU     1003H          ;AVERAGE FACTOR
1004           = 252 DPP           EQU     1004H          ;DECIMAL POINT POSITION
1005           = 253 SENFAC        EQU     1005H          ;SENSITIVITY OF FIRST LED
1009           = 254 TGTWT         EQU     SENFAC+4       ;TARGET WEIGHT UNPACKED DECIMAL 4BYTES
100D           = 255 PARMTABLE     EQU     TGTWT+4        ;TABLE OF PARAMETERS WITH CURRENT VALUES
               = 256 $EJECT
               = 257 ;*****************************************
               = 258 ;TWO DUMMY INSTRUCTIONS FOR 8085 PROCESSOR
               = 259 ;SIMB  IS SET INTERRUPT MASK
               = 260 ;RIMB  IS READ INTERRUPT MASK
0020           = 261 RIMB          EQU     20H            ;READ INTERRUPT MASK INST
0030           = 262 SIMB          EQU     30H            ;SET INTERRUPT MASK INST
               = 263
               = 264
               = 265 ;******************************
               = 266 ;ASCII CHARACTER/SYMBOL EQUATES
               = 267 ;******************************
               = 268
000D           = 269 CR            EQU     0DH            ;CARRIAGE RETURN
000A           = 270 LF            EQU     0AH            ;LINE FEED
002E           = 271 DP            EQU     2EH            ;DECIMAL POINT
               = 272
               = 273 ;
               = 274 ;*********************************************************
               = 275 ;       SYSTEM CONTROL FLAG--SYSCTL
               = 276 ;
               = 277 ;BIT 0 =       TARGET STROBE STATUS   0=TARGET STROBE IS OFF
               = 278 ;                                     1=TARGET STROBE IS ON--NEW TGTWT PENDING
               = 279 ;
               = 280 ;BIT 1 =       EEPROM STATUS          0=EEPROM READY FOR WRITE PROCESS
               = 281 ;                                     1=EEPROM BUSY WRITING--HANDS OFF!!
               = 282 ;
               = 283 ;BIT 2 =       VALUE SWITCH STATUS    0=VALUE SWITCH DISABLED
               = 284 ;                                     1=VALUE SWITCH ENABLED
               = 285 ;
               = 286 ;BIT 3 =       VALUE FOR DISPLAY IS..0=WITHIN RANGE OF DISPLAY
               = 287 ;                                     1=OVERRANGE FOR DISPLAY
               = 288 ;
               = 289 ;BIT 4 =       TARGET STROBE SOURCE   0=MANUAL-TREND TRACKER PUSHBUTTON
               = 290 ;                                     1=AUTOMATIC-EXTERNAL (SERIES VII)
               = 291 ;
               = 292 ;BIT 5 =       TARGET WEIGHT RANGE    0=TARGET WEIGHT WITHIN DISPLAY RANGE
               = 293 ;                                     1=TARGET WEIGHT OUT OF DISPLAY RANGE
               = 294 ;
               = 295 ;*********************************************************
               = 296 $EJECT
               = 297
                 298 $INCLUDE(:F4:TRK11A.TXT)
               = 299 $EJECT
               = 300 $TITLE('TREND TRACKER--INITIALIZATION, MAIN DRIVER, MODE DRIVERS')
               = 301 ;
               = 302 ;FILE    TRK11A.TXT
```

```
LOC  OBJ          LINE          SOURCE STATEMENT

= 303 ;       STEVEN EHRHARDT          25 MAY 83
                  = 304 ;
                  = 305 $EJECT
                  = 306 ;       ****************************
                  = 307 ;       POWER UP AND RESTART CONTROL
                  = 308 ;       ****************************
                  = 309
0000              = 310         ORG     0
0000 31FE23       = 311 POWER:  LXI     SP,STACKTOP
0003 C35000       = 312         JMP     DRIVER          ;ON POWER UP JUMP TO MAIN ROUTINE
                  = 313
0024              = 314         ORG     24H
0024 C31605       = 315         JMP     ISRWD           ;WATCHDOG TIMED OUT
                  = 316
002C              = 317         ORG     2CH
002C C32B05       = 318         JMP     ISREPV          ;JUMP TO EPROM VERIFY
                  = 319
0034              = 320         ORG     34H
0034 C35705       = 321         JMP     ISRDAT          ;JUMP TO GET DATA FROM HOST
                  = 322
0038              = 323         ORG     38H
0038 F3           = 324 RESTRT: DI
0039 C30000       = 325         JMP     POWER           ;AND JUMP TO MAIN ROUTINE
                  = 326
003C              = 327         ORG     3CH
003C C32406       = 328         JMP     ISRTGT          ;JUMP TO GET NEW TARGET WEIGHT FROM HOST
                  = 329 $EJECT
                  = 330 ;*********************************************************;
                  = 331 ;MAIN ROUTINE OF TREND TRACKER--TEST STACK AREA, CHECKSUMS, RAM,
                  = 332 ;AND DISPLAYS.  IF EEPROM IS UNIHITIALIZED, SET UP DEFAULT VALUES
                  = 333 ;FOR ALL INPUT PARAMETERS.  IF EEPROM IS INITIALIZED, JUST UPDATE
                  = 334 ;RAM BASED FLOATING POINT COPIES OF INPUT PARAMETERS. CLEAR THE
                  = 335 ;FIFO WHERE WEIGHTS ARE STORED.  CLEAR THE ASCII BUFFER WHERE NEW
                  = 336 ;DATA ARRIVE.  WHEN SYSTEM IS TESTED AND INITIALIZED, AND ALL BUFFERS
                  = 337 ;CLEARED, GO ON TO THE MAIN LOOP.  IN THE MAIN LOOP, THE RUN/SETUP
                  = 338 ;SWITCH IS EXAMINED AND CONTROL PASSED TO EITHER THE RUN MODULE OR
                  = 339 ;THE SETUP MODULE OF THIS PROGRAM.
                  = 340 ;*********************************************************;
0050              = 341         ORG     50H
                  = 342 DRIVER:
0050 320060       = 343         STA     WDTMR           ;START WATCHDOG TIMER
0053 F3           = 344         DI
                  = 345         ;PERFORM TEST OF 16 BYTES HIGH RAM AS STACK AREA TEST
0054 21FE23       = 346         LXI     H,STACKTOP
0057 0E10         = 347         MVI     C,16
0059 3EFF         = 348         MVI     A,0FFH
                  = 349         ;WRITE FF TO ALL 16 PLACES, IF READ BACK OK FIGURE ITS GOOD
                  = 350         ;ELSE NO GOOD STACK AREA AND ERROR MESSAGE
005B 77           = 351 ST10:   MOV     M,A
005C 46           = 352         MOV     B,M
005D B8           = 353         CMP     B
005E C2DC00       = 354         JNZ     RAMERR          ;SHOW ERROR IS IN RAM
0061 2B           = 355         DCX     H
0062 0D           = 356         DCR     C
0063 C25B00       = 357         JNZ     ST10
0066 21130D       = 358         LXI     H,STACOK        ;TELL USER STACK IS OK
0069 CD210C       = 359         CALL     SNDMSG
                  = 360         ;STACK CHECKED OK-NOW TEST CHECKSUMS IN ROMS
006C 210000       = 361         LXI     H,ROM1
006F 110010       = 362         LXI     D,ROMLGTH
0072 01FE7F       = 363         LXI     B,ENDLOC-1
```

| LOC OBJ | LINE | SOURCE STATEMENT | | |
|---|---|---|---|---|
| 0075 3E01 | = 364 | MVI | A,PNUM | |
| 0077 CDE300 | = 365 | CALL | ROMTST | ;TEST ROM1, ABORT IF NO GOOD |
| 007A 210B0D | = 366 | LXI | H,ROM1OK | ;TELL USER PROM1 CKSUM OK |
| 007D CD210C | = 367 | CALL | SLOMSG | |
| 0080 210070 | = 368 | LXI | H,ROM2 | |
| 0083 110010 | = 369 | LXI | D,ROMLGTH | |
| 0086 01FD7F | = 370 | LXI | B,ENDLOC-2 | |
| 0089 3E01 | = 371 | MVI | A,PNUM | |
| 008B CDE300 | = 372 | CALL | ROMTST | ;TEST ROM2-ABORT IF NO GOOD |
| 008E 210F0D | = 373 | LXI | H,ROM2OK | |
| 0091 CD210C | = 374 | CALL | SLOMSG | ;TELL USER ROM2 CKSUM IS OK |
| 0094 CDC300 | = 375 | CALL | RAMTST | ;TEST RAM |
| 0097 21070D | = 376 | LXI | H,RAMOK | |
| 009A CD210C | = 377 | CALL | SLOMSG | ;TELL USER RAM IS OK |
| 009D 20 | = 378 | DB | RIMB | |
| 009E F61F | = 379 | ORI | 1FH | ;RESET 7.5 AND MASK ALL INTERRUPTS |
| 00A0 30 | = 380 | DB | SIMB | |
| 00A1 FB | = 381 | EI | | |
| 00A2 CD1C01 | = 382 | CALL | SYSINIT | ;INIT DISPLAY AND ITS ASSOCIATED VARS |
| 00A5 AF | = 383 | XRA | A | |
| 00A6 327422 | = 384 | STA | SYSCTL | ;INITIALIZE SYSTEM CONTROL BYTE |
| 00A9 322022 | = 385 | STA | CURPVAL | ;INITIALIZE CURRENT PARAMETER VALUE |
| | = 386 $EJECT | | | |

ISIS-II 8080/8085 MACRO ASSEMBLER, V4.1        TRNTRK    PAGE  17
TREND TRACKER--INITIALIZATION, MAIN DRIVER, MODE DRIVERS

| LOC OBJ | LINE | SOURCE STATEMENT | | |
|---|---|---|---|---|
| | = 387 ; | | | |
| 00AC 320060 | = 388 MAINLP: | STA | WDTMR | ;START WATCHDOG TIMER |
| 00AF CD4308 | = 389 | CALL | RDMODSW | ;READ THE MODE SWITCH |
| 00B2 FE20 | = 390 | CPI | RUNPOS | ;IS IT IN THE RUN POSITION? |
| 00B4 CABD00 | = 391 | JZ | RUN | ;IF IN RUN MODE, ENTER THE RUN SEQUENCE |
| 00B7 CDB002 | = 392 SETUP: | CALL | SETMOD | ;ELSE SET UP TREND TRACKER |
| 00BA C3AC00 | = 393 | JMP | MAINLP | ;END OF MAINLOOP FROM SETUP SEQUENCE |
| | = 394 ; | | | |
| 00BD CDEF01 | = 395 RUN: | CALL | RUNMOD | ;RUN THE TREND TRACKER |
| 00C0 C3AC00 | = 396 | JMP | MAINLP | ;END OF MAINLOOP FROM RUN SEQUENCE |
| | = 397 | | | |
| | = 398 $EJECT | | | |
| | = 399 ;************************************************************ | | | |
| | = 400 ;                      *RAMTST* | | | |
| | = 401 ;THE RAM TEST WRITES THE VALUE 0AAH TO EVERY RAM LOCATION. IT THEN | | | |
| | = 402 ;CHECKS EACH RAM LOCATION TO VERIFY THAT THE 0AAH IS STILL THERE. IF | | | |
| | = 403 ;ANY BYTE HAS LOST THE VALUE 0FFH, THE ENTIRE TREND TRACKER PROGRAM | | | |
| | = 404 ;COMES TO A HALT.  THE MESSAGE "HP 1" APPEARS.  IF NO ERROR OCCURS, | | | |
| | = 405 ;THE RAM TEST DISPLAYS THE MESSAGE " RA ". | | | |
| | = 406 ;************************************************************ | | | |
| 00C3 210020 | = 407 RAMTST: | LXI | H,RAMSTAD | |
| 00C6 11F003 | = 408 | LXI | D,RAMAMT | ;POINTER AND COUNTER SET |
| 00C9 06AA | = 409 | MVI | B,0AAH | |
| 00CB 78 | = 410 RAM05: | MOV | A,B | |
| 00CC 70 | = 411 | MOV | M,B | |
| 00CD BE | = 412 | CMP | M | |
| 00CE C2DC00 | = 413 | JNZ | RAMERR | |
| 00D1 320060 | = 414 | STA | WDTMR | |
| 00D4 23 | = 415 | INX | H | |

```
LOC  OBJ       LINE         SOURCE STATEMENT 0005 1B       =  416            DCX    D
00D6 7B       =  417            MOV    A,E
00D7 B2       =  418            ORA    D
00D8 C2CB00   =  419            JNZ    RAM05
00DB C9       =  420            RET
              =  421  ;
00DC 211700   =  422  RAMERR: LXI   H,RAMER     ;DISP RAM ERROR MSG 'HF 1'
00DF CD180C   =  423            CALL   MSGDSP    ;
00E2 76       =  424            HLT              ;
              =  425  $EJECT
              =  426  ;******************************************************
              =  427  ;                    *ROMTST*
              =  428  ;THE ROM TEST EMPLOYS THE USUAL HI-SPEED CHECKWEIGHER CHECKSUM ALGORITHM.
              =  429  ;IF A CHECKSUM ERROR OCCURS THE PROGRAM COMES TO A HALT AND THE MESSAGE
              =  430  ;"HF 2" APPEARS. IF NO CHECKSUM ERROR OCCURS, THE ROM TEST DISPLAYS THE
              =  431  ;MESSAGE "PROn" WHERE n IDENTIFIES WHICH PROM JUST PASSED THE TEST.
              =  432  ;******************************************************
              =  433  ;
              =  434  ;ENTER WITH     HL = PROM STARTING ADDRESS
              =  435  ;               DE = NUMBER OF BYTES TO SUM CHECK
              =  436  ;                A = NUMBER OF CONSECUTIVE EPROMS TO CHECK
              =  437  ;               BC = CHECKSUM RESERVED LOCATION
              =  438
              =  439  ROMTST:
00E3 C5       =  440            PUSH   B         ;SAVE CHECKSUM POINTER
00E4 F5       =  441            PUSH   PSW       ;SAVE EPROM NUMBER
00E5 FE01     =  442            CPI    1
00E7 C2EE00   =  443            JNZ    ROMT10
00EA 7B       =  444            MOV    A,E
00EB D603     =  445            SUI    3
00ED 5F       =  446            MOV    E,A
              =  447
00EE D5       =  448  ROMT10: PUSH   D         ;SAVE NUMBER OF BYTES TO ADD UP
00EF AF       =  449            XRA    A
              =  450
00F0 86       =  451  ROMT20: ADD    M         ;ADD UP MEMORY DATA
00F1 320060   =  452            STA    WDTMR
00F4 23       =  453            INX    H
00F5 1D       =  454            DCR    E
00F6 C2F000   =  455            JNZ    ROMT20
00F9 15       =  456            DCR    D
00FA C2F000   =  457            JNZ    ROMT20
              =  458
00FD 4F       =  459            MOV    C,A       ;ADD BYTES ADDED, SAVE SUM
00FE D1       =  460            POP    D         ;DE = # OF BYTES TO CHECK
00FF F1       =  461            POP    PSW       ;ACC = # OF PROMS TO CHECK
0100 E3       =  462            XTHL             ;STACK = LOCATION OF HL, HL=CHECKSUM
0101 F5       =  463            PUSH   PSW
0102 D5       =  464            PUSH   D
0103 E5       =  465            PUSH   H
0104 85       =  466            ADD    L
0105 6F       =  467            MOV    L,A       ;HL = CHECKSUM LOCATION
0106 7E       =  468            MOV    A,M
0107 B9       =  469            CMP    C
0108 C21501   =  470            JNZ    ROMERR
010B E1       =  471  ROMT30: POP    H         ;HL = CHECKSUM OFFSET
010C D1       =  472            POP    D
010D F1       =  473            POP    PSW
010E E3       =  474            XTHL             ;STACK = CHECKSUM OFFSET, HL = LOCATION TO ADD
010F C1       =  475            POP    B
0110 3D       =  476            DCR    A
```

```
LOC  OBJ            LINE        SOURCE STATEMENT

0111 C2E300      =  477            JNZ    ROMTST              ;ALL DONE ?, NO LOOP-DA-LOOP
0114 C9          =  478            RET
0115 211B0D      =  479 ROMERR:    LXI    H,ROMER
0118 CD180C      =  480            CALL   MSGDSP
011B 76          =  481            HLT
                 =  482 $EJECT
                 =  483 ;***********************************************************
                 =  484 ;               --- SYSINIT ---
                 =  485 ;INITIALIZES DISPLAY CONTROL BYTES, DISPLAY AND PROPORTIONAL LED TABLE
                 =  486 ;***********************************************************
                 =  487
                 =  488 SYSINIT:
011C CDDC01      =  489            CALL   FPVARS              ;CLEAR FLOAT AREAS
011F CDAB01      =  490            CALL   DSPRDY              ;TEST ALL LEDS AND SEGS
0122 CD2901      =  491            CALL   E2UPD               ;UPDATE E2PROM IF NECESSARY
0125 CD6801      =  492            CALL   RAMUPD              ;UPDATE RAM
0128 C9          =  493            RET
                 =  494            ;
                 =  495 ;****************
                 =  496 E2UPD:
                 =  497 ;****************
                 =  498         ;ROUTINE TO TEST WHETHER E2PROM NEEDS INITIALIZING
                 =  499         ;AND, IF NECESSARY, TO INITIALIZE IT
                 =  500         ;
0129 21360D      =  501            LXI    H,PIDINT            ;PTR TO INITIALIZATION TABLE
012C 110D10      =  502            LXI    D,PARMIDTABLE       ;PTR TO E2PROM PARAMETER CONTROL AREA
012F 0E1A        =  503            MVI    C,26                ;TEST FIRST 26 BYTES--"B=AE" TO "AF"
0131 CDEB0C      =  504            CALL   VERUPD
0134 C25101      =  505            JNZ    E2U20
0137 21520D      =  506            LXI    H,PIDINT+28         ;CHECK "OFF"
013A 112910      =  507            LXI    D,PARMIDTABLE+28
013D 0E03        =  508            MVI    C,3
013F CDEB0C      =  509            CALL   VERUPD
0142 C25101      =  510            JNZ    E2U20
0145 112D10      =  511            LXI    D,PARMIDTABLE+32    ;CHECK "SENS" AND "HTOT"
0148 21560D      =  512            LXI    H,PIDINT+36
014B 0E08        =  513            MVI    C,8
014D CDEB0C      =  514            CALL   VERUPD
0150 C8          =  515            RZ
                 =  516 E2U20:
0151 21360D      =  517            LXI    H,PIDINT
0154 110D10      =  518            LXI    D,PARMIDTABLE
0157 3E28        =  519            MVI    A,PARMCNT*4
0159 CD9B0C      =  520            CALL   MXEEP
015C 110110      =  521            LXI    D,PARCTL
015F 216B0D      =  522            LXI    H,IDCTL             ;INIT NUMERIC PARMS
0162 3E0C        =  523            MVI    A,ICTLGT
0164 CD9B0C      =  524            CALL   MXEEP
0167 C9          =  525            RET
                 =  526 $EJECT
                 =  527 ;*******************
                 =  528 RAMUPD:
                 =  529 ;*******************
                 =  530         ;INITIALIZES RAM ON POWER UP
                 =  531         ;EITHER TO DEFAULT VALUE OR
                 =  532         ;(USUALLY) TO STORED E2PROM VALUES
                 =  533         ;FIFO IS CLEARED EITHER WAY
                 =  534         ;
0168 CD1F07      =  535            CALL   FIFOINIT            ;INIT WEIGHT FIFO
016B 215C22      =  536            LXI    H,ASCBUF
016E 010C00      =  537            LXI    B,12                ;INIT ASCII BUFFER, CTR, AND DISPLAY BUFFER
```

```
LOC   OBJ       LINE          SOURCE STATEMENT

0171 CD620C    = 538          CALL   RCLR
0174 215C22    = 539          LXI    H,ASCBUF
0177 220D22    = 540          SHLD   ASCPTR              ;INIT ASCII BUFFER POINTER
017A 3A0030    = 541          LDA    HOST                ;CLEAR UART OF GARBAGE
017D 218922    = 542          LXI    H,FPWTS             ;INIT THREE INPUT PARM COPIES IN RAM
0180 CD3871    = 543          CALL   INITFLT
0183 218F22    = 544          LXI    H,FPSEN
0186 CD3871    = 545          CALL   INITFLT
0189 219522    = 546          LXI    H,FPTGT
018C CD3871    = 547          CALL   INITFLT
018F 210310    = 548          LXI    H,AVGFAC            ;AVG FACTOR
0192 118922    = 549          LXI    D,FPWTS
0195 CD4370    = 550          CALL   BINFLT
0198 210510    = 551          LXI    H,SENFAC            ;SENSITIVITY UNIT
019B 118F22    = 552          LXI    D,FPSEN
019E CD7070    = 553          CALL   DECFLT
01A1 210910    = 554          LXI    H,TGTWT             ;TARGET WEIGHT
01A4 119522    = 555          LXI    D,FPTGT
01A7 CD7070    = 556          CALL   DECFLT
01AA C9       = 557           RET
               = 558 $EJECT
               = 559
               = 560 ;******************
               = 561 DSPRDY:
               = 562 ;******************
               = 563          ;LIGHTS ALL LEDS FOR 1.5 SECONDS
               = 564          ;TURNS ALL LEDS OFF FOR 1.0 SECONDS
               = 565          ;IF ANY LEDS BROKEN, USER CAN SPOT 'EM
               = 566
               = 567          ;LIGHT ALL LEDS AND 7 SEGS
01AB 210000    = 568          LXI    H,0
01AE 220050    = 569          SHLD   SEGDSP
01B1 220250    = 570          SHLD   SEGDSP+2
01B4 21FFFF    = 571          LXI    H,0FFFFH
01B7 220450    = 572          SHLD   BARDSP
01BA 220550    = 573          SHLD   BARDSP+1
01BD 21DC05    = 574          LXI    H,1500
01C0 CD4C0C    = 575          CALL   DELAY               ;LEAVE IT UP FOR 1.5 SECONDS
               = 576
               = 577          ;TURN OFF ALL LEDS AND 7SEGS
01C3 21FFFF    = 578          LXI    H,0FFFFH
01C6 220050    = 579          SHLD   SEGDSP
01C9 220250    = 580          SHLD   SEGDSP+2
01CC 210000    = 581          LXI    H,0
01CF 220450    = 582          SHLD   BARDSP
01D2 220550    = 583          SHLD   BARDSP+1
01D5 21E803    = 584          LXI    H,1000              ;LEAVE IT UP FOR 1 SECOND
01D8 CD4C0C    = 585          CALL   DELAY
01DB C9        = 586          RET
               = 587 $EJECT
               = 588 ;******************
               = 589 FPVARS:
               = 590 ;******************
               = 591          ;CLEARS ALL FLOATING POINT VALUES TO DEFAULT VALUE ON COLDSTART
               = 592          ;
01DC 217722    = 593          LXI    H,FPTWF1
01DF 014200    = 594          LXI    B,66
01E2 CD620C    = 595          CALL   RCLR
01E5 218F22    = 596          LXI    H,FPSEN
01E8 010C00    = 597          LXI    B,12
01EB CD620C    = 598          CALL   RCLR
```

```
LOC  OBJ            LINE       SOURCE STATEMENT

013E C9            =  599           RET
                   =  600    $EJECT
                   =  601    ;************************************************************
                   =  602    ;                         *RUNMOD*
                   =  603    ;THIS IS ONE OF THE TWO MAJOR SUBROUTINES OF THE TREND TRACKER.  THIS ONE
                   =  604    ;RESPONSIBLE FOR THE RUN MODE.  IT MAINTAINS THE DISPLAYS AT THE BAR GRAPH
                   =  605    ;AND AT THE 7 SEGMENT DIGITS.  INTERRUPTS ARE ALLOWED FROM HOST AND RUN MODE
                   =  606    ;HANDLES THEM IN REAL TIME--UPDATING DISPLAYS AS THE DATA ENTER THE SYSTEM.
                   =  607    ;IT READS THE MODE SWITCH IN ORDER TO KNOW WHEN TO RETURN TO THE MAIN ROUTINE.
                   =  608    ;IT READS THE DISPLAY CONTROL BYTES TO KNOW WHICH TYPE OF DISPLAY TO USE AT
                   =  609    ;THE BAR GRAPH AND WHICH TO USE AT 7 SEGMENT DIGITS.
                   =  610    ;************************************************************
                   =  611    ;
                   =  612    RUNMOD:
C1EF 3A0030        =  613           LDA       HOST         ;CLEAR INT FROM HOST
01F2 CDFA05        =  614           CALL      REFRESH      ;SHOW CURRENT DISPLAY STATUS
C1F5 CDFF04        =  615           CALL      SETEXP       ;INITIALIZE EXPONENT TO CURRENT DP STATUS
01F8 3E09          =  616    RMLOP: MVI       A,09H
C1FA 30            =  617           DR        SIMB         ;ALL INTS ENABLED EXCEPT EPROM VERIFY
01FB F3            =  618           EI
C1FC 320060        =  619           STA       WDTMR        ;START WATCHDOG TIMER
01FF CD4308        =  620           CALL      RDMODSW      ;READ THE MODE SWITCH
C202 FE20          =  621           CPI       RUNPOS       ;IS IT IN THE RUN POSITION
0204 CAF801        =  622           JZ        RMLOP        ;YES, STAY IN RUN MODE
0207 3E0F          =  623           MVI       A,0FH        ;DISABLE INT FROM HOST
0209 30            =  624           DR        SIMB         ;BEFORE LEAVING RUN MODE
C20A C9            =  625           RET
                   =  626    ;
                   =  627    ;************************************************************
                   =  628    ;                         *SETMOD*
                   =  629    ;THIS IS THE SECOND OF THE TWO MAJOR SUBROUTINES OF THE TREND TRACKER. IT
                   =  630    ;IS CALLED SETMOD AND MANAGES THE SETUP MODE OF THE DEVICE.  IT IS RESPONSIBLE
                   =  631    ;FOR MONITORING THE POSITIONS OF THE VARIOUS SET UP CONTROL SWITCHES AVAILABLE
                   =  632    ;TO THE OPERATOR, SOLICITING AND STORING THE APPROPRIATE SETUP PARAMETERS FOR
                   =  633    ;THE VARIOUS MODES OF OPERATION, AND PROVIDING FEEDBACK TO THE OPERATOR.  IN
                   =  634    ;SHORT, IT IS THE USER INTERFACE FOR THE TREND TRACKER.  DURING THE SETUP MODE,
                   =  635    ;NO INTERRUPTS ARE ALLOWED FROM THE HOST--NO REAL TIME DATA ENTER THE SYSTEM.
                   =  636    ;THE MODE CONTROL SWITCH IS MONITORED IN ORDER TO KNOW WHEN TO RETURN
                   =  637    ;TO THE MAIN ROUTINE.
                   =  638    ;************************************************************
                   =  639    ;
                   =  640    SETMOD:
020B 217422        =  641           LXI       H,SYSCTL     ;TURN OFF VALUE SWITCH
020E 7E            =  642           MOV       A,M
020F E6FB          =  643           ANI       VALOFF
0211 77            =  644           MOV       M,A
0212 21010D        =  645           LXI       H,BARDYMSG
0215 CD2B0C        =  646           CALL      LEDDSP
0218 3A0110        =  647           LDA       BARCTL
021B 327522        =  648           STA       SELPARCTL
021E CDAE08        =  649           CALL      UPDATPD      ;SHOW CURRENT BARGRAPH DISPLAY SELECTION
                   =  650    SETLOOP:
0221 320060        =  651           STA       WDTMR
0224 CD6508        =  652           CALL      RIXSELPAR    ;READ PARAMETER INCREMENT SELECT SWITCH
0227 CD8908        =  653           CALL      RDXSELPAR    ;READ PARAMETER DECREMENT SELECT SWITCH
C22A CD7E09        =  654           CALL      RIXVALPAR    ;READ PARAMETER INCREMENT VALUE SWITCH
022D CDD809        =  655           CALL      RDXVALPAR    ;READ PARAMETER DECREMENT VALUE SWITCH
0230 CD7D0A        =  656           CALL      RDENTER      ;READ THE ENTER SWITCH
C233 CD4308        =  657           CALL      RDMODSW      ;READ MODE CONTROL SWITCH
0236 FE00          =  658           CPI       SETUPJS      ;IS IT IN SETUP POSITION
C238 C0            =  659           RNZ                    ;IF NOT, RETURN TO MAIN ROUTINE
```

```
LOC  OBJ        LINE        SOURCE STATEMENT

0239 C32102    =  660            JMP    SETLOOP
               =  661
               =  662 $EJECT
                  663 $INCLUDE(:F4:RUN11A.TRT)
               =  664 $EJECT
               =  665 $TITLE('TREND TRACKER RUN MODE SUBROUTINES & INTERRUPT HANDLERS')
               =  666 ;
               =  667 ;FILE:  RUN11A.TRT
               =  668 ;       STEVEN EHRHARDT          25 MAY 83
               =  669 ;
               =  670 $EJECT
               =  671 ;************************************************************
               =  672 ;                     *BARACE*
               =  673 ;;ROUTINE TO DISPLAY ACTUAL WEIGHT AT BAR GRAPH IN EQUIVALENT LED MODE
               =  674 ;************************************************************
               =  675
               =  676 BARACE:
023C CDBC03    =  677            CALL   UNITSEN             ;CALCULATE DIFFERENCE OF NET AND TST
               =  678                                       ;IN SENSITIVITY UNITS +/-
023F CDCB02    =  679            CALL   INSTCHK             ;CHECK FOR INSTANTANEOUS OR AVERAGE
0242 CD5902    =  680            CALL   ACTLIM              ;ENFORCE 0 - 24 LIMIT
0245 CD4404    =  681            CALL   ACTLED              ;TURN EM ON
0248 C9        =  682            RET
               =  683
0249 CDBC03    =  684 BARAVP: CALL     UNITSEN
024C CDCB02    =  685            CALL   INSTCHK             ;CHECK FOR INSTANTANEOUS OR AVERAGE
024F CD2204    =  686            CALL   PLEDCOMP            ;CHECK NUMLED TABLE
0252 CD5902    =  687            CALL   ACTLIM
0255 CD4404    =  688            CALL   ACTLED
0258 C9        =  689            RET
               =  690
               =  691 ACTLIM:
0259 3ADB22    =  692            LDA    NUMLEDS
025C 4F        =  693            MOV    C,A
025D E67F      =  694            ANI    07FH
025F FE0D      =  695            CPI    13                  ;12 OR LESS ACCEPTED
0261 DA6E02    =  696            JC     ACL05
0264 79        =  697            MOV    A,C
0265 E680      =  698            ANI    80H                 ;PROTECT SIGN
0267 4F        =  699            MOV    C,A
0268 3E0C      =  700            MVI    A,12
026A B1        =  701            ORA    C
026B 32DB22    =  702            STA    NUMLEDS
026E 3ADB22    =  703 ACL05:  LDA     NUMLEDS
0271 47        =  704            MOV    B,A
0272 17        =  705            RAL                        ;POS OR NEG OFFSET
0273 DA8302    =  706            JC     ACL10
0276 3E0C      =  707            MVI    A,12                ;POSITIVE- ADD TO 12 TO GET #LEDS
0278 80        =  708            ADD    B
0279 FE19      =  709            CPI    25                  ;24 MAX
027B DA8E02    =  710            JC     ACL20
027E 3E18      =  711            MVI    A,24
0280 C38E02    =  712            JMP    ACL20
               =  713 ACL10:
0283 78        =  714            MOV    A,B
0284 E67F      =  715            ANI    07FH                ;REMOVE SIGN
0286 47        =  716            MOV    B,A
0287 3E0C      =  717            MVI    A,12
0289 90        =  718            SUB    B                   ;SUBTRACT FROM 12
028A D28E02    =  719            JNC    ACL20               ;NO NEGATIVE NUMBERS-JUST ZERO!!
028D AF        =  720            XRA    A
```

```
LOC  OBJ           LINE        SOURCE STATEMENT 028E 32DB22      =  721 ACL20:  STA     NUMLEDS
0291 C9          =  722         RET
                 =  723 $EJECT
                 =  724 ;****************************************************
                 =  725 ;                    *BARDVE*
                 =  726 ;ROUTINE TO DISPLAY DEVIATION WEIGHT AT BAR GRAPH IN EQUIVALENT MODE
                 =  727 ;****************************************************
                 =  728
                 =  729 BARDVE:
0292 CDBC03      =  730         CALL    UNITSEN            ;GET DEVIATION IN SENS UNITS
0295 CDCB02      =  731         CALL    INSTCHK            ;CHECK FOR INSTANT/AVERAGE
0298 CDAF02      =  732         CALL    DEVLIM
029B CD7D04      =  733         CALL    DEVLED
029E C9          =  734         RET
                 =  735 BARDVP:
029F CDBC03      =  736         CALL    UNITSEN
02A2 CDCB02      =  737         CALL    INSTCHK            ;CHECK FOR INSTANT/AVERAGE
02A5 CD2204      =  738         CALL    PLEDCOMP
02A8 CDAF02      =  739         CALL    DEVLIM
02AB CD7D04      =  740         CALL    DEVLED
02AE C9          =  741         RET
                 =  742
                 =  743 DEVLIM:
                 =  744         ;ONLY 0 TO 12 ACCEPTED
02AF 3ADB22      =  745         LDA     NUMLEDS
02B2 4F          =  746         MOV     C,A
02B3 E67F        =  747         ANI     7FH
02B5 FE0D        =  748         CPI     13
02B7 DAC402      =  749         JC      DVL10
02BA 79          =  750         MOV     A,C
02BB E680        =  751         ANI     80H
02BD 4F          =  752         MOV     C,A
02BE 3E0C        =  753         MVI     A,12
02C0 B1          =  754         ORA     C
02C1 32DB22      =  755         STA     NUMLEDS
02C4 3ADB22      =  756 DVL10:  LDA     NUMLEDS
02C7 CD7D04      =  757         CALL    DEVLED             ;LIGHT EM UP
02CA C9          =  758         RET
                 =  759 $EJECT
                 =  760 ;****************************************************
                 =  761 ;       *INSTCHK*
                 =  762 ;DETERMINES IF BAR GRAPH IS TO BE INSTANEOUS DISPLAY OR
                 =  763 ;AVERAGED DISPLAY. IF AVERAGE, NO CHANGE IS MADE IN NUMBER
                 =  764 ;OF LEDS TO DISPLAY. IF INSTANTANEOUS, A NEW VALUE IS CALCULATED
                 =  765 ;FOR NUMLEDS.
                 =  766 ;
                 =  767 INSTCHK:
02CB 3A0040      =  768         LDA     SWITCHES           ;READ SWITCHES
02CE E608        =  769         ANI     08H                ;THE BG AVG/INST SWITCH
02D0 C0          =  770         RNZ                        ;IF AVG SELECTED, GET OUT
                 =  771         ;INSTANTANEOUS BAR GRAPH DISPLAY REQUESTED
                 =  772         ;CALCULATE NUMBER OF LEDS TO LIGHT
02D1 017C22      =  773         LXI     B,FPT4P1+5
02D4 11B822      =  774         LXI     D,FPLAST+5
02D7 219A22      =  775         LXI     H,FPTGT+5
02DA CD5472      =  776         CALL    FSUB
02DD 217722      =  777         LXI     H,FPTMP1
02E0 CD7571      =  778         CALL    FPNORM
                 =  779         ;DEVIATION HAS BEEN DETERMINED, IF =0, THEN NUMLEDS =0
02E3 2A7722      =  780         LHLD    FPTMP1
02E6 7C          =  781         MOV     A,H
```

```
LOC  OBJ          LINE           SOURCE STATEMENT

02E7 B5         = 782            ORA    L
02E8 C2EF02     = 783            JNZ    INST10
02EB AF         = 784            XRA    A
02EC C30703     = 785            JMP    INST20
                = 786 INST10: ;NON-ZERO DEVIATION, CALCULATE NUMBER OF SENSITIVITY UNITS
02EF 018222     = 787            LXI    B,FPTMP2+5
02F2 117C22     = 788            LXI    D,FPTMP1+5
02F5 219422     = 789            LXI    H,FPSEN+5
02F8 CDD072     = 790            CALL   FDIV
02FB 217D22     = 791            LXI    H,FPTMP2
02FE CD7571     = 792            CALL   FFNORM
0301 217D22     = 793            LXI    H,FPTMP2        ;REDUCE TO INTEGER
0304 CDBE71     = 794            CALL   FLTINT
0307 32DB22     = 795 INST20: STA    NUMLEDS
030A C9         = 796            RET
                = 797
                = 798 $EJECT
                = 799 ;****** SEGACT ******
                = 800 ;****** SEGDEV ******
                = 801 ;*********************************************
                = 802 ;SEGACT SHOWS ACTUAL AVERAGE OF LAST N WEIGHTS
                = 803 ;SEGDEV SHOW DEVIATION FROM TARGET OF AVERAGE OF LAST N WEIGHTS
                = 804
                = 805 SEGACT:
030B 3A0040     = 806            LDA    SWITCHES        ;INSTANT OR AVERAGED FOR 7 SEG
030E E604       = 807            ANI    S7AVIN
0310 C21903     = 808            JNZ    SA5
0313 21B322     = 809            LXI    H,FPLAST        ;FETCH LATEST
0316 C31C03     = 810            JMP    SA6
0319 21EC22     = 811 SA5:    LXI    H,FPAVG         ;FETCH AVERAGE
031C CD8970     = 812 SA6:    CALL   FLTDEC          ;CONVERT TO DECIMAL
031F C34203     = 813            JMP    SHOSEG          ;DISPLAY AND RETURN FROM DISPLAY CODE
                = 814
                = 815 SEGDEV:
0322 3A0040     = 816            LDA    SWITCHES        ;AVERAGED OR INSTANT
0325 E604       = 817            ANI    S7AVIN
0327 C23C03     = 818            JNZ    SD5
032A 11B822     = 819            LXI    D,FPLAST+5
032D 219A22     = 820            LXI    H,FPTG+5
0330 018822     = 821            LXI    B,FPTMP3+5
0333 CD5472     = 822            CALL   FSUB            ;INSTANT DEVIATION CALCULATED
0336 218322     = 823            LXI    H,FPTMP3        ;ITS IN TEMPORARY FP AREA
0339 C33F03     = 824            JMP    SD6
033C 21AD22     = 825 SD5:    LXI    H,FPDEV         ;FETCH DEVIATION
033F CD8970     = 826 SD6:    CALL   FLTDEC
                = 827 SHOSEG:
                = 828            ;TEST FOR OVERRANGE VALUE
0342 3A7422     = 829            LDA    SYSCTL
0345 E608       = 830            ANI    OVRNG
0347 C2B503     = 831            JNZ    SEGERR
                = 832            ;TRANSLATE DECIMAL INTO 7SEG, ADD SIGN AND DEC PT.
034A 2AE622     = 833            LHLD   FRSTDG          ;POINT TO FIRST DIGIT
034D 113C22     = 834            LXI    D,SEGBUFFER
0350 0E04       = 835            MVI    C,4
0352 CDF50C     = 836            CALL   SEGDAT          ;4 FROM FIRST INCLUSIVE TO 7 SEG IMAGE
0355 2AE822     = 837            LHLD   LASTDG
0358 7E         = 838            MOV    A,M             ;PLACE THE SIGN
0359 47         = 839            MOV    B,A             ;COPY FOR FUTURE USE
035A E680       = 840            ANI    80H             ;ISOLATE SIGN BIT
035C B7         = 841            ORA    A               ;POS OR NEG?
035D CA8803     = 842            JZ     SHSG15          ;POS-SKIP AHEAD
```

| LOC  | OBJ     | LINE           | SOURCE STATEMENT |        |                                         |
|------|---------|----------------|------------------|--------|-----------------------------------------|
| 0360 | 2AE622  | = 843          | LHLD             | FRSTDG | ;NEG-CHECK FOR MAGNITUDE>0999 AND >1999 |
| 0363 | 7E      | = 844          | MOV              | A,M    |                                         |
| 0364 | FE01    | = 845          | CPI              | 1      |                                         |
| 0366 | CA7C03  | = 846          | JZ               | SHSG10 | ;>0999 AND <1999                        |
| 0369 | DA8603  | = 847          | JC               | SHSG12 | ;<1000                                  |
| 036C | 213C22  | = 848          | LXI              | H,SEGBUFFER | ;>1999                             |
| 036F | 0E04    | = 849          | MVI              | C,4    |                                         |
| 0371 | 3EFD    | = 850          | MVI              | A,MIN  |                                         |
| 0373 | 77      | = 851 MINLP:   | MOV              | M,A    |                                         |
| 0374 | 23      | = 852          | INX              | H      |                                         |
| 0375 | 0D      | = 853          | DCR              | C      |                                         |
| 0376 | C27303  | = 854          | JNZ              | MINLP  | ;IF >1999 THEN '-----'                  |
| 0379 | C3BB03  | = 855          | JMP              | SHSG15 |                                         |
| 037C | 213C22  | = 856 SHSG10:  | LXI              | H,SEGBUFFER | ;IF >0999, THEN "-1NNN"            |
| 037F | 3EFD    | = 857          | MVI              | A,MIN  |                                         |
| 0381 | A6      | = 858          | ANA              | M      |                                         |
| 0382 | 77      | = 859          | MOV              | M,A    |                                         |
| 0383 | C3BB03  | = 860          | JMP              | SHSG15 |                                         |
| 0386 | 213C22  | = 861 SHSG12:  | LXI              | H,SEGBUFFER | ;IF <1000, THEN "-NNN"             |
| 0389 | 36FD    | = 862          | MVI              | M,MIN  |                                         |
| 038B | 213C22  | = 863 SHSG15:  | LXI              | H,SEGBUFFER |                                    |
| 038E | 78      | = 864          | MOV              | A,B    | ;ADD THE DECIMAL POINT                  |
| 038F | E630    | = 865          | ANI              | 30H    | ;ISOLATE THE DPPOS                      |
| 0391 | CD2E70  | = 866          | CALL             | SHIFTR |                                         |
| 0394 | 110000  | = 867          | LXI              | D,0    |                                         |
| 0397 | FE03    | = 868 SHSG20:  | CPI              | 03H    | ;TIL OFFSET FOR DP IS CALCULATED        |
| 0399 | CA4103  | = 869          | JZ               | SHSG30 |                                         |
| 039C | 3C      | = 870          | INR              | A      |                                         |
| 039D | 13      | = 871          | INX              | D      |                                         |
| 039E | C39703  | = 872          | JMP              | SHSG20 |                                         |
| 03A1 | 19      | = 873 SHSG30:  | DAD              | D      | ;POINT TO CORRECT PLACE FOR DP          |
| 03A2 | 3EFE    | = 874          | MVI              | A,POINT |                                        |
| 03A4 | A6      | = 875          | ANA              | M      |                                         |
| 03A5 | 77      | = 876          | MOV              | M,A    | ;PUT THE DP IN PLACE                    |
| 03A6 | 213C22  | = 877 SHSG40:  | LXI              | H,SEGBUFFER |                                    |
| 03A9 | 3E03    | = 878          | MVI              | A,S0   | ;IF MSD=0 AND NO DEC PT                 |
| 03AB | BE      | = 879          | CMP              | M      |                                         |
| 03AC | C2B103  | = 880          | JNZ              | SHSG45 |                                         |
| 03AF | 36FF    | = 881          | MVI              | M,SPC  | ;THEN BLANK THE LEADING 0 WITH NO DEC PT |
| 03B1 | CD180C  | = 882 SHSG45:  | CALL             | MSGDSP | ;SHOW THE VALUE AT 7SEG DISPLAY         |
| 03B4 | C9      | = 883          | RET              |        |                                         |
|      |         | = 884 SEGERR:  |                  |        |                                         |
| 03B5 | 21230D  | = 885          | LXI              | H,OVRERR | ;SHOW OVERRANGE ERROR                 |
| 03B8 | CD180C  | = 886          | CALL             | MSGDSP |                                         |
| 03BB | C9      | = 887          | RET              |        |                                         |

```
= 888 $EJECT
= 889 ;*********************************************************
= 890 ;SUBROUTINES WHICH FOLLOW ARE USED BY BAR GRAPH DISPLAY HANDLERS TO
= 891 ;CALCULATE NUMBER OF LEDS TO DISPLAY AT ANY TIME
= 892 ;
= 893 ;
= 894 ;FIRST ONE IS CALLED 'UNITSEN'. IT SUBTRACTS TARGET WEIGHT FROM ACTUAL
= 895 ;WEIGHT AVERAGE. THE RESULTING NUMBER (+/-) IS THEN DIVIDED BY THE
= 896 ;SENSITIVITY FACTOR TO DETERMINE HOW MANY SENSITIVITY UNITS ABOVE OR
= 897 ;BELOW TARGET WEIGHT IS THE CURRENT AVERAGE. THIS NUMBER IS TRUNCATED TO
= 898 ;ITS INTEGER COMPONENT AND PLACED IN THE LOW NYBBLE OF NUMBLEDS. IF
= 899 ;IT IS BELOW TARGET THE HI BIT OF NUMLEDS IS SET TO 1, ELSE IT IS 0.
= 900 ;*********************************************************
= 901 UNITSEN:
```

| 03BC | 3A0C22 | = 902 | LDA | NUMWTS | ;IF NO WEIGHT IN FIFO AVG, DEV AND NUMLED=MINIMUM |
| 03BF | B7     | = 903 | ORA | A      |                                                   |

```
LOC  OBJ         LINE         SOURCE STATEMENT

03C0 C2E203    =  904           JNZ    US05
03C3 32DB22    =  905           STA    NUMLEDS        ;NUMLEDS TO MINIMUM
03C6 21A722    =  906           LXI    H,FPAVG
03C9 010600    =  907           LXI    B,6
03CC CD620C    =  908           CALL   RCLR           ;AVG 0
03CF 219522    =  909           LXI    H,FPTGT        ;DEV TO -TGT
03D2 11AD22    =  910           LXI    D,FPDEV
03D5 0E06      =  911           MVI    C,6
03D7 CD430C    =  912           CALL   MXFER
03DA 3E01      =  913           MVI    A,1
03DC 329122    =  914           STA    FPDEV+4
03DF C3F403    =  915           JMP    US06
               =  916
               =  917 US05:
               =  918           ;IF AVG=0 SET EXPONENT TO 0 ELSE TOTAL UNCHANGED
03E2 21EC22    =  919           LXI    H,RFPAVG
03E5 CD0905    =  920           CALL   ZERCHK
03E8 219A22    =  921           LXI    H,FPTGT+5
03EB 11F122    =  922           LXI    D,RFPAVG+5     ;TGT-AVG=DEVIATION
03EE 01B222    =  923           LXI    B,FPDEV+5
03F1 CD5472    =  924           CALL   FSUB           ;DO SUBTRACTION
               =  925 US06:
03F4 21AD22    =  926           LXI    H,FPDEV
03F7 CD7571    =  927           CALL   FPNORM         ;NORMALIZE RESULT
03FA 2AAD22    =  928           LHLD   FPDEV
03FD 7C        =  929           MOV    A,H            ;IF DEV=0, THEN NUMLEDS =0
03FE B5        =  930           ORA    L
03FF C20604    =  931           JNZ    US10
0402 AF        =  932           XRA    A
0403 C31E04    =  933           JMP    US15
0406 11B222    =  934 US10:     LXI    D,FPDEV+5      ;DEVIATION/SENS=NUMBER OF SENSUNITS
0409 219422    =  935           LXI    H,FPSEN+5
040C 017D22    =  936           LXI    B,FPTMP2+5
040F CDD072    =  937           CALL   FDIV           ;DO THE DIVISION
0412 217D22    =  938           LXI    H,FPTMP2
0415 CD7571    =  939           CALL   FPNORM         ;NORMALIZE RESULT
0418 217D22    =  940           LXI    H,FPTMP2
041B CDBE71    =  941           CALL   FLTINT
041E 32DB22    =  942 US15:     STA    NUMLEDS        ;JUST THE INTEGER AND SIGN WILL DO
0421 C9        =  943           RET
               =  944 $EJECT
               =  945 ;****************
               =  946 PLEDCVF:
               =  947 ;****************
               =  948           ;THIS ROUTINE IS USED BY PROPORTIONAL DISPLAY DRIVERS
               =  949           ;IT SCANS THE PROPORTIONAL TABLE TO CONVERT THE
               =  950           ;NUMBER OF SENSITIVITY UNITS GIVEN BY UNITSEN INTO
               =  951           ;A NUMBER BETWEEN ZERO AND TWELVE. THIS NUMBER IS # OF
               =  952           ;OF LEDS ABOVE OR BELOW TARGET WEIGHT.
               =  953           ;
0422 3ADB22    =  954           LDA    NUMLEDS        ;FETCH #SENS UNITS
0425 47        =  955           MOV    B,A
0426 E67F      =  956           ANI    07FH           ;IGNORE SIGN
0428 215E0D    =  957           LXI    H,PROPTABLE    ;INDEX THE TABLE
042B 0E00      =  958           MVI    C,0            ;THIRTEEN ENTRIES COUNTING 0 POINT
042D BE        =  959 PLED10:   CMP    M              ;SCAN TIL TABLE ENTRY IS GREATER THAN NUM
042E DA3B04    =  960           JC     PLED20
0431 23        =  961           INX    H
0432 0C        =  962           INR    C
0433 57        =  963           MOV    D,A
0434 3E0D      =  964           MVI    A,13
```

```
LOC  OBJ         LINE       SOURCE STATEMENT

0436 B9         = 965       CMP    C
0437 7A         = 966       MOV    A,D
0438 C22D04     = 967       JNZ    PLED10            ;OR TIL 12 ENTRIES CHECKED
                = 968
043B 0D         = 969 PLED20: DCR   C                ;GO BACK TO LAST ONE NOT GREATER THAN
043C 78         = 970       MOV    A,B
043D E680       = 971       ANI    080H
043F B1         = 972       ORA    C                 ;STICK IT IN PROTECTING SIGN
0440 320B22     = 973       STA    NUMLEDS           ;ITS THE NEW NUMBER OF LEDS
0443 C9         = 974       RET
                = 975 $EJECT
                = 976
                = 977 ;************;
                = 978 ACTLED:
                = 979 ;************;
                = 980       ;THIS ROUTINE TAKES THE NUMBER OF LEDS TO LIGHT UP
                = 981       ;AND LIGHTS THEM UP STARTING FROM THE LEFTMOST LED
                = 982       ;
0444 219922     = 983       LXI    H,BARBUF          ;POINTER TO BARGRAPH BUFFER
0447 010300     = 984       LXI    B,3               ;LENGTH OF BARGRAPH BUFFER
044A CD620C     = 985       CALL   RCLR              ;CLEAN IT OUT--ALL ZEROES
044D 3ADC22     = 986       LDA    NUMWTS            ;IF FIFO EMPTY, NO LEDS LIT
0450 B7         = 987       ORA    A
0451 CA7604     = 988       JZ     ACTDUN
0454 219B22     = 989       LXI    H,BARBUF+2        ;START AT EXTREME LEFT
0457 3ADB22     = 990       LDA    NUMLEDS           ;HOW MANY TO LIGHT?
045A E67F       = 991       ANI    07FH              ;FORGET SIGN IN THIS ONE
045C B7         = 992       ORA    A
045D CA7604     = 993       JZ     ACTDUN            ;IF ZERO, DONE ALREADY
0460 4F         = 994       MOV    C,A
                = 995 ACTLUP:
0461 7E         = 996       MOV    A,M
0462 37         = 997       STC                      ;SET CARRY FLAG AND ROTATE IT IN
0463 1F         = 998       RAR                      ;ONCE FOR EACH LED TO LIGHT
0464 77         = 999       MOV    M,A
0465 DA6F04     =1000       JC     NXTBAR            ;IF FILLED A BYTE, GO TO NEXT BYTE
0468 0D         =1001       DCR    C                 ;IF SET ALL LEDS, THEN DONE
0469 C26104     =1002       JNZ    ACTLUP            ;ELSE SHIFT AGAIN
046C C37604     =1003       JMP    ACTDUN
046F 2B         =1004 NXTBAR: DCX  H                 ;NEXT BYTE OF BAR BUFFER
0470 3680       =1005       MVI    M,80H             ;HANDLE THE SHIFT THAT CARRIED OUT
0472 0D         =1006       DCR    C                 ;KEEP COUNT
0473 C26104     =1007       JNZ    ACTLUP            ;TILL ALL ARE LIT
0476 219922     =1008 ACTDUN: LXI  H,BARBUF          ;SHOW ALL LEDS
0479 CD280C     =1009       CALL   LEDDSP
047C C9         =1010       RET
                =1011 $EJECT
                =1012
                =1013 ;************
                =1014 DEVLED:
                =1015 ;************
                =1016       ;ROUTINE TO DISPLAY THE LEDS FOR DEVIATION TYPE DISPLAYS
                =1017       ;AT THE BAR GRAPH
                =1018       ;TURN THEM ON FROM THE CENTER OUT, LEFT IF NEGATIVE DEVIATION
                =1019       ;RIGHT IF POSITIVE DEVIATION.
                =1020       ;
047D 219922     =1021       LXI    H,BARBUF          ;CLEAN OUT THE BAR GRAPH BUFFER
0480 010300     =1022       LXI    B,3
0483 CD620C     =1023       CALL   RCLR
0486 21BA22     =1024       LXI    H,BARBUF+1        ;START AT CENTER BYTE
0489 3618       =1025       MVI    M,018H            ;TWO CENTER LEDS ON
```

```
LOC  OBJ          LINE         SOURCE STATEMENT 048B 3ADB22      =1026         LDA    NUMLEDS        ;FETCH NUMBER OF LEDS TO LIGHT
048E 4F          =1027         MOV    C,A
048F 17          =1028         RAL
0490 DA9704      =1029         JC     NEGDIR         ;POS OR NEG DIRECTION?
0493 AF          =1030         XRA    A              ;POSITIVE
0494 C39904      =1031         JMP    SETDIR
0497 3EFF        =1032 NEGDIR: MVI    A,0FFH
0499 327622      =1033 SETDIR: STA    DEVDIR         ;SET THE DEVIATION DIRECTION FLAG
049C 57          =1034         MOV    D,A            ;STASH IT IN D
049D 79          =1035         MOV    A,C            ;RETRIEVE NUMLEDS
049E E67F        =1036         ANI    07FH           ;FORGET ABOUT SIGN
04A0 4F          =1037         MOV    C,A
04A1 FE01        =1038         CPI    1              ;IF LESS THAN 1 LED, STOP NOW
04A3 DAF804      =1039         JC     DEVDUN
04A6 7A          =1040         MOV    A,D            ;POS OR NEG
04A7 B7          =1041         ORA    A
04A8 C2B004      =1042         JNZ    NEGINT         ;NEG--INITIALIZE FOR NEGATIVE
04AB 3EF0        =1043         MVI    A,0F0H         ;POS-- INITIALIZE FOR POSITIVE
04AD C3B204      =1044         JMP    DEVINT
04B0 3E0F        =1045 NEGINT: MVI    A,0FH
04B2 21BA22      =1046 DEVINT: LXI    H,BARBUF+1
04B5 77          =1047         MOV    M,A            ;INIT IN CENTER BYTE
04B6 79          =1048         MOV    A,C            ;RETRIEVE NUMLEDS
04B7 7E          =1049 DEVLOP: MOV    A,M
04B8 47          =1050         MOV    B,A            ;HOLD THAT BYTE FOR A SEC
04B9 7A          =1051         MOV    A,D            ;WHILE WE FIGURE OUT LEFT OR RIGHT SHIFT
04BA B7          =1052         ORA    A
04BB 78          =1053         MOV    A,B            ;RETRIEVE BYTE
04BC 37          =1054         STC                   ;CARRY FLAG ROTATED IN TO LIGHT A LED
04BD C2C404      =1055         JNZ    ROTNEG
04C0 1F          =1056         RAR                   ;ITS POSITIVE,ROTATE TO THE RIGHT
04C1 C3C504      =1057         JMP    ROTDUN
04C4 17          =1058 ROTNEG: RAL                   ;ITS NEGATIVE, ROTATE TO THE LEFT
04C5 77          =1059 ROTDUN: MOV    M,A            ;STASH IT IN BAR BUF
04C6 DAD004      =1060         JC     NXBYDV         ;IF CARRY, NEED NEXT BYTE
04C9 0D          =1061         DCR    C              ;ELSE IF MORE TO SHIFT
04CA C2B704      =1062         JNZ    DEVLOP         ;GO SHIFT IN ANOTHER LED ON
04CD C3E604      =1063         JMP    TRUNC          ;ELSE TRUNCATE AWAY THE INITIALIZATION
04D0 7A          =1064 NXBYDV: MOV    A,D            ;- OR -
04D1 B7          =1065         ORA    A
04D2 C2DD04      =1066         JNZ    NXTNEG
04D5 21B922      =1067         LXI    H,BARBUF       ;NEXT BYTE IS ON POSITIVE SIDE
04D8 3680        =1068         MVI    M,80H          ;LIGHT THE LED
04DA C3E204      =1069         JMP    NXTDUN
04DD 21BB22      =1070 NXTNEG: LXI    H,BARBUF+2     ;NEXT BYTE IS ON NEGATIVE SIDE
04E0 3601        =1071         MVI    M,01H
04E2 0D          =1072 NXTDUN: DCR    C
04E3 C2B704      =1073         JNZ    DEVLOP         ;IF MORE TO GO, THEN DO IT
04E6 7A          =1074 TRUNC:  MOV    A,D            ;+ OR -
04E7 B7          =1075         ORA    A
04E8 21BA22      =1076         LXI    H,BARBUF+1
04EB C2F404      =1077         JNZ    TRUNEG         ;GO TRUNCATE NEGATIVE INIT
04EE 7E          =1078         MOV    A,M
04EF E60F        =1079         ANI    0FH            ;TRUNCATE POSITIVE INIT
04F1 C3F704      =1080         JMP    TRUDUN
04F4 7E          =1081 TRUNEG: MOV    A,M
04F5 E6F0        =1082         ANI    0F0H           ;TRUNCATE NEGATIVE INIT
04F7 77          =1083 TRUDUN: MOV    M,A            ;STASH THE BYTE
04F8 21B922      =1084 DEVDUN: LXI    H,BARBUF
04FB CD2B0C      =1085         CALL   LEDDSP         ;SHOW THE LEDS
04FE C9          =1086         RET
```

```
LOC  OBJ          LINE       SOURCE STATEMENT

=1087 ;
                  =1088 ;**************
                  =1089 SETEXP:
                  =1090 ;**************
                  =1091       ;ROUTINE TO SET EXPONENT TO GIVEN DEC PT POSITION
                  =1092       ;
C4FF 210410       =1093       LXI     H,DPP
0502 3E34         =1094       MVI     A,34H
0504 96           =1095       SUB     M
0505 32DF22       =1096       STA     EXPON
0508 C9           =1097       RET
                  =1098 ZERCHK:
                  =1099       ;ENTERS HL POINTING TO FPVALUE
                  =1100       ;RETURNS EXPONENT =0 IF DIGITS =0
                  =1101       ;
0509 AF           =1102       XRA     A
050A 0604         =1103       MVI     B,4
050C B6           =1104 ZCK10: ORA    M
050D C0           =1105       RNZ
050E 23           =1106       INX     H
050F 05           =1107       DCR     B
0510 C20C05       =1108       JNZ     ZCK10
0513 23           =1109       INX     H
0514 77           =1110       MOV     M,A
0515 C9           =1111       RET
                  =1112 $EJECT
                  =1113 ;*********************************************************
                  =1114 ;         *INTERRUPT HANDLERS*
                  =1115 ;*********************************************************
                  =1116 ;
                  =1117 ;********************************;
                  =1118 ;     TRAP INTERRUPT
                  =1119 ;********************************
                  =1120 ISRWD:  ;WATCHDOG TIMED OUT--RESTART 7 WILL BE PERFORMED
                  =1121        ;IF WATCHDOG TIMED OUT DURING E2PROM WRITE PROCESS
                  =1122        ;A MESSAGE IS DISPLAYED BEFORE THE RESTART
                  =1123
0516 3A4222       =1124        LDA     SYSCTL         ;E2PROM BUSY?
0519 E602         =1125        ANI     E2BUSY
051B CA2A05       =1126        JZ      ISWD10         ;NO--JUST RST 7
051E 211F0D       =1127        LXI     H,EEPER        ;YES--ERROR MSG FIRST
0521 CD180C       =1128        CALL    MSGDSP
0524 21D007       =1129        LXI     H,2000         ;MAKE IT A LONG MSG
0527 CD4C0C       =1130        CALL    DELAY
052A FF           =1131 ISWD10: RST    7              ;RESTART HERE
                  =1132
                  =1133 ;********************************
                  =1134 ;INTERRUPT 5.5 FROM 2CH
                  =1135 ;EEPROM VERIFICATION
                  =1136 ;********************************
                  =1137 ISREPV:
052B CD1407       =1138        CALL    RSAV
052E 20           =1139        DB      RIMB
052F F609         =1140        ORI     09H
0531 30           =1141        DB      SIMB           ;TURN OFF EEPROM VERIFY INTERRUPT
0532 2ACD22       =1142        LHLD    EEPADD         ;RECOVER EEPROM ADDRESS LAST WRITTEN
0535 3ACC22       =1143        LDA     EEPCOPY        ;RECOVER EEPROM BYTE LAST WRITTEN
0538 46           =1144        MOV     B,M
0539 B8           =1145        CMP     B
053A CA4A05       =1146        JZ      ISE210         ;THEY MATCH-EEPROM IS OK
053D 211F0D       =1147        LXI     H,EEPER        ;THEY DONT MATCH-SHOW EEPROM ERROR AND RESTART
```

| LOC  OBJ | LINE | | SOURCE STATEMENT | |
|---|---|---|---|---|
| 0540 CD180C | =1148 | | CALL | MSGDSP |
| 0543 210007 | =1149 | | LXI | H,2000 | ;A LONG MSG HERE
| 0546 CD4C0C | =1150 | | CALL | DELAY |
| 0549 FF | =1151 | | RST | 7 | ;RESTART BUT GOOD LUCK TO YOU!!
| 054A 320060 | =1152 | ISE210: | STA | WDTMR | ;START THE WATCHDOG TIMER AGAIN
| 054D 217422 | =1153 | | LXI | H,SYSCTL |
| 0550 7E | =1154 | | MOV | A,M |
| 0551 E6FD | =1155 | | ANI | EPREDY | ;INDICATE E2PROM FINISHED WRITING
| 0553 77 | =1156 | | MOV | M,A |
| 0554 C31907 | =1157 | | JMP | INTR | ;RETURN FROM INTERRUPT
| | =1158 | $EJECT | | |
| | =1159 | ;*********************************** | | |
| | =1160 | ;INTERRUPT 6.5 FROM 34H | | |
| | =1161 | ;DATA ARRIVING FROM HOST | | |
| | =1162 | ;*********************************** | | |
| | =1163 | ; | | |
| | =1164 | ISRDAT: | | |
| 0557 CD1407 | =1165 | | CALL | RSAV |
| 055A 3A0030 | =1166 | | LDA | HOST | ;
| 055D E67F | =1167 | | ANI | 7FH | ;IGNORE PARITY
| 055F FE0D | =1168 | | CPI | CR | ;IS IT CARRIAGE RETURN
| 0561 CA9D05 | =1169 | | JZ | ENDTRAN | ;IF SO, TRANSMISSION HAS ENDED
| 0564 FE0A | =1170 | | CPI | LF |
| 0566 CAF705 | =1171 | | JZ | DAT40 | ;IGNORE LINEFEEDS
| 0569 FE2E | =1172 | | CPI | DP |
| 056B C27A05 | =1173 | | JNZ | DAT10 | ;IF NOT DEC PT, SKIP AHEAD
| 056E 3A6222 | =1174 | | LDA | ASCCTR |
| 0571 0630 | =1175 | | MVI | B,30H | ;ELSE UPDAT ASCII VAL OF EXPONENT
| 0573 B0 | =1176 | | ORA | B |
| 0574 32DF22 | =1177 | | STA | EXPON | ;DIGITS SO FAR ARE LEFT OF DP
| 0577 C3F705 | =1178 | | JMP | DAT40 |
| | =1179 | DAT10: | | |
| 057A 47 | =1180 | | MOV | B,A |
| 057B 3A6222 | =1181 | | LDA | ASCCTR | ;ASCII CHAR. FROM HOST COUNTER
| 057E FE04 | =1182 | | CPI | 4 | ;FOUR IS THE LIMIT, IGNORE ANY MORE
| 0580 78 | =1183 | | MOV | A,B |
| 0581 CAF705 | =1184 | | JZ | DAT40 |
| 0584 FE40 | =1185 | | CPI | 40H | ;GREATER THAN DECIMAL 9, IGNORE IT
| 0586 D2F705 | =1186 | | JNC | DAT40 |
| 0589 FE30 | =1187 | | CPI | 30H | ;LESS THEN DECIMAL 0, IGNORE IT
| 058B DAF705 | =1188 | | JC | DAT40 |
| 058E 2ADD22 | =1189 | | LHLD | ASCPTR | ;ELSE STASH IT IN ASCII BUFFER
| 0591 77 | =1190 | | MOV | M,A |
| 0592 23 | =1191 | | INX | H |
| 0593 22DD22 | =1192 | | SHLD | ASCPTR | ;UPDATE ASCII BUFFER POINTER
| 0596 216222 | =1193 | | LXI | H,ASCCTR | ;AND COUNTER
| 0599 34 | =1194 | | INR | M |
| 059A C3F705 | =1195 | | JMP | DAT40 |
| | =1196 | ENDTRAN: | | |
| | =1197 | ;IF TGT WT STROBED, FETCH TARGET WEIGHT | | |
| | =1198 | ;LOOK AT END OF TRANSMISSION SO YOU DONT MISS A BYTE | | |
| 059D 3A7422 | =1199 | | LDA | SYSCTL |
| 05A0 E601 | =1200 | | ANI | TGTON |
| 05A2 CABE05 | =1201 | | JZ | DAT20 |
| 05A5 217422 | =1202 | | LXI | H,SYSCTL | ;CLEAR NET TGT RANGE ERROR
| 05A8 7E | =1203 | | MOV | A,M |
| 05A9 E6DF | =1204 | | ANI | NTERDF |
| 05AB 77 | =1205 | | MOV | M,A |
| 05AC CD5906 | =1206 | | CALL | FETGT |
| 05AF 3A7422 | =1207 | | LDA | SYSCTL | ;RANGE ERROR ON/OFF?  AUTO/MANUAL?
| 05B2 47 | =1208 | | MOV | B,A |

```
LOC  OBJ        LINE         SOURCE STATEMENT

05B3 E620      =1209         ANI    NTERUN           ;CHECK RANGE HERE
05B5 C2F705    =1210         JNZ    DAT40            ;IF TGT OUT OF RANGE, NO REFRESH
05B8 78        =1211         MOV    A,B
05B9 E610      =1212         ANI    AUTOST           ;CHECK AUTO/MANUAL HERE
05BB C2E205    =1213         JNZ    DAT30
               =1214         ;NOW PROCESS THE CURRENT TRANSMISSION
05BE 3ADF22    =1215 DAT20:  LDA    EXPON            ;EXPONENT TO FLOATING BUFFER
05C1 326022    =1216         STA    ASCBUF+4
05C4 215C22    =1217         LXI    H,ASCBUF         ;CONVERT TO FLOATING POINT
05C7 11B322    =1218         LXI    D,FPLAST         ;COMPRESSED FORM
05CA CD4771    =1219         CALL   ASCFP            ;CONVERT HERE
05CD 21B322    =1220         LXI    H,FPLAST         ;HANDLE ZEROES, TOO
05D0 CD0905    =1221         CALL   ZERCHK
05D3 11B822    =1222         LXI    D,FPLAST+5       ;NEW WT/AVG PAD TO FIFO
05D6 218E22    =1223         LXI    H,FPWTS+5
05D9 01A022    =1224         LXI    B,INFFLT+5
05DC CDDC72    =1225         CALL   FDIV
05DF CD6B07    =1226         CALL   INFIFO           ;DATA TO FIFO
05E2 215C22    =1227 DAT30:  LXI    H,ASCBUF         ;RESTORE POINTER,COUNTER AND BUFFER
05E5 22D022    =1228         SHLD   ASCPTR
05E8 CDFF04    =1229         CALL   SETEXP
05EB 215C22    =1230         LXI    H,ASCBUF         ;BUFFER AND COUNTER RESET
05EE 010800    =1231         LXI    B,8
05F1 CD620C    =1232         CALL   KCLR
05F4 CDFA05    =1233         CALL   REFRESH          ;REFRESH THE DISPLAY
               =1234 DAT40:
05F7 C31907    =1235         JMP    INTR
               =1236
               =1237 $EJECT
               =1238 ;*********************************
               =1239 REFRESH:
               =1240 ;*********************************
               =1241         ;UPDATE BAR GRAPH AND SEGMENT DISPLAY
               =1242
05FA 3A0110    =1243         LDA    BARCTL           ;CHECK BAR GRAPH DISPLAY CONTROL BYTE
05FD 87        =1244         ADD    A                ;DOUBLE IT AND USE IT FOR
05FE 211D06    =1245         LXI    H,BARTABLE       ;OFFSET TO BAR GRAPH DISPLAY
0601 4F        =1246         MOV    C,A              ;JUMP TABLE
0602 0600      =1247         MVI    B,0
0604 09        =1248         DAD    B                ;POINTER TO PROPER DISPLAY ROUTINE ADDRESS
0605 5E        =1249         MOV    E,M              ;IS CALCULATED.  FETCH ADDRESS
0606 23        =1250         INX    H                ;TO DE PAIR
0607 56        =1251         MOV    D,M
0608 210E06    =1252         LXI    H,BARRET         ;PERFORM CALL THE HARD WAY--PUSH RETURN ADDRESS
060B E5        =1253         PUSH   H                ;ONTO STACK TOP
060C EB        =1254         XCHG                    ;RETRIEVE PROGRAM ADDRESS TO HL
060D E9        =1255         PCHL                    ;STUFF THE PROGRAM COUNTER--THAT'S IT!!
               =1256 BARRET:
060E 3A0210    =1257         LDA    SEGCTL           ;FETCH THE 7 SEGMENT DISPLAY CONTROL BYTE
0611 FE04      =1258         CPI    ACTSEG           ;IS IT SET FOR ACTUAL NET WEIGHT
0613 F5        =1259         PUSH   PSW
0614 CC0B03    =1260         CZ     SEGACT           ;IF SO, DISPLAY ACTUAL NET WEIGHT
0617 F1        =1261         POP    PSW
0618 C42203    =1262         CNZ    SEGDEV           ;ELSE, DISPLAY DEVIATION FROM TARGET WEIGHT
061B C9        =1263         RET
               =1264 ;
               =1265 BARTABLE:
061C 3C02      =1266         DW     BARACE           ;ACTUAL WT., EQUIVALENT LED SENSITIVITY
061E 4902      =1267         DW     BARACP           ;ACTUAL WT., PROPORTIONAL LED SENSITIVITY
0620 9202      =1268         DW     BARDVE           ;DEVIATION, EQUIVALENT LED SENSITIVITY
0622 9F02      =1269         DW     BARDVP           ;DEVIATION, PROPORTIONAL LED SENSITIVITY
```

```
LOC  OBJ           LINE       SOURCE STATEMENT

=1270     ;
                   =1271 $EJECT
                   =1272
                   =1273 ;******************************
                   =1274 ;INTERRUPT 7.5 FROM 3CH
                   =1275 ;TARGET STROBE FROM HOST
                   =1276 ;******************************
                   =1277 ISRTGT:
                   =1278        ;HOST RECENTLY ENTERED WEIGHT WAS NET TARGET WEIGHT
                   =1279        ;POP IT OFF FIFO AND STICK IT IN THE TARGET WEIGHT VARIABLE
                   =1280        ;
0624 CD1407        =1281        CALL   FSAV
0627 CD3406        =1282        CALL   ID75            ;IDENTIFY WHETHER AUTO OR MANUAL 7.5
062A 217422        =1283        LXI    H,SYSCTL
062D 7E            =1284        MOV    A,M
062E F601          =1285        ORI    TGTON
0630 77            =1286        MOV    M,A
0631 C31907        =1287        JMP    INTR
                   =1288        ;
                   =1289 ;**************
                   =1290 ID75:
                   =1291 ;**************
                   =1292        ;READS SERIAL DATA INPUT LINE OF 8085 PROCESSOR
                   =1293        ;FOR @7MS. IF STATUS OF THIS LINE CHANGES WITIN
                   =1294        ;7MS OF RST7.5, THEN PRESUME AUTOMATIC TARGET STROBE
                   =1295        ;FROM EXTERNAL DEVICE AND SET APPROPRIATE FLAG
                   =1296        ;IF NO CHANGE OF SDI STATUS, THEN ASSUME MANUAL TARGET
                   =1297        ;STROBE FROM TREND TRACKER BUTTON.
                   =1298        ;
0634 20            =1299        DB     RIMB,           ;READ SDI
0635 E680          =1300        ANI    80H
0637 47            =1301        MOV    B,A             ;STASH STATUS IN REGISTER B
                   =1302        ;
0638 219001        =1303        LXI    H,400           ;SET TIMER FOR 7.480MS @ 2.4576MHZ
063B 20            =1304 ID7510: DB    RIMB
063C E680          =1305        ANI    80H
063E B8            =1306        CMP    B               ;STATUS CHANGE?
063F C25106        =1307        JNZ    ID7520          ;IF SO, SET AUTO FLAG AND GET OUT
0642 2B            =1308        DCX    H               ;ELSE, KEEP LOOKING TIL 7MS CONSUMED
0643 7C            =1309        MOV    A,H
0644 B5            =1310        ORA    L
0645 C23B06        =1311        JNZ    ID7510
0648 217422        =1312        LXI    H,SYSCTL
064B 7E            =1313        MOV    A,M
064C E6EF          =1314        ANI    MATGST          ;IDENTIFY MANUAL TARGET STROBE
064E C35706        =1315        JMP    ID7530
0651 217422        =1316 ID7520: LXI   H,SYSCTL
0654 7E            =1317        MOV    A,M
0655 F610          =1318        ORI    AUTGST          ;IDENTIFY AUTOMATIC TARGET STROBE
0657 77            =1319 ID7530: MOV   M,A
0658 C9            =1320        RET
                   =1321 $EJECT
                   =1322 ;*************************************************************
                   =1323 FETGT: ;ROUTINE TO FETCH TARGET WT.
                   =1324        ;IF AUTO, FROM ASCII BUFFER, IF MANUAL FROM REAR OF FIFO
                   =1325 ;*************************************************************
                   =1326        ;
0659 3A7422        =1327        LDA    SYSCTL          ;AUTO OR MANUAL
065C E610          =1328        ANI    AUTGST
065E C20207        =1329        JNZ    AUTFET          ;IF AUTO, NEW WT IS TGT
                   =1330        ;IF MANUAL, FIFO MUST HAVE SOMETHING IN IT
```

| LOC OBJ | LINE | SOURCE STATEMENT | | |
|---|---|---|---|---|
| 0661 3ADC22 | =1331 | LDA | NUMWTS | ;IS FIFO EMPTY? |
| 0664 B7 | =1332 | ORA | A | |
| 0665 C8 | =1333 | RZ | | ;IF SO , IGNORE THIS REQUEST |
| 0666 110020 | =1334 | LXI | D,WTFIFO | ;NO, BACK UP TO MOST RECENT ENTRY |
| 0669 2A5A22 | =1335 | LHLD | REAR | |
| 066C 7C | =1336 | MOV | A,H | ;IF CAN'T BACK UP ANYMORE, THEN WRAPAROUND |
| 066D BA | =1337 | CMP | D | |
| 066E C27C06 | =1338 | JNZ | TGT10 | |
| 0671 7D | =1339 | MOV | A,L | |
| 0672 BB | =1340 | CMP | E | |
| 0673 C27C06 | =1341 | JNZ | TGT10 | |
| 0676 2AE122 | =1342 | LHLD | ENDFIFO | |
| 0679 C38406 | =1343 | JMP | TGT20 | |
| 067C 7D | =1344 TGT10: | MOV | A,L | ;BACK UP BY SUBTRACTING 3 FROM HL PAIR |
| 067D DE06 | =1345 | SBI | 6 | |
| 067F 6F | =1346 | MOV | L,A | |
| 0680 D28406 | =1347 | JNC | TGT20 | |
| 0683 25 | =1348 | DCR | H | |
| 0684 225A22 | =1349 TGT20: | SHLD | REAR | ;ADJUST THE REAR POINTER TO MOST RECENT ENTRY |
| 0687 110500 | =1350 | LXI | D,5 | |
| 068A 19 | =1351 | DAD | D | ;POINT TO EXPONENT OF LAST WEIGHT |
| 068B 11AC22 | =1352 | LXI | D,FPAVG+5 | |
| 068E 018222 | =1353 | LXI | B,FPT1P2+5 | ;DEDUCT OLDEST WEIGHT FROM CURRENT AVG CALCULATION |
| 0691 CD5472 | =1354 | CALL | FSUB | |
| 0694 217D22 | =1355 | LXI | H,FPT1P2 | |
| 0697 11A722 | =1356 | LXI | D,FPAVG | ;PUT RESULT INTO AVERAGE |
| 069A 0E06 | =1357 | MVI | C,6 | |
| 069C CD430C | =1358 | CALL | MXFER | |
| 069F 213322 | =1359 | LXI | H,FPLAST | ;MOVE MOST RECENT ENTRY TO NET WEIGHT FLOAR BUFFER |
| 06A2 119522 | =1360 | LXI | D,FPTGT | |
| 06A5 0E06 | =1361 | MVI | C,6 | |
| 06A7 CD430C | =1362 | CALL | MXFER | |
| 06AA 213C22 | =1363 | LXI | H,NUMWTS | ;DECREMENT THE NUMBER OF WEIGHTS |
| 06AD 35 | =1364 | DCR | M | |
| 06AE AF | =1365 | XRA | A | |
| 06AF 325322 | =1366 | STA | FULLFLAG | ;CLEAR FULL FLAG SINCE FIFO CAN'T BE FULL NOW |
| 06B2 217422 | =1367 TGT30: | LXI | H,SYSCTL | ;TURN TARGET STROBE REQUEST FLAG OFF |
| 06B5 7E | =1368 | MOV | A,M | |
| 06B6 E6FE | =1369 | ANI | TGTOFF | |
| 06B8 77 | =1370 | MOV | M,A | |
| | =1371 | ;NOW UPDATE IMAGE OF TGT WT FOR SETUP MODE | | |
| 06B9 219522 | =1372 | LXI | H,FPTGT | |
| 06BC CD8970 | =1373 | CALL | FLTDEC | |
| 06BF 3A7422 | =1374 | LDA | SYSCTL | |
| 06C2 E608 | =1375 | ANI | OVRNG | |
| 06C4 C2DF06 | =1376 | JNZ | TGTERR | |
| | =1377 | ;REFRESH EEPROM TARGET WT-ALLOW ONLY THE EEPROM VERIFY INTERRUPT | | |
| 06C7 20 | =1378 | DB | RIMB | |
| 06C8 F60F | =1379 | ORI | 0FH | ;MASK ALL OFF-STAEEP CODE WILL ALLOW RST5.5 |
| 06CA 30 | =1380 | DB | SIMB | |
| 06CB FB | =1381 | EI | | |
| 06CC 2AE622 | =1382 | LHLD | EESTDG | |
| 06CF 110910 | =1383 | LXI | D,TGTWT | |
| 06D2 3E04 | =1384 | MVI | A,4 | |
| 06D4 CD9B0C | =1385 | CALL | MXEEP | ;IF WITHIN RANGE, TAKE IT AS NEW TGT WT |
| 06D7 F3 | =1386 | DI | | |
| 06D8 20 | =1387 | DB | RIMB | ;MASK OFF ONLY THE RST5.5 EEPROM VERIFY |
| 06D9 F609 | =1388 | ORI | 09H | |
| 06DB E6F9 | =1389 | ANI | 0F9H | |
| 06DD 30 | =1390 | DB | SIMB | |
| 06DE C9 | =1391 | RET | | |

```
LOC  OBJ          LINE       SOURCE STATEMENT

=1392 TGTERR: ;TARGET WEIGHT JUST RECEIVED IS OUT OF RANGE
06DF 21270D       =1393            LXI      H,TGERR          ;MESSAGE TO USER "OR 2"
06E2 CD180C       =1394            CALL     HSGDSP
06E5 21040D       =1395            LXI      H,BARERR
06E8 CD2B0C       =1396            CALL     LEDDSP
06EB 219522       =1397            LXI      H,FPTGT          ;RESTORE LAST ACCURATE TARGET WT
06EE CD3871       =1398            CALL     INITFLT
06F1 210910       =1399            LXI      H,TGTWT
06F4 119522       =1400            LXI      D,FPTGT
06F7 CD7070       =1401            CALL     DECFLT
06FA 217422       =1402            LXI      H,SYSCTL         ;SET ERROR BIT TO CANCEL REFRESH
06FD 7E           =1403            MOV      A,M
06FE F620         =1404            ORI      NTERON
0700 77           =1405            MOV      M,A
0701 C9           =1406            RET
                  =1407 AUTFET:
                  =1408            ;FETCH TARGET FROM ASCII BUFFER
0702 3ADF22       =1409            LDA      EXPON
0705 326022       =1410            STA      ASCBUF-4
0708 215C22       =1411            LXI      H,ASCBUF
070B 119522       =1412            LXI      D,FPTGT
070E CD4771       =1413            CALL     ASCNFP
0711 C3B206       =1414            JMP      TGT30
                  =1415 $EJECT
                  =1416 ;**********************
                  =1417 RSAV:
                  =1418 ;**********************
                  =1419            ;ROUTINE TO PROTECT REGISTERS WHEN INTERRUPT OCCURS
                  =1420            ;
0714 E3           =1421            XTHL
0715 F5           =1422            PUSH     PSW
0716 C5           =1423            PUSH     B
0717 D5           =1424            PUSH     D
0718 E9           =1425            PCHL
                  =1426            ;
                  =1427 ;**********************
                  =1428 INTR:
                  =1429 ;**********************
                  =1430            ;ROUTINE TO RESTORE REGISTERS AFTER INTERRUPT, ENABLE INTS, AND RETURN
0719 D1           =1431            POP      D
071A C1           =1432            POP      B
071B F1           =1433            POP      PSW
071C E1           =1434            POP      H
071D FB           =1435            EI
071E C9           =1436            RET
                  =1437 $EJECT
                  =1438 ;********************************************************
                  =1439 ;                    *FIFO MANAGEMENT*
                  =1440 ;
                  =1441 ;********************************************************
                  =1442 FIFOINIT:
                  =1443            ;THIS ROUTINE INITIALIZES THE FIFO TO 99 ENTRIES
                  =1444            ;ALL 000. FRONT AND REAR POINT TO FIRST FREE SPACE
                  =1445            ;AND THE COUNTER OF WEIGHTS IN THE FIFO IS SET TO 0.
                  =1446            ;FULLFLAG IS SET TO NULL.
071F 210020       =1447            LXI      H,WTFIFO
0722 225822       =1448            SHLD     FRONT
0725 225A22       =1449            SHLD     REAR             ;FRONT AND REAR ARE SET
0728 015202       =1450            LXI      B,99*6           ;ALL 99 ENTRIES ARE 000
072B CD620C       =1451            CALL     RCLR
072E 21A722       =1452            LXI      H,FPAVG
```

```
LOC  OBJ          LINE          SOURCE STATEMENT 0731 010600       =1453          LXI    B,6
0734 CD620C       =1454          CALL   RCLR         ;REINITIALIZED AVERAGE=0
0737 21D022       =1455          LXI    H,RFPAVG
073A 010600       =1456          LXI    B,6
073D CD620C       =1457          CALL   RCLR         ;ROUNDED AVERAGE INIT TO 0
0740 AF           =1458          XRA    A
0741 32E322       =1459          STA    FULLFLAG
0744 32DC22       =1460          STA    NUMWTS
                  =1461          ;SET ENDFIFO ACCORDING TO CURRENT AVERAGE FACTOR
0747 3A0310       =1462          LDA    AVGFAC       ;WTFIFO +6(AVGFAC-1)=ENDFIFO
074A 3D           =1463          DCR    A            ;AVGFAC-1
074B 6F           =1464          MOV    L,A
074C 2600         =1465          MVI    H,0
074E E5           =1466          PUSH   H
074F D1           =1467          POP    D
0750 19           =1468          DAD    D
0751 19           =1469          DAD    D            ;MULTIPLIED BY 3 .
0752 29           =1470          DAD    H            ;AND THEN DOUBLED FOR MULT BY 6
0753 EB           =1471          XCHG                ;DISPLACEMENT IN DE PAIR
0754 210020       =1472          LXI    H,WTFIFO
0757 19           =1473          DAD    D            ;ADDED TO WTFIFO
0758 22E122       =1474          SHLD   ENDFIFO      ;STASHED IN ENDFIFO
075B 218922       =1475          LXI    H,FPWTS
075E CD3871       =1476          CALL   INITFLT
0761 210310       =1477          LXI    H,AVGFAC     ;AVG FACTOR TO FP FORM
0764 118922       =1478          LXI    D,FPWTS
0767 CD4370       =1479          CALL   BINFLT       ;UPDATE FP IMAGE OF AVERAGE FACTOR
076A C9           =1480          RET
                  =1481          ;
                  =1482  $EJECT
                  =1483  ;***********************************************
                  =1484  INFIFO:
                  =1485          ;THIS ROUTINE PLACES A NEW WEIGHT AT THE REAR
                  =1486          ;OF THE FIFO. IF THE FIFO WAS FULL, IT REMOVES
                  =1487          ;THE OLDEST WEIGHT FROM THE FRONT OF THE FIFO
                  =1488  ;***********************************************
                  =1489          ;
076B 3AE322       =1490          LDA    FULLFLAG     ;IS FIFO FULL?
076E B7           =1491          ORA    A
076F CA7507       =1492          JZ     INF10
0772 CDF907       =1493          CALL   OUTFIFO      ;YES
                  =1494  INF10:
0775 2A5A22       =1495          LHLD   REAR         ;POINT TO REAR OF FIFO
0778 EB           =1496          XCHG
0779 219E22       =1497          LXI    H,INFFLT
077C 0E06         =1498          MVI    C,6
077E CD430C       =1499          CALL   MXFER        ;GET NEW WEIGHT INTO FIFO
                  =1500          ;
0781 2A5A22       =1501          LHLD   REAR         ;IS REAR POINTER AT END OF FIFO?
0784 EB           =1502          XCHG
0785 2AE122       =1503          LHLD   ENDFIFO
0788 7A           =1504          MOV    A,D
0789 BC           =1505          CMP    H
078A C29807       =1506          JNZ    INF20        ;NO
078D 7B           =1507          MOV    A,E
078E BD           =1508          CMP    L
078F C29807       =1509          JNZ    INF20        ;NO
0792 210020       =1510          LXI    H,WTFIFO     ;YES--WRAPAROUND TO START OF FIFO
0795 C39D07       =1511          JMP    INF30
0798 210600       =1512  INF20:  LXI    H,6
079B 19           =1513          DAD    D
```

```
LOC  OBJ       LINE         SOURCE STATEMENT 079C 225A22    =1514 INF30:  SHLD   REAR              ;UPDATE REAR POINTER
079F EB        =1515         XCHG                     ;DE HOLDS IT NOW
07A0 2A5822    =1516         LHLD   FRONT             ;TEST--DOES FRONT=REAR NOW?
07A3 7C        =1517         MOV    A,H
07A4 BA        =1518         CMP    D
07A5 C23207    =1519         JNZ    INF40             ;NO
07A8 7D        =1520         MOV    A,L
07A9 BB        =1521         CMP    E
07AA C23207    =1522         JNZ    INF40             ;NO
07AD 3EFF      =1523         MVI    A,0FFH            ;YES--RAISE FULL FIFO FLAG
07AF 32E322    =1524         STA    FULLFLAG
               =1525 INF40:
07B2 11AC22    =1526         LXI    D,FPAVG+5         ;ADJUST AVERAGE
07B5 21A022    =1527         LXI    H,INFFLT+5
07B8 017C22    =1528         LXI    B,FPTMP1+5
07BB CD0172    =1529         CALL   FADD
07BE 217722    =1530         LXI    H,FPTMP1
07C1 11A722    =1531         LXI    D,FPAVG
07C4 0E06      =1532         MVI    C,6
07C6 CD430C    =1533         CALL   MXFER
07C9 217722    =1534         LXI    H,FPTMP1          ;ROUND AVERAGE
07CC CD8970    =1535         CALL   FLTDEC
07CF 3A7422    =1536         LDA    SYSCTL            ;OVERRANGE ERROR?
07D2 E608      =1537         ANI    OVRNG
07D4 C2E907    =1538         JNZ    INF45
07D7 21EC22    =1539         LXI    H,RFPAVG          ;INTO ROUNDED FLOAT AVERAGE VARIABLE
07DA CD3871    =1540         CALL   INITFLT
07DD 2AE622    =1541         LHLD   FRSTDG            ;VIA DECIMAL IMAGE
07E0 11EC22    =1542         LXI    D,RFPAVG
07E3 CD7070    =1543         CALL   DECFLT
07E6 C3F407    =1544         JMP    INF50
07E9 21A722    =1545 INF45:  LXI    H,FPAVG
07EC 11EC22    =1546         LXI    D,RFPAVG
07EF 0E06      =1547         MVI    C,6
07F1 CD430C    =1548         CALL   MXFER
07F4 21DC22    =1549 INF50:  LXI    H,NUMWTS          ;INCREMENT NUMBER OF WEIGHTS IN FIFO
07F7 34        =1550         INR    M
07F8 C9        =1551         RET
               =1552 $EJECT
               =1553 ;*********************************************************
               =1554 OUTFIFO:
               =1555         ;THIS ROUTINE REMOVES A WEIGHT FROM THE FRONT
               =1556         ;OF THE FIFO, UPDATES POINTERS AND COUNTER
               =1557 ;*********************************************************
               =1558         ;
07F9 21A122    =1559         LXI    H,OTFFLT          ;DESTINATION OF OLDEST WEIGHT
07FC EB        =1560         XCHG
07FD 2A5822    =1561         LHLD   FRONT
0800 0E06      =1562         MVI    C,6
0802 CD430C    =1563         CALL   MXFER
0805 2A5822    =1564         LHLD   FRONT             ;WAS FRONT PTR AT END OF FIFO?
0808 EB        =1565         XCHG
0809 2AE122    =1566         LHLD   ENDFIFO
080C 7C        =1567         MOV    A,H
080D BA        =1568         CMP    D
080E C21008    =1569         JNZ    OTF10             ;NO
0811 7D        =1570         MOV    A,L
0812 BB        =1571         CMP    E
0813 C21008    =1572         JNZ    OTF10             ;NO
0816 210020    =1573         LXI    H,WTFIFO          ;YES--WRAPAROUND
0819 C32008    =1574         JMP    OTF20
```

```
LOC  OBJ          LINE          SOURCE STATEMENT 0810 210600      =1575 UTF10:   LXI    H,6
081F 19          =1576          DAD    D
0820 225822      =1577 UTF20:   SHLD   FRONT              ;UPDATE FRONT PTR
0823 11AC22      =1578          LXI    D,FPAVG+5          ;DEDUCT THE
0826 21A622      =1579          LXI    H,BTFFLT+5         ;OLDEST WEIGHT
0829 018222      =1580          LXI    B,FPTMP2+5         ;TO ADJUST AVERAGE
082C CD6472      =1581          CALL   FSUB
082F 217D22      =1582          LXI    H,FPTMP2
0832 11A722      =1583          LXI    D,FPAVG            ;STORE NEW AVERAGE
0835 0E06        =1584          MVI    C,6
0837 CD430C      =1585          CALL   MXFER
083A 21DC22      =1586          LXI    H,NUMWTS           ;DECREMENT WEIGHT COUNT
083D 35          =1587          DCR    M
083E AF          =1588          XRA    A
083F 32E322      =1589          STA    FULLFLAG           ;FIFO NOT FULL ANYMORE
0842 C9          =1590          RET
                 =1591
                 =1592 $EJECT
                 =1593 $INCLUDE(:F4:SETI1A.TRT)
                 =1594 $EJECT
                 =1595 $TITLE('TREND TRACKER-SETUP MODE, SWITCH INTERFACE')
                 =1596 ;
                 =1597 ;FILE        SETI1A.TRT
                 =1598 ;            STEVEN EHRHARDT          25 MAY 83
                 =1599 ;
                 =1600 $EJECT
                 =1601
                 =1602 ; ****************
                 =1603 ;  SETUP MODE ROUTINES
                 =1604 ; ****************
                 =1605 ;
                 =1606 ;*****************
                 =1607 RDMODSW:
                 =1608 ;*****************
                 =1609        ;RUN READS THE MODE SWITCH TO DETERMINE RUN OR SETUP SELECTION
                 =1610        ;    INPUT: NONE
                 =1611        ;    OUTPUT: REG A = 0 IF SET UP MODE
                 =1612        ;                  = 1 IF RUN MODE
                 =1613
0843 3A0040      =1614          LDA    SWITCHES           ;READ SWITCHES
0846 E620        =1615          ANI    RSSWITCH           ;ISOLATE MODE SWITCH BIT
0848 47          =1616          MOV    B,A                ;STASH IT
0849 0E03        =1617          MVI    C,REPCTR           ;INIT DEBOUNCE REPEAT COUNTER
                 =1618
                 =1619 RDMOD10:
084B 211500      =1620          LXI    H,SWDELAY          ;WAIT 5 MS
084E CD4C0C      =1621          CALL   DELAY              ;
0851 3A0040      =1622          LDA    SWITCHES           ;READ IT AGAIN
0854 E620        =1623          ANI    RSSWITCH           ;
0856 B8          =1624          CMP    B                  ;SAME AS BEFORE
0857 C25F08      =1625          JNZ    RDMOD20            ;NO, RESET REPEAT COUNTER
085A 0D          =1626          DCR    C                  ;YES, 3 IN A ROW YET?
085B C24B08      =1627          JNZ    RDMOD10            ;NO, NOT 3 IN A ROW YET
085E C9          =1628          RET                       ;YES, GOT 3--DEBOUNCED--
                 =1629
                 =1630 RDMOD20:
085F 0E03        =1631          MVI    C,REPCTR           ;START COUNTER OVER AGAIN
0861 47          =1632          MOV    B,A                ;FOR NEW SWITCH POSITION
0862 C34B08      =1633          JMP    RDMOD10            ;
                 =1634
                 =1635 $EJECT
```

| LOC OBJ | LINE | SOURCE STATEMENT | | |
|---|---|---|---|---|
| | =1636 | ;************************************************* | | |
| | =1637 | ; | *RIXSELPAR* | |
| | =1638 | ; | | |
| | =1639 | ;READ THE INCREMENT PARAMETER SELECT SWITCH TO ADVANCE THE DISPLAY | | |
| | =1640 | ;THROUGH THE ENTIRE LIST OF SETUP CHOICES AVAILABLE TO THE USER. | | |
| | =1641 | ; | | |
| | =1642 | ;INPUT NONE, OUTPUT NONE | | |
| | =1643 | ; | | |
| | =1644 | ;************************************************* | | |
| | =1645 | ; | | |
| | =1646 | RIXSELPAR: | | |
| 0865 3A0040 | =1647 | LDA | SWITCHES | ;ISOLATE THE PROPER SWITCH |
| 0868 E602 | =1648 | ANI | IXSPSW | |
| 086A C8 | =1649 | RZ | | ;IF NOT PRESSED, GET OUT |
| | =1650 | ; | | |
| 086B 217422 | =1651 | LXI | H,SYSCTL | ;TURN VALUE SWITCH ON |
| 086E 7E | =1652 | MOV | A,M | |
| 086F F604 | =1653 | ORI | VALON | |
| 0871 77 | =1654 | MOV | M,A | |
| 0872 217522 | =1655 | LXI | H,SELPARCTL | ;FETCH LAST DISPLAYED PARAMETER |
| 0875 7E | =1656 | MOV | A,M | ;SEE IF WRAPAROUND IS NECESSARY |
| 0876 FE09 | =1657 | CPI | PARMCNT-1 | |
| 0878 CA7F08 | =1658 | JZ | IXSP10 | ;IF SO, WRAP AROUND TO ZERO |
| 087B 3C | =1659 | INR | A | ;ELSE, MERELY INCREMENT |
| 087C C38008 | =1660 | JMP | IXSP20 | |
| 087F AF | =1661 | IXSP10: XRA | A | |
| 0880 327522 | =1662 | IXSP20: STA | SELPARCTL | ;STASH IN SELPARCTL |
| 0883 CDAE08 | =1663 | CALL | UPDATPD | ;UPDATE THE PARAMETER DISPLAY AND DELAY |
| 0886 C36508 | =1664 | JMP | RIXSELPAR | ;AND DO IT ALL OVER AGAIN TIL SWITCH OFF |
| | =1665 | $EJECT | | |
| | =1666 | ;************************************************* | | |
| | =1667 | ; | *RDXSELPAR* | |
| | =1668 | ;READ THE DECREMENT PARAMETER SELECT SWITCH AND UPDATE DISPLAY | | |
| | =1669 | ; | | |
| | =1670 | ;INPUT NONE, OUTPUT NONE | | |
| | =1671 | ; | | |
| | =1672 | ;************************************************* | | |
| | =1673 | ; | | |
| | =1674 | RDXSELPAR: | | |
| 0889 3A0040 | =1675 | LDA | SWITCHES | ;ISOLATE PROPER SWITCH |
| 088C E601 | =1676 | ANI | DXSPSW | |
| 088E C8 | =1677 | RZ | | ;RETURN IF NOT PRESSED |
| | =1678 | ; | | |
| 088F 217422 | =1679 | LXI | H,SYSCTL | ;TURN ON VALUE SWITCH |
| 0892 7E | =1680 | MOV | A,M | |
| 0893 F604 | =1681 | ORI | VALON | |
| 0895 77 | =1682 | MOV | M,A | |
| 0896 217522 | =1683 | LXI | H,SELPARCTL | ;FETCH LATEST SELECTED PARM |
| 0899 7E | =1684 | MOV | A,M | |
| 089A FE00 | =1685 | CPI | 0 | ;TIME TO WRAP AROUND? |
| 089C CAA308 | =1686 | JZ | DXSP10 | ;IF SO, GO WRAP AROUND TO LAST PARM |
| 089F 3D | =1687 | DCR | A | ;ELSE, MERELY DECREMENT |
| 08A0 C3A508 | =1688 | JMP | DXSP20 | |
| 08A3 3E09 | =1689 | DXSP10: MVI | A,PARMCNT-1 | |
| 08A5 327522 | =1690 | DXSP20: STA | SELPARCTL | ;STASH IN SELPARCTL |
| 08A8 CDAE08 | =1691 | CALL | UPDATPD | ;DISPLAY NEW PARAMETER |
| 08AB C38908 | =1692 | JMP | RDXSELPAR | ;AND DO IT AGAIN TIL SWITCH OFF |
| | =1693 | | | |
| | =1694 | $EJECT | | |

```
LOC  OBJ        LINE        SOURCE STATEMENT

=1695 ;*********************************************************
            =1696 ;                    *UPDATPD*
            =1697 ;ROUTINE TO UPDATE THE PARAMETER DISPLAY DURING PARAMETER SELECT STEP
            =1698 ; INPUT NONE, OUTPUT NONE
            =1699 ;
            =1700 ;*********************************************************
            =1701 UPDATPD:
08AE CDB808 =1702         CALL    DISELPAR        ;DISPLAY THE SELECTED PARM AT 7SEG
08B1 21FF00 =1703         LXI     H,SLOW          ;FOR .5 SECONDS
08B4 CD4C0C =1704         CALL    DELAY
08B7 C9     =1705         RET
            =1706 ;
            =1707 DISELPAR: ;SUBROUTINE OF UPDATPD
            =1708         ;
08B8 CD6409 =1709         CALL    FNDPRM          ;FIND PARAMETER
08BB 11BC22 =1710         LXI     D,SEGBUF
08BE 0E04   =1711         MVI     C,4
08C0 CD430C =1712         CALL    MCFBR           ;BUFFER IT FOR DISPLAY
08C3 21BC22 =1713         LXI     H,SEGBUF
08C6 CD180C =1714         CALL    MSGDSP          ;DISPLAY PARAMETER
08C9 3A7522 =1715         LDA     SELPARCTL
08CC 57     =1716         MOV     D,A
08CD 3A0110 =1717         LDA     BARCTL          ;CHECK TO SEE IF IT IS ACTIVE PARM
08D0 BA     =1718         CMP     D
08D1 C2D808 =1719         JNZ     DSP10           ;IF NOT ACTIVE BARCTL, CHECK SEGCTL
08D4 CD7109 =1720         CALL    ADDDPS          ;IF ACTIVE BARCTL, SIGNAL WITH DPS
08D7 C9     =1721         RET
08D8 3A0210 =1722 DSP10:  LDA     SEGCTL          ;IS IT ACTIVE SEGCTL
08DB BA     =1723         CMP     D
08DC C2E308 =1724         JNZ     CURP
08DF CD7109 =1725         CALL    ADDDPS
08E2 C9     =1726         RET                     ;DPS, IF ACTIVE, ELSE JUST RETURN
            =1727 ;
            =1728 CURP:                           ;UPDATE CURRENT PARAMETER VALUE
08E3 3E05   =1729         MVI     A,VALIDS-1
08E5 BA     =1730         CMP     D
08E6 D0     =1731         RNC                     ;IF NOT NUMERIC PARAMETER, LEAVE NOW
08E7 3E09   =1732         MVI     A,TGTPOS
08E9 BA     =1733         CMP     D
08EA CA0609 =1734         JZ      UPTGT           ;IF TARGET WEIGHT THEN SPECIAL
08ED 3E07   =1735         MVI     A,DPPOS
08EF BA     =1736         CMP     D               ;AV,SE,OR DP
08F0 CAFC08 =1737         JZ      DPCURP
08F3 DA3509 =1738         JC      UPSEN
08F6 3A0310 =1739         LDA     AVGFAC
08F9 C3FF08 =1740         JMP     CURDUN
08FC 3A0410 =1741 DPCURP: LDA     DPP
08FF 325022 =1742 CURDUN: STA     CURPVAL         ;UPDATE THE CURRENT VALUE
0902 CD7109 =1743         CALL    ADDDPS
0905 C9     =1744         RET
            =1745 $EJECT
            =1746
            =1747 ;******************
            =1748 UPTGT:
            =1749 ;******************
            =1750         ;ROUTINE TO DISPLAY TARGET WEIGHT PARAMETER DURING PARAMETER SELECT
            =1751         ;CAN BE USED FOR OTHER PARAMETERS IN FUTURE
            =1752         ;
0906 21FE01 =1753         LXI     H,SLOW*2        ;LEAVE TARGET MSG UP FOR A BIT
0909 CD4C0C =1754         CALL    DELAY
090C 219522 =1755         LXI     H,FPTGT
```

```
LOC  OBJ         LINE         SOURCE STATEMENT 090F 22C822      =1756        SHLD  UPDFP          ;IDENTIFY RAM FLOAT POINT TO UPDATE
0912 210910      =1757 UPTGTX: LXI  H,TGTWT        ;THEN SHOW CURRENT TGTWT
0915 22C622      =1758        SHLD  UPDAD          ;STASH ADDRESS OF ACTIVE DECIMAL PARM
0918 11C022      =1759        LXI   D,UPDBUF
091B 0E04        =1760        MVI   C,4
091D CD430C      =1761        CALL  MXFER
0920 210910      =1762        LXI   H,TGTWT
0923 11BC22      =1763        LXI   D,SEGBUF
0926 0E04        =1764        MVI   C,4
0928 CDF50C      =1765        CALL  SEGDAT
092B 21BC22      =1766        LXI   H,SEGBUF
092E CD180C      =1767        CALL  MSGDSP
0931 CD7109      =1768        CALL  ADDDPS         ;WITH DPS
0934 C9          =1769        RET
                 =1770 $EJECT
                 =1771 ;******************
                 =1772 UPSEN:
                 =1773 ;******************
                 =1774        ;ROUTINE TO UPDATE SENSITIVITY FACTOR PARAMETER
0935 21FE01      =1775        LXI   H,S_DLY*2      ;LEAVE SENFAC MSG UP FOR A BIT
0938 CD4C0C      =1776        CALL  DELAY
093B 218F22      =1777        LXI   H,FPSEN        ;IDENTIFY RAM FLOAT TO UPDATE
093E 22C822      =1778        SHLD  UPDFP
0941 210510      =1779 UPSENX: LXI  H,SENFAC       ;THEN SHOW CURRENT TGTWT
0944 22C622      =1780        SHLD  UPDAD          ;STASH ADDRESS OF ACTIVE DECIMAL PARM
0947 11C022      =1781        LXI   D,UPDBUF
094A 0E04        =1782        MVI   C,4
094C CD430C      =1783        CALL  MXFER
094F 210510      =1784        LXI   H,SENFAC
0952 11BC22      =1785        LXI   D,SEGBUF
0955 0E04        =1786        MVI   C,4
0957 CDF50C      =1787        CALL  SEGDAT
095A 21BC22      =1788        LXI   H,SEGBUF
095D CD180C      =1789        CALL  MSGDSP
0960 CD7109      =1790        CALL  ADDDPS         ;WITH DPS
0963 C9          =1791        RET
                 =1792 $EJECT
                 =1793 ;**************
                 =1794 FNDPRM:
                 =1795 ;**************
                 =1796        ;ROUTINE TO FIND SELECTED PARAMETER IN THE TABLE
                 =1797        ; INPUT NONE
                 =1798        ; OUTPUT        HL=ADDR OF SELECTED PARM
                 =1799        ;
0964 2100D10     =1800        LXI   H,PARMIDTABLE  ;PTR TO PARAMETER IDENTIFICATION TABLE
0967 3A7522      =1801        LDA   SELPARCTL      ;INDEX TO SELECTED PARM IN THE TABLE
096A 07          =1802        RLC
096B 07          =1803        RLC                  ;PARM ID X4= OFFSET INTO TABLE
096C 4F          =1804        MOV   C,A
096D 0600        =1805        MVI   B,0
096F 09          =1806        DAD   B              ;NOW HL POINTS TO THE PARAMETER
0970 C9          =1807        RET
                 =1808
                 =1809
                 =1810 ;**************
                 =1811 ADDDPS:
                 =1812 ;**************
                 =1813        ;SUBROUTINE OF DISELPAR AND UPDCUR
                 =1814        ;ADDS DEC PTS TO DISPLAY OF ACTIVE PARM
0971 21320D      =1815        LXI   H,DPMOD
0974 CD340C      =1816        CALL  MODDSP
```

```
LOC  OBJ            LINE         SOURCE STATEMENT 0977 21BC22         =1817              LXI     H,BEGBUF
097A CD180C         =1818              CALL    MSGDSP
097D C9             =1819              RET
                    =1820       ;
                    =1821  $EJECT
                    =1822  ;****************************************************
                    =1823  ;                    *RIXVALPAR*
                    =1824  ;
                    =1825  ;ROUTINE TO READ THE INCREMENT VALUE OF PARAMETER SWITCH
                    =1826  ;AND UPDATE ITS DISPLAY AT THE 7 SEGMENT DISPLAY AREA
                    =1827  ;
                    =1828  ;INPUT NONE, OUTPUT NONE
                    =1829  ;
                    =1830  ;****************************************************
                    =1831
                    =1832  RIXVALPAR:
097E 21FF00         =1833              LXI     H,SLOW          ;INIT SWITCH TIMER DELAY
0981 22E422         =1834              SHLD    RATE
0984 3A7422         =1835              LDA     SYSCTL          ;IGNORE IF VALUE SWITCH OFF
0987 E604           =1836              ANI     VALON
0989 C8             =1837              RZ
                    =1841              ;
098A 3A0040         =1838  RIXP10: LDA    SWITCHES         ;ISOLATE PROPER SWITCH
098D E680           =1839              ANI     IXVPSW
098F C8             =1840              RZ                      ;RETURN IF OFF
                    =1841              ;
0990 3A7522         =1842              LDA     SWPARICTL       ;VALID PARM FOR VALUE CHANGE?
0993 FE06           =1843              CPI     VALIDS          ;SOME PARMS DON'T TAKE ARGUMENTS
0995 D8             =1844              RC                      ;IF INVALID, RETURN
                    =1845              ;
0996 FE09           =1846              CPI     TGTPOS
0998 CA3D0B         =1847              JZ      IVTGT           ;IF TARGET WEIGHT, ADD ONE TO TGTWT
099B FE07           =1848              CPI     AVPOS           ;WHICH OF THREE VALID PARMS IS IT?
099D DAA909         =1849              JC      IXVP20          ;ITS AVG FACTOR
09A0 C23009         =1850              JNZ     IVSEN           ;ITS SENS FACTOR
09A3 210003         =1851              LXI     H,DPFLIMS       ;ITS DEC POINT POS--LOAD LIMITS
09A6 C3AC09         =1852              JMP     IXVP40
09A9 210163         =1853  IXVP20: LXI    H,AFLIMS         ;LOAD AVG FACTOR LIMITS
09AC 22CA22         =1854  IXVP40: SHLD   MINMAX           ;STASH THE LIMITS
09AF 3AE022         =1855              LDA     CURPVAL         ;CHECK OUT CURRENT PARAMETER VALUE
09B2 BC             =1856              CMP     H               ;IS IT MAXIMUM OR GREATER THAN MAXIMUM?
09B3 D2BA09         =1857              JNC     IXVP50          ;YES, START OVER AT MINIMUM
09B6 3C             =1858              INR     A               ;NO, JUST INCREMENT
09B7 C3BB09         =1859              JMP     IXVP60
09BA 7D             =1860  IXVP50: MOV    A,L              ;USE MIN
09BB 32E022         =1861  IXVP60: STA    CURPVAL          ;UPDATE THE CURRENT PARAMETER VALUE
09BE CD320A         =1862              CALL    CPVUPD          ;AND THE DISPLAY OF CURRENT PARM VALUE
09C1 2AE422         =1863  IXVP65: LHLD   RATE             ;RETRIEVE TIMER
09C4 B7             =1864              ORA     A               ;CLEAR CARRY
09C5 7D             =1865              MOV     A,L
09C6 DE04           =1866              SBI     04              ;SPEED UP A LITTLE BIT EACH TIME
09C8 6F             =1867              MOV     L,A
09C9 D2CE09         =1868              JNC     IXVP70
09CC 3E01           =1869              MVI     A,1             ;TO A MAXIMUM RATE
09CE 6F             =1870  IXVP70: MOV    L,A
09CF 22E422         =1871              SHLD    RATE
09D2 CD4C0C         =1872              CALL    DELAY
09D5 C38A09         =1873              JMP     RIXP10          ;GO UNTIL USER RELEASES SWITCH
                    =1874              ;
                    =1875  $EJECT
```

```
                =1876 ;************************************************
                =1877 ;                    *RDXVALPAR*
                =1878 ;
                =1879 ;RESPOND TO DECREMENT VALUE OF PARAMETER SWITCH BY DISPLAYING NEW
                =1880 ;VALUE AT 7 SEGMENT DISPLAY AREA AND UPDATING IT IN MEMORY
                =1881 ;
                =1882 ;************************************************
                =1883 RDXVALPAR:
09D8 21FF00     =1884        LXI     H,SLOW
09DB 22E422     =1885        SHLD    RATE            ;INIT SWITCH DELAY TIMER
09DE 3A7422     =1886        LDA     SYSCTL          ;IGNORE IF VALUE SWITCH OFF
09E1 E604       =1887        ANI     VALON
09E3 C8         =1888        RZ
                =1889 RDXP10:
09E4 3A0040     =1890        LDA     SWITCHES        ;ISOLATE PROPER SWITCH
09E7 E640       =1891        ANI     DXVPSW
09E9 C8         =1892        RZ                      ;RETURN IF NOT PRESSED
                =1893
09EA 3A7522     =1894        LDA     SELPARCTL       ;PARAMETER REQUIRES ARGUMENTS?
09ED FE06       =1895        CPI     VALIDS
09EF D0         =1896        RNC                     ;NO, RETURN
                =1897
09F0 FE09       =1898        CPI     TRFUS
09F2 CA4B0B     =1899        JZ     TWTCT            ;IF TARGET WEIGHT GO DECREMENT IT
09F5 FE07       =1900        CPI     DCPUS           ;IS IT AF, SEN OR DP?
09F7 DA030A     =1901        JC      DXVP20          ;ITS AVGFAC
09FA C24B0B     =1902        JNZ     DUSEN           ;ITS SENSFAC
09FD 210003     =1903        LXI     H,DPPLIMS       ;ITS DEC PT POS--LOAD LIMITS
0A00 C3060A     =1904        JMP     DXVP40
0A03 210163     =1905 DXVP20: LXI    H,AFLIMS        ;LOAD AVG FACTOR LIMITS
0A06 22CA22     =1906 DXVP40: SHLD   MINMAX          ;L IS MINIMUM, H IS MAXIMUM
0A09 3AE022     =1907        LDA     CURPVAL
0A0C BD         =1908        CMP     L               ;EQUAL TO MIN
0A0D CA140A     =1909        JZ      DXVP50          ;YES, RESTART AT MAX
0A10 3D         =1910        DCR     A               ;NO, JUST DECREMENT
0A11 C3150A     =1911        JMP     DXVP60
0A14 7C         =1912 DXVP50: MOV    A,H             ;WRAP AROUND
0A15 32E022     =1913 DXVP60: STA    CURPVAL         ;STASH IN CURRENT PARAMETER VALUE
0A18 CD320A     =1914        CALL    CPVUPD          ;UPDATE DISPLAY OF PARM VALUE
0A1B 2AE422     =1915 DXVP65: LHLD   RATE            ;RETRIEVE SWITCH RATE
0A1E B7         =1916        ORA     A               ;CLEAR CARRY
0A1F 7D         =1917        MOV     A,L
0A20 DE04       =1918        SBI     04              ;SPEED UP A LITTLE BIT EACH TIME
0A22 6F         =1919        MOV     L,A
0A23 D2280A     =1920        JNC     DXVP70
0A26 3E01       =1921        MVI     A,1
0A28 6F         =1922 DXVP70: MOV    L,A
0A29 22E422     =1923        SHLD    RATE
0A2C CD4C0C     =1924        CALL    DELAY
0A2F C3E409     =1925        JMP     RDXP10          ;CONTINUE TIL USER RELEASES SWITCH
                =1926        ;
                =1927 $EJECT
                =1928 ;************************************************
                =1929 ;                    *CPVUPD*
                =1930 ;UPDATE DISPLAY OF CURRENT PARAMETER VALUE AT 7 SEGMENT AREA
                =1931 ;
                =1932 ;************************************************
                =1933 CPVUPD:
0A32 21E022     =1934        LXI     H,CURPVAL       ;RETRIEVE VALUE TO DISPLAY
0A35 11C322     =1935        LXI     D,UPDBUF+3      ;TRANSLATE TO UNPACKED DECIMAL
0A38 CD5970     =1936        CALL    BINDEC          ;AND REPLACE IN BUFFER
```

```
LOC  OBJ        LINE         SOURCE STATEMENT

OA3B 210322     =1937         LXI    H,UPDBUF+3        ;START AT LSD
OA3E 0E04       =1938         MVI    C,4
OA40 7E         =1939 CPV10:  MOV    A,M
OA41 CDA60C     =1940         CALL   DTOS              ;DECIMAL TO 7SEGMENT
OA44 77         =1941         MOV    M,A
OA45 2B         =1942         DCX    H
OA46 0D         =1943         DCR    C
OA47 C2400A     =1944         JNZ    CPV10             ;FOR ALL DIGITS
OA4A 3A7522     =1945         LDA    SELPARCTL         ;WHICH PARAMETER IS ON DISPLAY?
OA4D FE07       =1946         CPI    DCPPOS            ;AF,SEN,OR DPP
OA4F DA5E0A     =1947         JC     AVUPD             ;IF AVERAGE, UPDATE AVG FACTOR
OA52 3AC322     =1948         LDA    UPDBUF+3          ;ELSE UPDATE DEC PT POS
OA55 32BF22     =1949         STA    SEGBUF+3
OA58 3A0410     =1950         LDA    DPP
OA5B C36C0A     =1951         JMP    CVP20
OA5E 210222     =1952 AVUPD:  LXI    H,UPDBUF+2
OA61 11BE22     =1953         LXI    D,SEGBUF+2
OA64 0E02       =1954         MVI    C,2
OA66 CD430C     =1955         CALL   MOFER             ;MOVE TWO AV FAC DIGITS TO DISP
OA69 3A0310     =1956         LDA    AVGFAC
OA6C 47         =1957 CVP20:  MOV    B,A
OA6D 3AE022     =1958         LDA    CURVAL            ;IF ACTIVE VALUE=CURRENT VALUE, ADD DPS
OA70 B8         =1959         CMP    B
OA71 F5         =1960         PUSH   PSW
OA72 21BC22     =1961         LXI    H,SEGBUF
OA75 CD180C     =1962         CALL   MSGDSP
OA78 F1         =1963         POP    PSW
OA79 CC7109     =1964         CZ     ADDDPS
OA7C C9         =1965         RET
                =1966         ;
                =1967 $EJECT
                =1968 ;************************************************************
                =1969 ;                   *RDENTER*
                =1970 ;
                =1971 ;ROUTINE TO RESPOND TO ENTER SWITCH AND DIGEST THE NEW PARAMETER INPUT
                =1972 ;
                =1973 ;************************************************************
                =1974 ;
                =1975 RDENTER:
OA7D 3A7422     =1976         LDA    SYSCTL            ;IGNORE IF VALUE SWITCH OFF
OA80 E604       =1977         ANI    VALON
OA82 C8         =1978         RZ
                =1979 ;
OA83 CDC00A     =1980         CALL   DBENTSW           ;DEBOUNCE THE ENTER SWITCH
OA86 B7         =1981         ORA    A
OA87 C8         =1982         RZ                       ;IF NOT PRESSED, RETURN
                =1983         ;
OA88 210108     =1984         LXI    H,BARDYMSG        ;SHOW LEFT HALF ON, RIGHT HALF OFF-BARGRAPH
OA8B CD2B0C     =1985         CALL   LEDDSP
OA8E 212B0D     =1986         LXI    H,BRAMSG
OA91 CD180C     =1987         CALL   MSGDSP            ;BLANK THE 7SEG DISPLAY FOR A BIT
OA94 212F0D     =1988         LXI    H,REVBARDY        ;REVERSE ON/OFF PATTERN OF BARGRAPH
OA97 CD2B0C     =1989         CALL   LEDDSP
OA9A 21FF00     =1990         LXI    H,SLOW            ;.5SECONDS SHOULD DO IT
OA9D CD4C0C     =1991         CALL   DELAY
OAA0 CDDD0A     =1992         CALL   DIGEST            ;ACCEPT THE INPUT TO SYSTEM
OAA3 21010D     =1993         LXI    H,BARDYMSG        ;RESTORE DISPLAYS
OAA6 CD2B0C     =1994         CALL   LEDDSP
OAA9 3A7522     =1995         LDA    SELPARCTL         ;IF TGTWT UPDATED, GUARANTEE
OAAC FE09       =1996         CPI    TGTPOS            ;PROPER DEC PT ON DISPLAY
OAAE CA1209     =1997         JZ     INTGTX
```

| LOC  OBJ | LINE | | SOURCE STATEMENT | |
|---|---|---|---|---|
| 0AB1 FE08 | =1998 | | CPI | SENPOS | ;IF SENPOS UPDATED, GUARANTEE
| 0AB3 CA4109 | =1999 | | JZ | UPSENX | ;ACCURATE DISPLAY
| 0AB6 21BC22 | =2000 | | LXI | H,SEG8UF |
| 0AB9 CD180C | =2001 | | CALL | MSGDSP |
| 0ABC CD7109 | =2002 | | CALL | ADDDPS | ;ADD DPS SINCE THIS IS ACTIVE NOW
| 0ABF C9 | =2003 | | RET | |
| | =2004 | $EJECT | | |
| | =2005 | ;*************** | | |
| | =2006 | DBENTSW: | | |
| | =2007 | ;*************** | | |
| | =2008 | ;ROUTINE TO DEBOUNCE THE ENTER SWITCH | | |
| | =2009 | ; | | |
| 0AC0 3A0040 | =2010 | | LDA | SWITCHES | ;ISOLATE PROPER SWITCH
| 0AC3 E610 | =2011 | | ANI | ENTSW |
| 0AC5 C8 | =2012 | | RZ | | ;RETURN IF NOT PRESSED EVEN ONCE
| 0AC6 47 | =2013 | DBEN10: | MOV | B,A | ;ELSE INITIALIZE STATUS
| 0AC7 0E03 | =2014 | | MVI | C,REPCTR | ;THREE HITS IN A ROW WILL DEBOUNCE
| | =2015 | DBEN20: | | |
| 0AC9 210500 | =2016 | | LXI | H,BUDELAY |
| 0ACC CD4C0C | =2017 | | CALL | DELAY | ;DELAY BETWEEN READS
| 0ACF 3A0040 | =2018 | | LDA | SWITCHES |
| 0AD2 E610 | =2019 | | ANI | ENTSW |
| 0AD4 B8 | =2020 | | CMP | B | ;CHANGED ?
| 0AD5 C2C60A | =2021 | | JNZ | DBEN10 | ;IF SO, BEGIN AGAIN
| 0AD8 0D | =2022 | | DCR | C |
| 0AD9 C2C90A | =2023 | | JNZ | DBEN20 | ;OTHERWISE COUNT TIL THREE IN A ROW
| 0ADC C9 | =2024 | | RET | |
| | =2025 | ; | | |
| | =2026 | $EJECT | | |
| | =2027 | ;****************************************************** | | |
| | =2028 | ;          *DIGEST* | | |
| | =2029 | ;SUBROUTINE OF RDENTER--IT INTEGRATES NEW INPUT INTO THE SYSTEM | | |
| | =2030 | ;****************************************************** | | |
| | =2031 | ; | | |
| 0ADD 3A7522 | =2032 | DIGEST: | | |
| 0ADD 3A7522 | =2033 | | LDA | SELPARCTL | ;FIRST--WHICH PARAMETER IS BEING UPDATED?
| 0AE0 FE04 | =2034 | | CPI | LASTBG | ;BAR GRAPH, 7SEG, OR OTHER?
| 0AE2 D2EB0A | =2035 | | JNC | DIGSEG | ;ITS EITHER A-SEG OR OTHER
| | =2036 | | | |
| 0AE5 110110 | =2037 | | LXI | D,BARCTL | ;ITS BAR GRAPH
| 0AE8 C3280B | =2038 | | JMP | DIGBAR | ;JUST STASH IT IN BARCTL AND THAT'S IT
| | =2039 | | | |
| | =2040 | DIGSEG: | | |
| 0AEB FE06 | =2041 | | CPI | LAST7S | ;IS IT 7SEG OR OTHER?
| 0AED D2F60A | =2042 | | JNC | DIGOTH | ;ITS OTHER
| 0AF0 110210 | =2043 | | LXI | D,SEGCTL |
| 0AF3 C3280B | =2044 | | JMP | DIG7SG |
| | =2045 | ; | | |
| | =2046 | DIGOTH: | | |
| 0AF6 FE09 | =2047 | | CPI | TGTPOS | ;IS IT TARGET WEIGHT?
| 0AF8 CA970B | =2048 | | JZ | DIGTGT | ;IF SO, DIGEST TARGET WEIGHT
| 0AFB FE08 | =2049 | | CPI | SENPOS | ;IF SENSITIVITY, GO DIGEST IT
| 0AFD CA970B | =2050 | | JZ | DIGSEN |
| 0B00 CD2E0B | =2051 | | CALL | UPDTABLE | ;UPDATE INFO IN PARAMETER_TABLE
| 0B03 FE06 | =2052 | | CPI | AVGPOS |
| 0B05 CA0E0B | =2053 | | JZ | DIGAVG | ;IF AVERAGE
| 0B08 110410 | =2054 | | LXI | D,DPP | ;IF DPP
| 0B0B C3110B | =2055 | | JMP | DIGDUN |
| | =2056 | DIGAVG: | | |
| 0B0E 110310 | =2057 | | LXI | D,AVGPAC |
| 0B11 3AE022 | =2058 | DIGDUN: LDA | | CURPVAL | ;STASH CURRENT PARAMETER VALUE

```
LOC  OBJ       LINE          SOURCE STATEMENT

0B14 4F        =2059 DIGDU2: MOV    C,A
0B15 CD6C0C    =2060         CALL   STAEEP
0B18 CD1F07    =2061         CALL   FIFOINIT        ;NEW DPP OR NEW AVGFAC REQUIRES NEW FIFO
0B1B 3A7522    =2062         LDA    SELPARCTL
0B1E FE07      =2063         CPI    DCPPOS          ;IS IT DEC PT POS
0B20 C0        =2064         RNZ
0B21 CDCE0B    =2065         CALL   UPTG
0B24 CDDE0B    =2066         CALL   UPSN
0B27 C9        =2067         RET
               =2068 DIGBAR:
0B28 3A7522    =2069 DIGTSC: LDA    SELPARCTL
0B2B C3140B    =2070         JMP    DIGDU2
               =2071 $EJECT
               =2072 ;************************************************
               =2073 ;                    *UPDTABLE*
               =2074 ;SUBROUTINE OF DIGEST--WRITES NEW VALUES INTO TABLE FOR DISPLAYING
               =2075 ;THE AVERAGE FACTOR, SENSITIVITY FACTOR AND DECIMAL POINT POSITION
               =2076 ;
               =2077 ;INPUT REG A=VALUE TO STASH    OUTPUT REG A UNCHANGED
               =2078 ;************************************************
               =2079 UPDTABLE:
0B2E F5        =2080         PUSH   PSW
0B2F CD6409    =2081         CALL   FNDPR4
0B32 EB        =2082         XCHG
0B33 21BC22    =2083         LXI    H,SEGBUF
0B36 3E04      =2084         MVI    A,4
0B38 CD9B0C    =2085         CALL   MXEEP           ;UPDATE THE TABLE-RIGHT THERE
0B3B F1        =2086         POP    PSW
0B3C C9        =2087         RET
               =2088 $EJECT
               =2089 ;************************************************
               =2090 ;        TARGET WEIGHT/SENSITIVITY FACTOR SECTION
               =2091 ; THIS SECTION HANDLES DISPLAY, UPDATE AND DIGEST FOR VARIABLES
               =2092 ; MAINTAINED IN UNPACKED DECIMAL FORMAT.
               =2093 ;************************************************
               =2094
               =2095 ;********************
               =2096 IVTGT: ;ROUTINE TO INCREMENT TARGET WEIGHT PARAMETER
               =2097 IVSEN: ;AND THE SENSITIVITY FACTOR
               =2098 ;********************
               =2099         ;
0B3D 21C322    =2100         LXI    H,UPDBUF+3
0B40 0E04      =2101         MVI    C,4
0B42 CDB50C    =2102         CALL   IXUPD           ;INCREMENT UNPACKED DECIMAL VALUE
0B45 CD590B    =2103         CALL   DISPUPD         ;DISPLAY UNPACKED DECIMAL VALUE
0B48 C3C109    =2104         JMP    IXUP65          ;FALL IN TO TRACK WITH BINARY PARMS
               =2105         ;
               =2106 ;********************
               =2107 DVTGT:
               =2108         ;DECREMENT THE VALUE OF THE TARGET WEIGHT PARAMETER
               =2109 DVSEN: ;AND THE SENSITIVITY FACTOR
               =2110 ;********************
               =2111         ;
0B4B 21C322    =2112         LXI    H,UPDBUF+3
0B4E 0E04      =2113         MVI    C,4
0B50 CDCF0C    =2114         CALL   DXUPD           ;DECREMENT THE VALUE
0B53 CD590B    =2115         CALL   DISPUPD         ;DISPLAY THE VALUE
0B56 C31B0A    =2116         JMP    DXUP65          ;FALL IN WITH BINARY PARMS
               =2117         ;
               =2118 ;********************
               =2119 DISPUPD:
```

```
LOC  OBJ          LINE         SOURCE STATEMENT

=2120  ;********************
                  =2121         ;DISPLAYS UNPACKED DECIMAL BUFFER AS 7SEGMENT
                  =2122         ;
0B59 21C022       =2123         LXI   H,UPDBUF
0B5C 11BC22       =2124         LXI   D,SEGBUF
0B5F 0E04         =2125         MVI   C,4
0B61 CDF50C       =2126         CALL  SEGDAT
                  =2127         ;ADD DECIMAL POINT IN PROPER POSITION
0B64 CD7D0B       =2128         CALL  DPINTG
                  =2129         ;ADD DECIMAL POINTS IF IT MATCHES CURRENT TARGET WT VALUE
0B67 2AC622       =2130         LHLD  UPDAD
0B6A EB           =2131         XCHG
0B6B 21C022       =2132         LXI   H,UPDBUF
0B6E 0E04         =2133         MVI   C,4
0B70 CDEB0C       =2134         CALL  VERUPD
0B73 CC7109       =2135         CZ    ADDDPS
0B76 21BC22       =2136         LXI   H,SEGBUF
0B79 CD180C       =2137         CALL  MSGDSP
0B7C C9           =2138         RET
                  =2139
                  =2140  ;****************
                  =2141  DPINTG:
                  =2142  ;****************
                  =2143         ;PLACES DECIMAL POINT INTO TARGET WEIGHT IN PROPER POSITION
                  =2144         ;
0B7D 3AC322       =2145         LDA   UPDBUF+3
0B80 0F           =2146         RRC                      ;ISOLATE DP VALUE
0B81 0F           =2147         RRC
0B82 0F           =2148         RRC
0B83 0F           =2149         RRC
0B84 E60F         =2150         ANI   0FH
0B86 21BF22       =2151         LXI   H,SEGBUF+3         ;FIND CORRESPONDING PLACE IN BUFFER
0B89 B7           =2152  DPTGLP: ORA  A
0B8A CA920B       =2153         JZ    DPIN
0B8D 2B           =2154         DCX   H
0B8E 3D           =2155         DCR   A
0B8F C3890B       =2156         JMP   DPTGLP
0B92 7E           =2157  DPIN:  MOV   A,M                ;INSERT DP IN DISPLAY
0B93 E6FE         =2158         ANI   0FEH
0B95 77           =2159         MOV   M,A
0B96 C9           =2160         RET
                  =2161  $EJECT
                  =2162
                  =2163
                  =2164  ;********************
                  =2165  DIGTGT:
                  =2166         ;ROUTINE TO DIGEST THE TARGET WEIGHT PARAMETER
                  =2167  DIGSEN: ;AND THE SENSITIVITY FACTOR
                  =2168  ;********************
                  =2169         ;
0B97 21C022       =2170         LXI   H,UPDBUF           ;NO ZERO ENTRY ALLOWED!!!
0B9A 010400       =2171         LXI   B,0004H            ;B=0, C=4
0B9D 7E           =2172  DTS50: MOV   A,M
0B9E E60F         =2173         ANI   0FH
0BA0 80           =2174         ADD   B
0BA1 C2AF0B       =2175         JNZ   DTS75              ;NOT ZERO? OK, MOVE AHEAD UNCHANGED
0BA4 23           =2176         INX   H
0BA5 47           =2177         MOV   B,A
0BA6 0D           =2178         DCR   C
0BA7 C29D0B       =2179         JNZ   DTS50
0BAA 3E01         =2180         MVI   A,1
```

```
LOC  OBJ          LINE            SOURCE STATEMENT

OBAC 320222       =2181           STA     UPDBUF+2            ;ZERO--FORCE VALUE TO NONZERO
OBAF 21C022       =2182 DTS75:    LXI     H,UPDBUF
OBB2 2AC622       =2183           LHLD    UPDAD
OBB5 EB           =2184           XCHG
OBB6 21C022       =2185           LXI     H,UPDBUF            ;UPDATE DECIMAL IMAGE OF CURRENT VAR
OBB9 3E04         =2186           MVI     A,4
OBBB CD9B0C       =2187           CALL    MKBEP
OBBE 3A7522       =2188           LDA     SELPARCTL           ;WHICH--TARGET OR SENSITIVITY
OBC1 FE08         =2189           CPI     SENPOS
OBC3 CACA0B       =2190           JZ      DTS100              ;ITS SENSITIVITY, SKIP AHEAD
OBC6 CDCE0B       =2191           CALL    UPTG                ;DIGEST TARGET WEIGHT
OBC9 C9           =2192           RET
OBCA CDDE0B       =2193 DTS100:   CALL    UPSN                ;DIGEST SENSITIVITY
OBCD C9           =2194           RET
                  =2195 ;
                  =2196 $EJECT
                  =2197 ;*******************
                  =2198 UPTG:
                  =2199 ;*******************
                  =2200           ;UPDATES TARGET WEIGHT WHEN TARGET WEIGHT IS CHANGED
                  =2201           ;OR WHEN DECIMAL POINT IS CHANGED
                  =2202           ;
                  =2203
OBCE 210910       =2204           LXI     H,TGTWT
OBD1 22C622       =2205           SHLD    UPDAD
OBD4 219522       =2206           LXI     H,FPTGT
OBD7 22C822       =2207           SHLD    UPDFP
OBDA CDEE0B       =2208           CALL    UPDTS
OBDD C9           =2209           RET
                  =2210 ;*******************
                  =2211 UPSN:
                  =2212 ;*******************
                  =2213           ;UPDATES SENSITIVITY WHEN SENSITIVITY IS CHANGED
                  =2214           ;OR WHEN DECIMAL POINT POSITION IS CHANGED
OBDE 210510       =2215           LXI     H,SENPAC
OBE1 22C622       =2216           SHLD    UPDAD
OBE4 218F22       =2217           LXI     H,FPSEN
OBE7 22C822       =2218           SHLD    UPDFP
OBEA CDEE0B       =2219           CALL    UPDTS
OBED C9           =2220           RET
                  =2221 ;
                  =2222 ;*******************
                  =2223 UPDTS:
                  =2224 ;*******************
OBEE 3A0410       =2225           LDA     DPP
OBF1 07           =2226           RLC                         ;MOVE DPP TO HIGH NYBBLE
OBF2 07           =2227           RLC
OBF3 07           =2228           RLC
OBF4 07           =2229           RLC
OBF5 E6F0         =2230           ANI     0F0H
OBF7 57           =2231           MOV     D,A
OBF8 2AC622       =2232           LHLD    UPDAD
OBFB 23           =2233           INX     H
OBFC 23           =2234           INX     H
OBFD 23           =2235           INX     H                   ;POINTER TO LSB
OBFE 7E           =2236           MOV     A,M
OBFF E60F         =2237           ANI     0FH
0C01 B2           =2238           ORA     D
0C02 4F           =2239           MOV     C,A
0C03 EB           =2240           XCHG
0C04 CD6C0C       =2241           CALL    STABEP              ;STUFF IT INTO PLACE
```

```
LOC  OBJ          LINE       SOURCE STATEMENT

=2242          ;THE DECIMAL IMAGE HAS BEEN UPDATED,
                 =2243          ;NOW DO THE FLOATING POINT IMAGE
0C07 2AC822      =2244          LHLD   UPDFP
0C0A CD3871      =2245          CALL   INITFLT
0C0D 2AC822      =2246          LHLD   UPDFP
0C10 EB          =2247          XCHG
0C11 2AC622      =2248          LHLD   UPDAD
0C14 CD7070      =2249          CALL   DECFLT
0C17 C9          =2250          RET
                 =2251  $EJECT
                  2252  $INCLUDE(:F4:GEN1A.TRT)
                 =2253  $EJECT
                 =2254  $TITLE('TREND TRACKER GENERAL SUBROUTINES')
                 =2255  ;
                 =2256  ;FILE   GEN1A.TRT
                 =2257  ;
                 =2258  ;       STEVEN EHRHARDT          25 MAY 83
                 =2259  ;
                 =2260  $EJECT
                 =2261  ;  ****************
                 =2262  ;     GENERAL SUBROUTINES
                 =2263  ;  ****************
                 =2264
                 =2265  ;*******************************************
                 =2266  ;       ------ MSGDSP ------
                 =2267  ;RTN TO PRINT 4 CHAR MSG AT 7 SEG DISPLAY
                 =2268  ;       INPUT: H,L = ADRS OF MSG
                 =2269  ;       OUTPUT: NONE
                 =2270  ;*******************************************
                 =2271
                 =2272  MSGDSP:
0C18 110050      =2273          LXI    D,SEGDSP      ;DESTINATION
0C1B 0E04        =2274          MVI    C,MSGLGTH     ;BYTE COUNT
0C1D CD430C      =2275          CALL   MXFER         ;SHOW IT
0C20 C9          =2276          RET                  ;
                 =2277
                 =2278  ;*******************************************
                 =2279  ;       ---SLOMSG---
                 =2280  ;ROUTINE TO SHOW A MSG FOR AT LEAST .4 SEC
                 =2281  ;
                 =2282  ;       INPUT HL=ADDR OF MSG
                 =2283  ;*******************************************
0C21 CD180C      =2284  SLOMSG: CALL   MSGDSP
0C24 219001      =2285          LXI    H,400
0C27 CD4C0C      =2286          CALL   DELAY
0C2A C9          =2287          RET
                 =2288  ;*******************************************
                 =2289  ;       ------ LEDDSP ------
                 =2290  ;RTN TO DISPLAY A 3 BYTE PATTERN AT BARGRAPH
                 =2291  ;       INPUT: H,L = ADRS OF 3 BYTE PATTERN
                 =2292  ;       OUTPUT: NONE
                 =2293  ;*******************************************
                 =2294
                 =2295  LEDDSP:
0C2B 110450      =2296          LXI    D,BARDSP      ;DESTINATION
0C2E 0E03        =2297          MVI    C,BARLGTH     ;BYTE COUNT
0C30 CD430C      =2298          CALL   MXFER         ;SHOW IT
0C33 C9          =2299          RET                  ;
                 =2300
                 =2301  ;*******************************************
                 =2302  ;       ------ MODDSP ------
```

```
                =2303 ;RTN TO REFRESH A PORTIN OF 7 SEG DISPLAY
                =2304 ;      INPUT: H,L = ADRS OF 4 BYTE MODIFY PATTERN
                =2305 ;      OUTPUT: NONE
                =2306 ;*************************************************
                =2307
                =2308 MODDSP:
0C34 11BC22     =2309           LXI     D,SEGBUF        ;DESTINATION
0C37 0E04       =2310           MVI     C,4             ;BYTE COUNT
                =2311 MODLP:
0C39 1A         =2312           LDAX    D               ;FETCH CURRENT DISPLAY BYTE
0C3A A6         =2313           ANA     M               ;MODIFY/REFRESH IT
0C3B 12         =2314           STAX    D               ;STORE IT IN DISPLAY
0C3C 23         =2315           INX     H               ;NEXT DISPLAY BYTE
0C3D 13         =2316           INX     D               ;NEXT MOD/REF BYTE
0C3E 0D         =2317           DCR     C               ;COUNT EM TIL DONE
0C3F C2390C     =2318           JNZ     MODLP           ;
0C42 C9         =2319           RET                     ;THAT'S ALL
                =2320
                =2321 $EJECT
                =2322 ;*************************************************
                =2323 ;      ------ MXFER ------
                =2324 ;RTN OT MOVE REGC BYTES FROM PTR HL TO PTR DE
                =2325 ;i.e. BLOCK MEMORY TRANSFER
                =2326 ;      INPUT: HL = ADRS SOURCE
                =2327 ;             DE = ADRS DESTINATION
                =2328 ;             C  = BYTE COUNT
                =2329 ;*************************************************
                =2330
                =2331 MXFER:
0C43 7E         =2332           MOV     A,M             ;FETCH FROM SOURCE
0C44 12         =2333           STAX    D               ;STORE AT DESTINATION
0C45 23         =2334           INX     H               ;MOVE TO NEXT SOURCE
0C46 13         =2335           INX     D               ;MOVE TO NEXT DEST
0C47 0D         =2336           DCR     C               ;COUNT EM TIL DONE
0C48 C2430C     =2337           JNZ     MXFER           ;
0C4B C9         =2338           RET                     ;THAT'S ALL
                =2339
                =2340 ;*************************************************
                =2341 ;      ------ DELAY ------
                =2342 ;IDLE LOOP DELAYS PROCESSING FOR (REG HL) MILLISECONDS
                =2343 ;      INPUT: HL = # OF MILLISECONDS DELAY WANTED
                =2344 ;      OUTPUT: NONE
                =2345 ;      ALL REGISTERS PROTECTED EXCEPT H,L
                =2346 ;*************************************************
                =2347 DELAY:
0C4C C5         =2348           PUSH    B               ;PROTECT REGISTERS
0C4D D5         =2349           PUSH    D               ;
0C4E F5         =2350           PUSH    PSW             ;
                =2351
                =2352 DEL10:
0C4F 1647       =2353           MVI     D,71            ;
0C51 15         =2354 DEL20:    DCR     D               ;@ 10 MICROSECOND LOOP EXECUTED
0C52 320060     =2355           STA     WDTMR           ;START WATCHDOG TIMER HERE
0C55 C2510C     =2356           JNZ     DEL20           ;GIVING A DELAY OF (HL) mS(+ OVERHEAD)
0C58 2B         =2357           DCX     H               ;COUNT ITERATIONS REQUESTED BY HL PAIR
0C59 7D         =2358           MOV     A,L             ;
0C5A B4         =2359           ORA     H               ;
0C5B C24F0C     =2360           JNZ     DEL10           ;TIL DELAY IS OVER
                =2361
0C5E F1         =2362           POP     PSW             ;THEN RESTORE ALL REGISTERS
0C5F D1         =2363           POP     D               ;
```

```
LOC  OBJ       LINE        SOURCE STATEMENT

0C60 C1        =2364           POP    B          ;
0C61 C9        =2365           RET               ;
               =2366  $EJECT
               =2367  ;************************************************
               =2368  ;            *RCLR*
               =2369  ;ROUTINE TO CLEAR A SWATH OF RAM
               =2370  ;
               =2371  ;INPUT HL=ADDRESS, BC=NUMBYTES TO CLEAR
               =2372  ;
               =2373  ;************************************************
               =2374  RCLR:
0C62 AF        =2375           XRA    A
0C63 77        =2376           MOV    M,A
0C64 23        =2377           INX    H
0C65 0B        =2378           DCX    B
0C66 78        =2379           MOV    A,B
0C67 B1        =2380           ORA    C
0C68 C2620C    =2381           JNZ    RCLR
0C6B C9        =2382           RET
               =2383  ;A
               =2384  $EJECT
               =2385  ;************************************************
               =2386  ;          ------ STAEEP ------
               =2387  ;WRITE TO EEPROM, TICKLE 555 TIMER, SET BUSY FLAG
               =2388  ;       INPUT:  REG C = DATA
               =2389  ;               REG DE= ADRS IN EEPROM TO WRITE TO
               =2390  ;************************************************
               =2391  STAEEP:
0C6C E5        =2392           PUSH   H
0C6D D5        =2393           PUSH   D
0C6E C5        =2394           PUSH   B
0C6F F5        =2395           PUSH   PSW
0C70 1A        =2396           LDAX   D          ;EXAMINE TARGET BYTE IN E2PROM.
0C71 B9        =2397           CMP    C          ;IS IT DIFFERENT FROM THE DESIRED VALUE?
0C72 CA960C    =2398           JZ     STE2PJN    ;NO, RETURN--NO NEED TO GO FURTHER.
0C75 79        =2399           MOV    A,C        ;YES, PROCEED TO WRITE TO E2PROM.
0C76 320D22    =2400           STA    EEPCOPY    ;RECORD BYTE BEING WRITTEN
0C79 EB        =2401           XCHG              ;AND
0C7A 220D22    =2402           SHLD   EEPADD     ;ADDRESS BEING WRITTEN.
0C7D 77        =2403           MOV    M,A        ;WRITE TO E2PROM.
0C7E 20        =2404           DB     RIMB       ;ENABLE E2PROM INT.
0C7F F608      =2405           ORI    08H
0C81 E6FE      =2406           ANI    0FEH
0C83 30        =2407           DB     SIMB
0C84 320060    =2408           STA    WDTMR      ;START WATCHDOG TIMER.
0C87 217422    =2409           LXI    H,SYSCTL
0C8A 7E        =2410           MOV    A,M        ;INDICATE E2PROM BUSY.
0C8B F602      =2411           ORI    E2BUSY
0C8D 77        =2412           MOV    M,A
0C8E 3A7422    =2413  STE2P:   LDA    SYSCTL     ;AND IDLE AWAY THE MILLISECONDS
0C91 E602      =2414           ANI    E2BUSY     ;UNTIL E2PROM IS WRITTEN.
0C93 C28E0C    =2415           JNZ    STE2P
               =2416  STE2PJN:
0C96 F1        =2417           POP    PSW
0C97 C1        =2418           POP    B
0C98 D1        =2419           POP    D
0C99 E1        =2420           POP    H
0C9A C9        =2421           RET
               =2422  ;
               =2423  $EJECT
```

```
LOC  OBJ         LINE         SOURCE STATEMENT

=2424 ;**************************************
                 =2425 ;            *MXEEP*
                 =2426 ;
                 =2427 ;ROUTINE TO MOVE A BLOCK OF DATA TO EEPROM
                 =2428 ;INPUT  HL=SOURCE ADDR
                 =2429 ;       DE=DEST ADDR
                 =2430 ;       A =NUMBYTES
                 =2431 ;OUTPUT NONE
                 =2432 ;**************************************
                 =2433 MXEEP:
0C9B 4E          =2434        MOV    C,M
0C9C CD6D0C      =2435        CALL   STAEEP          ;WRITE ONE BYTE TO EEPROM
0C9F 13          =2436        INX    D
0CA0 23          =2437        INX    H               ;GO TO NEXT BYTE AND SO ON
0CA1 3D          =2438        DCR    A               ;TIL DONE
0CA2 C29B0C      =2439        JNZ    MXEEP
0CA5 C9          =2440        RET
                 =2441 $EJECT
                 =2442
                 =2443 ;**************************************
                 =2444 ;       ------ DTOS ------
                 =2445 ;CONVERT DATA IN ACC TO 7 SEGMENT DISPLAY
                 =2446 ;  BC,DE,HL MAINTAINED
                 =2447 ;**************************************
                 =2448
                 =2449 DTOS:
0CA6 E5          =2450        PUSH   H               ;SAVE HL
0CA7 D5          =2451        PUSH   D               ;SAVE DE
0CA8 E60F        =2452        ANI    0FH             ;GET 7SEG FROM TABLE
0CAA 5F          =2453        MOV    E,A             ;
0CAB 1600        =2454        MVI    D,0             ;
0CAD 21770D      =2455        LXI    H,KDTAB         ;
0CB0 19          =2456        DAD    D               ;
0CB1 7E          =2457        MOV    A,M             ;
0CB2 D1          =2458        POP    D               ;RESTORE DE
0CB3 E1          =2459        POP    H               ;RESTORE HL
0CB4 C9          =2460        RET                    ;
                 =2461
                 =2462 $EJECT
                 =2463 ;**************************************
                 =2464 ;            *IXUPD*
                 =2465 ;ROUTINE TO INCREMENT AN UNPACKED DECIMAL VALUE OF VARIABLE LENGTH
                 =2466 ;PRESERVING THE DECIMALPOINT BIT
                 =2467 ;      INPUT         HL=LSB OF UNP DEC VAR
                 =2468 ;                    C= NUM DIGITS
                 =2469 ;
                 =2470 IXUPD:
0CB5 7E          =2471        MOV    A,M
0CB6 E60F        =2472        ANI    0FH             ;ISOLATE ACTIVE NYBBLE
0CB8 3C          =2473        INR    A
0CB9 FE0A        =2474        CPI    0AH             ;CARRY?
0CBB CAC50C      =2475        JZ     IXCRY
0CBE 47          =2476        MOV    B,A             ;NOCARRY
0CBF 7E          =2477        MOV    A,M
0CC0 E6F0        =2478        ANI    0F0H            ;ERASE OLD NYBBLE
0CC2 B0          =2479        ORA    B
0CC3 77          =2480        MOV    M,A             ;INSERT NEW NYBBLE
0CC4 C9          =2481        RET
                 =2482 IXCRY:
0CC5 7E          =2483        MOV    A,M             ;CARRY
0CC6 E6F0        =2484        ANI    0F0H
```

```
LOC  OBJ        LINE         SOURCE STATEMENT

OCC8 77        =2485         MOV    M,A           ;MAKE NYBBLE A ZERO AND CARRY ONE
OCC9 2B        =2486         DCX    H             ;INTO THE NEXT MSB
CCCA 0D        =2487         DCR    C             ;UNLESS THERE ISN'T ONE
OCCB C2950C    =2488         JNZ    DXUPD
OCCE C9        =2489         RET                  ;IN WHICH CASE GET OUT OF HERE
               =2490         ;
               =2491  $EJECT
               =2492  ;***********************************************
               =2493  ;                 *DXUPD*
               =2494  ;
               =2495  ;ROUTINE TO DECREMENT AN UNPACKED DECIMAL VALUE OF VARIABLE LENGTH
               =2496  ;PRESERVING THE DECIMAL POINT POSITION/.
               =2497  ;
               =2498  ;              INPUT     HL=ADDR OF LSB
               =2499  ;                        C=NUMDIGITS
               =2500  ;
               =2501  DXUPD:
OCCF 7E        =2502         MOV    A,M
CCD0 E60F      =2503         ANI    0FH           ;ISOLATE ACTIVE NYBBLE
OCD2 3D        =2504         DCR    A             ;DECREMENT IT
OCD3 FEFF      =2505         CPI    0FFH          ;WAS IT ZERO?
OCD5 CADFOC    =2506         JZ     DXBRW         ;IF SO, BORROW
OCD8 47        =2507         MOV    B,A           ;NOBORROW
OCD9 7E        =2508         MOV    A,M
CCDA E6F0      =2509         ANI    0F0H          ;DELETE OLD NYBBLE
OCDC B0        =2510         ORA    B
OCDD 77        =2511         MOV    M,A           ;INSERT NEW NYBBLE
OCDE C9        =2512         RET
               =2513  DXBRW:
OCDF 7E        =2514         MOV    A,M           ;MAKE IT A NINE
CCE0 E6F0      =2515         ANI    0F0H
OCE2 F609      =2516         ORI    09H
OCE4 77        =2517         MOV    M,A
OCE5 2B        =2518         DCX    H             ;AND SUBTRACT ONE FROM NEXT MSB
CCE6 0D        =2519         DCR    C             ;UNLESS THERE ISN'T ONE
OCE7 C2CF0C    =2520         JNZ    DXUPD
OCEA C9        =2521         RET                  ;IN WHICH CASE GET OUT OF HERE
               =2522         ;
               =2523  $EJECT
               =2524  ;***********************************************
               =2525  ;                 *VERUPD*
               =2526  ;       COMPARES ONE STRING OF BYTES WITH ANOTHER
               =2527  ;
               =2528  ;       INPUT   HL=ADDR STRING 1
               =2529  ;               DE=ADDR STRING 2
               =2530  ;               C =NUMBYTES
               =2531  ;
               =2532  ;       OUTPUT  ZEROFLAG   HIGH IF STRINGS MATCH
               =2533  ;                          LOW IF STRINGS DIFFERENT
               =2534  ;
               =2535  VERUPD:
OCEB 1A        =2536         LDAX   D
OCEC BE        =2537         CMP    M
OCED C0        =2538         RNZ
OCEE 23        =2539         INX    H
OCEF 13        =2540         INX    D
OCF0 0D        =2541         DCR    C
OCF1 C2EB0C    =2542         JNZ    VERUPD
OCF4 C9        =2543         RET
               =2544  $EJECT
```

```
LOC  OBJ        LINE       SOURCE STATEMENT

=2545
                =2546 ;**********************************************************
                =2547 ;                    *SEGDAT*
                =2548 ;
                =2549 ;BLOCK CONVERSION OF UNPACKED DECIMAL TO 7SEGMENT
                =2550 ;
                =2551 ;      INPUT       HL=ADDR OF SOURCE
                =2552 ;                  DE=ADDR OF 7SEG BUFFER
                =2553 ;                  C= NUM DIGITS
                =2554 ;
                =2555 SEGDAT:
0CF5 7E         =2556           MOV     A,M
0CF6 CDA60C     =2557           CALL    DI7S
0CF9 12         =2558           STAX    D
0CFA 13         =2559           INX     D
0CFB 23         =2560           INX     H
0CFC 0D         =2561           DCR     C
0CFD C2F50C     =2562           JNZ     SEGDAT
0D00 C9         =2563           RET
                =2564 $EJECT
                =2565
                =2566 $EJECT
                 2567 $INCLUDE(:F4:DBTI1A.TXT)
                =2568 $EJECT
                =2569 $TITLE('TREND TRACKER-MESSAGES AND TABLES')
                =2570 ;
                =2571 ;FILE    DBTI1A.TXT
                =2572 ;        STEVEN EHRHARDT       25 MAY 83
                =2573 ;
                =2574 $EJECT
                =2575 ;DEFINED STORAGE FOR TREND TRACKER--MESSAGES AND TABLES
                =2576 ;
0D01 00         =2577 HARDYMSG:    DB    0,0F0H,0FFH   ;LEFT HALF BD IN , RIGHT HALF OFF
0D02 F0         =
0D03 FF         =
0D04 FF         =2578 BARERR:      DB    0FFH,0FFH,0FFH ;ALL ON--CALL ATTENTION TO ERROR
0D05 7F         =
0D06 FF         =
0D07 FF         =2579 RAMOK:       DB    SPC,RL,AU,SPC  ;MEMTEST OK   RAM
0D08 F5         =
0D09 11         =
0D0A FF         =
0D0B 31         =2580 ROM1OK:      DB    PU,RL,DL,S1    ;MEMTEST OK   PROM #1 0 T FFFH
0D0C F5         =
0D0D C5         =
0D0E 9F         =
0D0F 31         =2581 ROM2OK:      DB    PU,RL,DL,S2    ;MEMTEST OK   PROM #2 7000H T 7FFFH
0D10 F5         =
0D11 C5         =
0D12 25         =
0D13 49         =2582 STACOK:      DB    SU,TL,AU,CL    ;MEMTEST OK   STACK AREA OF RAM
0D14 E1         =
0D15 11         =
0D16 E5         =
0D17 91         =2583 RAMER:       DB    HU,FU,SPC,S1   ;MEMERROR HF 1 RAM
0D18 71         =
0D19 FF         =
0D1A 9F         =
0D1B 91         =2584 ROMER:       DB    HU,FU,SPC,S2   ;MEMERROR HF 2 ROM CHKSUM
0D1C 71         =
0D1D FF         =
```

```
LOC OBJ        LINE     SOURCE STATEMENT

CD1E 25        =
0D1F 91        =2555 EEPER:      DB      HU,FU,SPC,S3    ;MEMERROR HF 3 EEPROM FAILURE
0D20 71        =
0D21 FF        =
0D22 0D        =
0D23 C5        =2596 OVRERR:     DB      OL,RL,SPC,S1    ;VALUE FOR 7SEG IS OUT OF BOUNDS
0D24 F5        =
0D25 FF        =
0D26 9F        =
0D27 C5        =2557 TGERR:      DB      OL,RL,SPC,S2    ;VALUE FOR TARGET WT. IS OUT OF BOUNDS
0D28 F5        =
0D29 FF        =
0D2A 25        =
0D2B FF        =2558 ERAMSG:     DB      SPC,SPC,SPC,SPC ;CLEAR ALL SEGS
0D2C FF        =
0D2D FF        =
0D2E FF        =
0D2F FF        =2589 REVBARDY:   DB      0FFH,0FH,0      ;REVERSE OF BARDY MSG
0D30 0F        =
0D31 00        =
0D32 FE        =2590 DPMOD:      DB      0FEH,0FEH,0FEH,0FEH  ;INSERT DECIMAL POINTS
0D33 FE        =
0D34 FE        =
0D35 FE        =
               =2591 ;
               =2592 ;PIDINT GIVES DEFAULT VALUES FOR DISPLAY TABLE IF EEPROM IS UNINITIALIZED ON STARTUP
0D36 C1        =2593 PIDINT:     DB      BL,GU,AU,EU     ;BGAE
0D37 43        =
0D38 11        =
0D39 61        =
0D3A C1        =2594             DB      BL,GU,AU,PU     ;BGAP
0D3B 43        =
0D3C 11        =
0D3D 31        =
0D3E C1        =2595             DB      BL,GU,DL,EU     ;BGDE
0D3F 43        =
0D40 85        =
0D41 61        =
0D42 C1        =2596             DB      BL,GU,DL,PU     ;BGDP
0D43 43        =
0D44 85        =
0D45 31        =
0D46 49        =2597             DB      SU,EU,GU,AU     ;SEGA
0D47 61        =
0D48 43        =
0D49 11        =
0D4A 49        =2598             DB      SU,EU,GU,DL     ;SEGD
0D4B 61        =
0D4C 43        =
0D4D 85        =
0D4E 10        =2599             DB      10H,70H,S1,S0   ;A.F.10
0D4F 70        =
0D50 9F        =
0D51 03        =
0D52 84        =2600             DB      84H,30H,30H,S0  ;0.P.P.0
0D53 30        =
0D54 30        =
0D55 03        =
0D56 49        =2601             DB      SU,EU,NL,SU     ;SENS
0D57 61        =
0D58 D5        =
```

```
LOC  OBJ         LINE      SOURCE STATEMENT

0D59 49          =
0D5A D5          =2602              DW     NL,TL,GU,TL       ;4TGT
0D5B E1          =
0D5C 43          =
0D5D E1          =
                 =2603 ;
                 =2604 ;PROPTABLE GIVES MULTIPLIERS FOR PROPORTIONAL BAR GRAPH MODES
0D5E 00          =2605 PROPTABLE:   DB     0,1,2,4,7,10,15
0D5F 01          =
0D60 02          =
0D61 04          =
0D62 07          =
0D63 0A          =
0D64 0F          =
0D65 14          =2606              DB     20,30,40,50,75,100
0D66 1E          =
0D67 28          =
0D68 32          =
0D69 4B          =
0D6A 64          =
                 =2607 ;
                 =2608 ;IDCTL GIVES DEFAULT VALUES FOR PARAMETERS IF EEPROM IS UNINITIALIZED ON STARTUP
0D6B 00          =2609 IDCTL:       DB     0,4,10,0
0D6C 04          =
0D6D 0A          =
0D6E 00          =
0D6F 00          =2610              DB     0,0,1,0
0D70 00          =
0D71 01          =
0D72 00          =
0D73 00          =2611              DB     0,1,0,0
0D74 01          =
0D75 00          =
0D76 00          =
                 =2612 ;
                 =2613 ;KDTABLE GIVES 7 SEG IMAGES OF DECIMAL DIGITS
0D77 03          =2614 KDTAB:       DB     000H      ;DISPLAYCHAR=   0
0D78 9F          =2615              DB     009FH     ;              1
0D79 25          =2616              DB     0025H     ;              2
0D7A 0D          =2617              DB     000DH     ;              3
0D7B 99          =2618              DB     0099H     ;              4
0D7C 49          =2619              DB     0049H     ;              5
0D7D 41          =2620              DB     0041H     ;              6
0D7E 1F          =2621              DB     001FH     ;              7
0D7F 01          =2622              DB     0001H     ;              8
0D80 19          =2623              DB     0019H     ;              9
0D81 FF          =2624              DB     00FFH     ;              NUL
                 =2625
                 2626 $INCLUDE(:F4:MAT11A.TRT)
                 =2627 $EJECT
                 =2628 $TITLE('FP MATH AND CONVERSION RTNS FOR TRENDTRACKER')
                 =2629 ;    FILE:   MAT11A.TRT
                 =2630 ;    DATE:   25 MAY 83
                 =2631 ;
                 =2632 ;    STEVEN EHRHARDT         E.A.ROMAN
                 =2633 $EJECT
                 =2634 ;****************************************************
                 =2635 ;    MATH & CONVERSION ROUTINES
                 =2636 ;****************************************************
                 =2637 ;****************************************************
```

```
LOC  OBJ        LINE        SOURCE STATEMENT

=2638 ;     SET RAM AREA FOR WORKING STORAGE
                =2639 ;*********************************************
0004            =2640 DIGIT  EQU    4            ;NUMBER OF DIGITS/2
0005            =2641 DIGI1  EQU    DIGIT+1
0006            =2642 DIGI2  EQU    DIGIT+2
0007            =2643 DIGI3  EQU    DIGIT+3
                =2644
2300            =2645 MATRAM EQU    2300H
2300            =2646 DTMP1  EQU    MATRAM
2304            =2647 FTEMP  EQU    DTMP1+DIGIT
230B            =2648 FTEM1  EQU    FTEMP+DIGI3
2310            =2649 EXPTM  EQU    FTEM1+DIGI1
2311            =2650 FTEM2  EQU    EXPTM-1
2317            =2651 STAKA  EQU    FTEM2+DIGI2
2319            =2652 HOLD1  EQU    STAKA+2
231E            =2653 HOLD2  EQU    HOLD1+DIGI1
2323            =2654 HOLD3  EQU    HOLD2+DIGI1
2328            =2655 HOLD4  EQU    HOLD3+DIGI1
232D            =2656 HOLD5  EQU    HOLD4+DIGI1
2332            =2657 HOLD6  EQU    HOLD5+DIGI1
2337            =2658 HOLD7  EQU    HOLD6+DIGI1
233C            =2659 HOLD8  EQU    HOLD7+DIGI1
2342            =2660 ERRI   EQU    HOLD8+DIGI2
2344            =2661 BUF    EQU    ERRI+2
2348            =2662 SIGN   EQU    BUF+DIGIT
2349            =2663 EXP    EQU    SIGN+1
234A            =2664 RCTRL  EQU    EXP+1
234B            =2665 RDIGI  EQU    RCTRL+1
231D            =2666 SIGND  EQU    HOLD1+DIGIT
231E            =2667 EXPD   EQU    HOLD1+DIGI1
                =2668 $EJECT
7000            =2669        ORG    7000H
                =2670
                =2671 ;****** PACK ******
                =2672 ;PACKS 4 BYTES OF UNPACKED DECIMAL INTO 2 BYTES PACKED
                =2673 ;
                =2674 ;ENTERS WITH: HL = POINTING TO MSB OF UNPACKED DECIMAL BUFFER
                =2675 ;EXITS WITH:  DE = PACKED DECIMAL VALUE
                =2676
                =2677 PACK:
7000 CD0A70     =2678        CALL   PACK2        ;PACK THE 2 HIGH DIGITS
7003 57         =2679        MOV    D,A          ;INTO REG D
7004 23         =2680        INX    H            ;
7005 CD0A70     =2681        CALL   PACK2        ;PACK THE 2 LOW DIGITS
7008 5F         =2682        MOV    E,A          ;INTO REG E
7009 C9         =2683        RET
                =2684
                =2685
                =2686 ;****** PACK2 ******
                =2687 ;PACKS 2 UNPACKED DECIMAL BYTES INTO 1 PACKED DECIMAL BYTE
                =2688 ;ENTER WITH HL POINTING TO UNPACKED DECIMAL
                =2689 ;EXITS WITH ACC HOLDING PACKED DECIMAL
                =2690
                =2691 PACK2:
700A 7E         =2692        MOV    A,M          ;GRAB HIGH DIGIT
700B CD1570     =2693        CALL   SHFTL        ;MOVE TO HIGH NIBBLE
700E 23         =2694        INX    H            ;
700F 47         =2695        MOV    B,A
7010 3E0F       =2696        MVI    A,0FH
7012 A6         =2697        ANA    M
7013 B0         =2698        ORA    B
```

```
LOC  OBJ        LINE       SOURCE STATEMENT

7014 C9         =2699          RET
                =2700
                =2701
                =2702  ;****** SHIFTL ******
                =2703  ;SHIFTS LOW NIBBLE OF ACC INTO HIGH NIBBLE
                =2704
                =2705  SHIFTL:
7015 17         =2706          RAL
7016 17         =2707          RAL
7017 17         =2708          RAL
7018 17         =2709          RAL
7019 E6F0       =2710          ANI    0F0H
701B C9         =2711          RET
                =2712  $EJECT
                =2713
                =2714
                =2715  ;****** UNPACK ******
                =2716  ;ENTER ACC = 2 PACKED DECIMAL DIGITS
                =2717  ;EXIT  HL = 2 UNPACKED DECIMAL DIGITS
                =2718  ;i.e.  ACC = 42 ON ENTRY
                =2719  ;      HL = 0402 ON EXIT
                =2720
                =2721  UNPACK:
701C 47         =2722          MOV    B,A     ;PROTECT BYTE
701D E60F       =2723          ANI    0FH     ;LOW NIBBLE IS DONE NOW
701F 6F         =2724          MOV    L,A     ;PUT IT IN REG L
7020 78         =2725          MOV    A,B     ;GET THE BYTE
7021 CD2670     =2726          CALL   SHIFTR
7024 67         =2727          MOV    H,A     ;PUT IT IN REG H
7025 C9         =2728          RET            ;
                =2729
                =2730  SHIFTR:
                =2731          ;SHIFTS HIGH NYBBLE OF ACC INTO LOW NYBBLE
7026 1F         =2732          RAR
7027 1F         =2733          RAR
7028 1F         =2734          RAR
7029 1F         =2735          RAR
702A E60F       =2736          ANI    0FH
702C C9         =2737          RET
                =2738  $EJECT
                =2739  ;****** SHLRGT ******
                =2740  ;SHIFTS 16 BITS OF HL
                =2741  ;RIGHTWORD 4 BITS
                =2742  ;ONE NIBBLE ROTATE
                =2743
                =2744  SHLRGT:
702D 0E04       =2745          MVI    C,4     ;BIT COUNTER
702F 97         =2746  SHLR10: SUB    A       ;CLEAR CARRY
7030 7C         =2747          MOV    A,H     ;SHIFT HIGH BYTE
7031 1F         =2748          RAR            ;LOW BIT INTO CARRY
7032 67         =2749          MOV    H,A     ;
7033 7D         =2750          MOV    A,L     ;LOW BYTE SHIFTED RIGHT
7034 1F         =2751          RAR            ;WITH CARRY OUT OF H(B0) TO L(B7)
7035 6F         =2752          MOV    L,A     ;
7036 0D         =2753          DCR    C       ;
7037 C22F70     =2754          JNZ    SHLR10  ;
703A C9         =2755          RET
                =2756
                =2757
                =2758  ;****** FPTRNC ******
                =2759  ;TRUNCATES FP VALUE AFTER 4TH SIGNIFICANT DIGIT
```

```
LOC  OBJ         LINE       SOURCE STATEMENT

=2760  ;ENTER WITH HL POINTING TO FP BUFFER
                 =2761  ;EXITS WITH FP VALUE TRUNCATED AFTER 4TH DIGIT
                 =2762
                 =2763  FPTRUNC:
703B 23          =2764       INX    H       ;
703C 23          =2765       INX    H       ;
703D 3600        =2766       MVI    M,00H   ;
703F 23          =2767       INX    H       ;
7040 3600        =2768       MVI    M,00H   ;
7042 C9          =2769       RET            ;
                 =2770  $EJECT
                 =2771
                 =2772  ;****** BINFLT ******
                 =2773  ;CONVERTS 1 BYTE OF BINARY DATA INTO A
                 =2774  ;6 BYTE NORMALIZED FLOATING POINT VALUE
                 =2775  ;ENTER WITH  HL POINTING TO BINARY VALUE
                 =2776  ;            DE POINTING TO FP APCE ALREADY SET TO: 00 00 00 00 00 84
                 =2777  ;EXITS WITH  FP SPACE PROPERLY FILLED
                 =2778
                 =2779  ;i.e.  BINARY 7 4  =  36 00 00 00 00 82  FP
                 =2780  ;             F P  =  25 50 00 00 00 83
                 =2781
                 =2782  BINFLT:
7043 D5          =2783       PUSH   D               ;PROTECT FP DESTINATION
7044 110323      =2784       LXI    D,DTMP1+3       ;POINT TO TEMP. DECIMAL BUFFER
7047 CD5970      =2785       CALL   BINDEC          ;CONVERT BINARY TO 4 BYTES DECIMAL
704A 210023      =2786       LXI    H,DTMP1         ;INT UNPACKED
704D CD0070      =2787       CALL   PACK            ;PACK IT
7050 E1          =2788       POP    H               ;RETRIEVE FP DESTINATION
7051 72          =2789  DTFEHT: MOV  M,D            ;MOVE 2 HIGH DIGITS IN
7052 23          =2790       INX    H               ;
7053 73          =2791       MOV    M,E             ;MOV 2 LOW DIGITS IN
7054 2B          =2792       DCX    H               ;POINT TO HIGH DIGITS
7055 CD7571      =2793       CALL   FPNOR4          ;NORMALIZE IT!
7058 C9          =2794       RET                    ;
                 =2795  $EJECT
                 =2796  ;****** BINDEC ******
                 =2797  ;CONVERTS 1 BYTE BINARY TO 4 BYTES UNPACKED DECIMAL MSB TO LSB
                 =2798  ;ENTER WITH  HL POINTING TO BINARY BYTE
                 =2799  ;            DE POINTING TO DECIMAL BUFFER'S LSB
                 =2800
                 =2801  BINDEC:
7059 7E          =2802       MOV    A,M             ;FETCH BINARY BYTES
705A 2E02        =2803       MVI    L,3             ;DECIMAL DIGIT COUNTER SET
705C 010A00      =2804  BD05: LXI   B,000AH         ;(B=0, C=10)
705F 91          =2805  BD10: SUB   C               ;DIVIDE BY 10
7060 04          =2806       INR    B               ;
7061 D25F70      =2807       JNC    BD10            ;
7064 81          =2808       ADD    C               ;RESTORE PROPER REMAINDER
7065 05          =2809       DCR    B               ;RESTORE PROPER QUOTIENT
7066 12          =2810       STAX   D               ;STUFF REMAINDER INTO DECIMAL BUFFER
7067 1B          =2811       DCX    D               ;POINTER TO NEXT MOST SIGN. BYTE
7068 78          =2812       MOV    A,B             ;OLD QUOTIENT IS NEW DIVIDEND
7069 2D          =2813       DCR    L               ;3 DIGITS YET?
706A C25C70      =2814       JNZ    BD05            ;NO, GO ON
706D AF          =2815       XRA    A               ;YES, STUFF 00 INTO MSB
706E 12          =2816       STAX   D               ;
706F C9          =2817       RET
                 =2818  $EJECT
                 =2819  ;****** DECFLT ******
                 =2820  ;USED TO CONVERT USER ENTERED NET TARGET WEIGHT TO
```

```
LOC OBJ         LINE        SOURCE STATEMENT

=2821 ;FLOATING POINT. IT USES THE ENTERED DECIMAL POINT POSITION
                =2822 ;TO ADJUST THE EXPONENT.
                =2823 ;CONVERTS 4 BYTES UNPACKED DECIMAL INTO
                =2824 ;6 BYTES NORMALIZED FLOATING POINT
                =2825
                =2826 ;ENTER WITH HL POINTING TO UNPACKED DEC. SOURCE MSB
                =2827 ;           DE POINTING TO FP BUFFER ALREADY SET = 00 00 00 00 00 84
                =2828 ;i.e, 04 03 56 02 = 43 62 00 00 00 84
                =2829
                =2830 DECFLT:
7070 E5         =2831       PUSH    H               ;PROTECT SOURCE ADRS
7071 D5         =2832       PUSH    D               ;PROTECT DESTINATION ADRS
7072 3A0410     =2833       LDA     DPP             ;ADJUST EXPONENT
7075 47         =2834       MOV     B,A             ;ACCORDING TO ENTERED DPP
7076 D1         =2835       POP     D               ;RETRIEVE DESTINATION ADRS
7077 D5         =2836       PUSH    D               ;PROTECT DESTINATION
7078 210500     =2837       LXI     H,5             ;POINT TO EXPONENT
707B 19         =2838       DAD     D               ;WITH HL PAIR
707C 7E         =2839       MOV     A,M             ;FETCH EXPONENT
707D 90         =2840       SUB     B               ;ADJUST IT
707E 77         =2841       MOV     M,A             ;RESTORE IT!
707F D1         =2842       POP     D               ;RETRIEVE DEST ADRS
7080 E1         =2843       POP     H               ;RETRIEVE SOURCE ADRS
7081 D5         =2844       PUSH    D               ;PROTECT DEST
7082 CD0070     =2845       CALL    PACK            ;PACK THE DECIMAL SOURCE
7085 E1         =2846       POP     H               ;RETRIEVE DEST
7086 C35170     =2847       JMP     DTFENT          ;JMP OVER TO 'BINFLT' AREA
                =2848                               ;TO FINISH THE JOB
                =2849 $EJECT
                =2850 ;****** FLTDEC ******
                =2851 ;CONVERTS 6 BYTE NORMALIZED FP TO
                =2852 ;4 BYTE UNPACKED DECIMAL  MSB TO LSB
                =2853 ;EXPONENT OF FP VALUE IS USED TO SET THE DECIMAL POINT
                =2854 ;POSITION(DPP) OF UNPACKED DECIMAL.
                =2855 ;DP POSITION IS IN HIGH NIBBLE OF LSB
                =2856 ;NOT A STRAIGHT CONVERSION ROUTINE--THE ARBITRARY DEC POINT POSITION
                =2857 ;OVERRIDES THAT DERIVED FROM A STRAIGHT AND TRUE FLOAT TO DEC CONVERSION
                =2858 ;
                =2859 ;ENTER WITH HL POINTING TO FLOAT VALUE (6 BYTES)
                =2860 ;           DE POINTING TO DECIMAL BUFFER (4 BYTES)
                =2861 ;EXITS WITH UNPACKED DECIMAL BUFFER SET PROPERLY
                =2862 ;DECBUF CAN'T OVERLAP PAGE BOUNDARY!!!!
                =2863
                =2864 FLTDEC:
7089 E5         =2865       PUSH    H               ;PROTECT ADDR OF FP VALUE
708A 217422     =2866       LXI     H,SYSCTL
708D 7E         =2867       MOV     A,M
708E E6F7       =2868       ANI     INRNG           ;CLEAR OVERRANGE FLAG
7090 77         =2869       MOV     M,A
7091 216422     =2870       LXI     H,DECBUF
7094 011000     =2871       LXI     B,16
7097 CD620C     =2872       CALL    RCLR            ;CLEAR DECIMAL BUFFER
709A 116822     =2873       LXI     D,DECBUF+4      ;LEAVE SOME ZEROES IN FRONT OF DIGIT 1
709D 0E03       =2874       MVI     C,3
709F E1         =2875       POP     H
70A0 E5         =2876       PUSH    H
70A1 E5         =2877 FLDC10: PUSH   H               ;UNPACK 3 BYTES TO 6 DIGITS
70A2 7E         =2878       MOV     A,M
70A3 CD1C70     =2879       CALL    UNPACK
70A6 EB         =2880       XCHG
70A7 72         =2881       MOV     M,D
```

| LOC | OBJ | LINE | | SOURCE STATEMENT | | |
|---|---|---|---|---|---|---|
| 70A8 | 23 | =2882 | | INX | H | |
| 70A9 | 73 | =2883 | | MOV | M,E | |
| 70AA | 23 | =2884 | | INX | H | |
| 70AB | EB | =2885 | | XCHG | | |
| 70AC | E1 | =2886 | | POP | H | |
| 70AD | 23 | =2887 | | INX | H | |
| 70AE | 0D | =2888 | | DCR | C | |
| 70AF | C2A170 | =2889 | | JNZ | FLDC10 | |
| | | =2890 | | ;FINISHED UNPACKING, NOW LOCATE 4 DIGITS OF INTEREST | | |
| 70B2 | E1 | =2891 | | POP | H | |
| 70B3 | E5 | =2892 | | PUSH | H | |
| 70B4 | 110500 | =2893 | | LXI | D,5 | |
| 70B7 | 19 | =2894 | | DAD | D | |
| 70B8 | 116822 | =2895 | | LXI | D,DECBUF+4 | |
| 70BB | 7E | =2896 | | MOV | A,M | ;FETCH THE EXPONENT FROM THE FPVALUE |
| 70BC | 47 | =2897 | | MOV | B,A | ;SAVE IT |
| 70BD | 3E84 | =2898 | | MVI | A,84H | ;84-EXPRESULT-DPP(0???) |
| 70BF | 90 | =2899 | | SUB | B | |
| 70C0 | DA0F71 | =2900 | | JC | FLDC70 | ;AS SOON AS BORROW, THEN OVERRANGE |
| 70C3 | 47 | =2901 | | MOV | B,A | |
| 70C4 | 3A0410 | =2902 | | LDA | DPP | |
| 70C7 | 4F | =2903 | | MOV | C,A | |
| 70C8 | 78 | =2904 | | MOV | A,B | |
| 70C9 | 91 | =2905 | | SUB | C | ;AS SOON AS BORROW, THEN OVERRANGE |
| 70CA | DA0F71 | =2906 | | JC | FLDC70 | |
| 70CD | FE05 | =2907 | | CPI | 5 | ;NO MORE THAN 4 PADDING ZEROES ON LEFT |
| 70CF | DAD470 | =2908 | | JC | FLDC20 | |
| 70D2 | 3E04 | =2909 | | MVI | A,4 | |
| 70D4 | 47 | =2910 | FLDC20: | MOV | B,A | |
| 70D5 | 7B | =2911 | | MOV | A,E | |
| 70D6 | 90 | =2912 | | SUB | B | |
| 70D7 | 5F | =2913 | | MOV | E,A | ;ADJUST POINTER TO FIRST DIGIT OF INTEREST |
| 70D8 | EB | =2914 | FLDC30: | XCHG | | ;POINTER TO FIRST IS HLPAIR |
| 70D9 | 225622 | =2915 | | SHLD | FRSTDG | ;RECORD IT |
| 70DC | 110300 | =2916 | | LXI | D,3 | |
| 70DF | 19 | =2917 | | DAD | D | |
| 70E0 | 22E822 | =2918 | | SHLD | LASTDG | ;AND RECORD LAST, TOO |
| 70E3 | 23 | =2919 | | INX | H | |
| 70E4 | 22EA22 | =2920 | | SHLD | ROUNDG | ;AND THE ROUNDING DIGIT AS WELL |
| 70E7 | 7E | =2921 | FLDC35: | MOV | A,M | |
| 70E8 | FE05 | =2922 | | CPI | 5 | |
| 70EA | DAF570 | =2923 | | JC | FLDC40 | ;IF LESS THAN 5, DONT ROUND UP |
| 70ED | 2AE822 | =2924 | | LHLD | LASTDG | ;ROUND UP THE UNPACKED DECIMAL |
| 70F0 | 0E04 | =2925 | | MVI | C,4 | ;VALUE |
| 70F2 | CDB50C | =2926 | | CALL | IXUPD | |
| 70F5 | E1 | =2927 | FLDC40: | POP | H | |
| 70F6 | 110400 | =2928 | | LXI | D,4 | |
| 70F9 | 19 | =2929 | | DAD | D | |
| 70FA | 7E | =2930 | | MOV | A,M | ;RETRIEVE THE SIGN FROM FP VALUE |
| 70FB | B7 | =2931 | | ORA | A | ;IS IT POS OR NEG |
| 70FC | 2AE822 | =2932 | | LHLD | LASTDG | |
| 70FF | CA0671 | =2933 | | JZ | FLDC50 | ;ITS POS |
| 7102 | 3E80 | =2934 | | MVI | A,80H | |
| 7104 | B6 | =2935 | | ORA | M | |
| 7105 | 77 | =2936 | | MOV | M,A | ;ITS NEG-STUFF A SIGN BIT INTO DEC AREA |
| 7106 | 3A0410 | =2937 | FLDC50: | LDA | DPP | ;NOW DO THE DPP |
| 7109 | CD1570 | =2938 | | CALL | SHIFTL | |
| 710C | B6 | =2939 | | ORA | M | |
| 710D | 77 | =2940 | | MOV | M,A | ;ADD THE DPP TO LAST DIGIT HIGH NYBBLE |
| 710E | C9 | =2941 | | RET | | |
| | | =2942 | | | | |

```
LOC  OBJ         LINE       SOURCE STATEMENT

=2943
                =2944 ;HANDLE OVERRANGE HERE
                =2945 ;TAKE CARE OF OVERRANGE IF ANY EXISTS
710F 216822     =2946 FLDC70: LXI    H,DECBUF+4
7112 22E622     =2947        SHLD   FRSTDG
7115 110300     =2948        LXI    D,3
7118 19         =2949        DAD    D
7119 22E822     =2950        SHLD   LASTDG
711C 23         =2951        INX    H
711D 22EA22     =2952        SHLD   ROUNDG
7120 2AE622     =2953        LHLD   FRSTDG              ;IF OVERRANGE, STUFF 9999
7123 0E04       =2954        MVI    C,4                 ;FROM FIRST DIGIT TO LAST DIGIT
7125 3699       =2955 FLDC80: MVI   M,99H
7127 23         =2956        INX    H
7128 0D         =2957        DCR    C
7129 C22571     =2958        JNZ    FLDC80
712C 3600       =2959        MVI    M,0                 ;ROUNDING DIGIT IS 0 SO 9999 WILL REMAIN UNROUNDED
712E 217422     =2960        LXI    H,SYSCTL
7131 7E         =2961        MOV    A,M
7132 F608       =2962        ORI    OVRNG
7134 77         =2963        MOV    M,A                 ;RAISE OVERRANGE FLAG
7135 C35F70     =2964        JMP    FLDC40
                =2965
                =2966 $EJECT
                =2967 ;****** INITFLT ******
                =2968 ;INITIALIZES A FLOAT BUFFER TO: 00 00 00 00 00 84
                =2969 ;ENTER:  HL POINTING TO FLOATING POINT BUFFER
                =2970
                =2971 INITFLT:
7138 E5         =2972        PUSH   H                   ;
7139 010500     =2973        LXI    B,5                 ;
713C CD620C     =2974        CALL   HCLR                ;FIRST 5 BYTES SET TO 00
713F E1         =2975        POP    H
7140 110500     =2976        LXI    D,5                 ;
7143 19         =2977        DAD    D                   ;
7144 3684       =2978        MVI    M,84H               ;LAST BYTE SET TO 84H
7146 C9         =2979        RET                        ;
                =2980
                =2981 $EJECT
                =2982 ;****** ASCNFP ******
                =2983 ;CONVERTS 5 BYTE ASCII VALUE INTO
                =2984 ;6 BYTE NORMALIZED FLOATING POINT VALUE
                =2985
                =2986 ;ENTER   HL POINTING TO 5 BYTES ASCII DATA
                =2987 ;            453.6 = 34 35 33 36 33
                =2988 ;                    d i g i t s  exp
                =2989 ;        DE = INITIALIZED FP BUFFER COMPRESSED (CALLED 'ASCBUF' = 00 00 00)
                =2990
                =2991 ;EXIT WITH FP BUFFER FILLED      45 36 83
                =2992 ;                                digits exp
                =2993
                =2994 ASCNFP:
7147 E5         =2995        PUSH   H                   ;PROTECT SOURCE
7148 D5         =2996        PUSH   D                   ;PROTECT DEST.
7149 0605       =2997        MVI    B,5                 ;
714B 7E         =2998 ATF10: MOV    A,M                 ;STRIP THE HIGH NIBBLE
714C E60F       =2999        ANI    0FH                 ;FROM THE ASCII BYTES
714E 77         =3000        MOV    M,A                 ;
714F 23         =3001        INX    H                   ;
7150 05         =3002        DCR    B                   ;
7151 C24B71     =3003        JNZ    ATF10               ;
```

```
LOC OBJ         LINE      SOURCE STATEMENT

7154 E1         =3004     POP    H              ;DESTINATION POINTER PLEASE
7155 E5         =3005     PUSH   H              ;THANK YOU
7156 23         =3006     INX    H              ;
7157 23         =3007     INX    H              ;POINT TO 5TH 6TH DIGIT
7158 3600       =3008     MVI    M,0
715A 23         =3009     INX    H              ;7TH 8TH DIGIT
715B 3600       =3010     MVI    M,0
715D 23         =3011     INX    H
715E 23         =3012     INX    H              ;POINT TO EXPONENT
715F 3A6022     =3013     LDA    ASCBUF+4       ;FETCH ASCII EXPONENT
7162 F660       =3014     ORI    60H            ;ADD THE EXPECTED FP '6X' STUFF
7164 77         =3015     MOV    M,A            ;STASH IT IN THE FP BUFFER
7165 D1         =3016     POP    D              ;GET DEST
7166 E1         =3017     POP    H              ;GET SOURCE
7167 D5         =3018     PUSH   D              ;PROTECT DEST
7168 CD9070     =3019     CALL   PACK           ;PACK THE DIGITS
716B E1         =3020     POP    H              ;RETRIEVE DEST
716C E5         =3021     PUSH   H              ;STORE DEST
716D 72         =3022     MOV    M,D            ;STUFF DIGITS (HI 2 DIGITS)
716E 23         =3023     INX    H              ;
716F 73         =3024     MOV    M,E            ;(AND LOW 2 DIGITS)
7170 E1         =3025     POP    H              ;RETRIEVE DEST
7171 CD7571     =3026     CALL   FPNORM         ;NORMALIZE RESULT
7174 C9         =3027     RET                   ;
                =3028 $EJECT
                =3029 ;****** FPNORM ******
                =3030 ;ENTER WITH HL POINTING TO 6 BYTE FP BUFFER
                =3031 ;EXITS WITH THAT FP VALUE NORMALIZED
                =3032 ;VIA "SHIFT LEFT ONE NIBBLE AND DECREMENT THE EXPONENT"
                =3033 ;METHOD UNTIL THE HIGH NIBBLE IS NON-ZERO
                =3034 ;SETS 0 TO  00 00 00 00 00 00
                =3035
                =3036 FPNORM:
7175 E5         =3037     PUSH   H              ;PROTECT ADRS
7176 0600       =3038     MVI    B,0            ;INIT COUNT OF ONE-NIBBLE SHIFTS
7178 7E         =3039     MOV    A,M            ;IS THE VALUE = 0
7179 23         =3040     INX    H              ;
717A B6         =3041     ORA    M              ;
717B 23         =3042     INX    H
717C B6         =3043     ORA    M
717D 23         =3044     INX    H
717E B6         =3045     ORA    M
717F CAAB71     =3046     JZ     NORM40         ;YES = 0, SKIP AHEAD
                =3047
                =3048 NORM10:
7182 E1         =3049     POP    H
7183 E5         =3050     PUSH   H
7184 56         =3051     MOV    D,M            ;HI NYB TO D
7185 23         =3052     INX    H
7186 5E         =3053     MOV    E,M            ;2ND HI NYB TO E
7187 EB         =3054     XCHG                  ;HI NYBS TO HL
7188 7C         =3055     MOV    A,H            ;IS HI NYB NON-ZERO
7189 E6F0       =3056     ANI    0F0H
718B C2A171     =3057     JNZ    NORM30         ;IF NON-ZERO, ITS NORMALIZED
                =3058                           ;NOT NORMALIZED-SHIFT MANTISSA TO THE LEFT
718E CDAD71     =3059     CALL   SHLNYB         ;2 HI DIGITS FIRST
7191 23         =3060     INX    H
7192 23         =3061     INX    H              ;NOW, THE 2 LO DIGITS
7193 56         =3062     MOV    D,M
7194 23         =3063     INX    H
7195 5E         =3064     MOV    E,M
```

```
LOC  OBJ         LINE         SOURCE STATEMENT

7196 EB          =3065        XCHG
7197 CDAD71      =3066        CALL    SHLHFB
719A 2B          =3067        DCX     H           ;MOVE CARRIED DIGIT OUT OF 5TH DIG INTO 4TH DIG
719B B6          =3068        ORA     M
719C 77          =3069        MOV     M,A
719D 04          =3070        INR     B
719E C38271      =3071        JMP     NORM10
                 =3072
71A1 E1          =3073 NORM30: POP    H
71A2 23          =3074        INX     H
71A3 23          =3075        INX     H           ;POINT TO EXPONENT
71A4 23          =3076        INX     H           ;ITS 4 BYTES DOWN THE LINE
71A5 23          =3077        INX     H           ;
71A6 23          =3078        INX     H           ;
71A7 7E          =3079        MOV     A,M         ;DEDUCT # OF SHIFTS
71A8 90          =3080        SUB     B           ;FROM EXPONENT
71A9 77          =3081        MOV     M,A         ;
71AA C9          =3082        RET                 ;THAT IS IT
                 =3083
                 =3084 NORM40:                    ;IT IS ZERO SO WIPE OUT EXPONENT
71AB E1          =3085        POP     H           ;RETRIEVE POINTER TO CLEAN UP STACK
71AC C9          =3086        RET
                 =3087 $EJECT
                 =3088 SHLHFB:
                 =3089        ;SHIFTS VALUE IN HLPAIR LEFT ONE NYBBLE
                 =3090        ;CARRIED NYBBLE IS IN LOW NYB OF REG A
                 =3091        ;ENTERS:
                 =3092        ;       HL=VALUE TO BE SHIFTED
                 =3093        ;       DE=ADDRESS WHERE SHIFTED VALUE IS TO BE REPLACED
                 =3094        ;
                 =3095        ;EXITS:
                 =3096        ;       HL=ADDRESS WHERE SHIFTED VALUE WAS PLACED
                 =3097        ;       DE=VALUE AFTER ITS SHIFTED
                 =3098        ;       A=NYBBLE CARRIED OUT BY SHIFT
                 =3099
71AD 0E04        =3100        MVI     C,4
71AF AF          =3101        XRA     A           ;CLEAR REG A AND CARRY FLAG
                 =3102 SHLH10:
71B0 29          =3103        DAD     H           ;SHIFT ONE BIT
71B1 17          =3104        RAL                 ;CARRY INTO REG A LOW NYBBLE
71B2 0D          =3105        DCR     C           ;4 BITS PER NYBBLE
71B3 C2B071      =3106        JNZ     SHLH10
71B6 EB          =3107        XCHG                ;DE NOW HAS DATA AND HL HAS ADDR FOR LOW BYTE
71B7 73          =3108        MOV     M,E         ;STORE THE SHIFTED BYTES
71B8 2B          =3109        DCX     H
71B9 72          =3110        MOV     M,D
71BA C9          =3111        RET
                 =3112 $EJECT
                 =3113 ;****** FLTINT ******
                 =3114 ;CONVERTS 6 BYTE MFP VALUE TO 1 BINARY INTEGER
                 =3115 ;ENTER  HL POINTING TO 6 BYTE MFP VALUE
                 =3116 ;EXITS  ACC CONTAINING BINARY INTEGER VALUE
                 =3117 ;         BITS 0-6 CONTAIN VALUE 1-100
                 =3118 ;         BIT 7 CONTAINS SIGN  0=POS  1=NEG
                 =3119 ;MINIMUM VALUE RETURNED= +-1   MAXIMUM VALUE RETURNED= +-100
                 =3120
                 =3121 FLTINT:
71BB 0E00        =3122        MVI     C,0         ;INIT INTEGER RESULT = 00
71BD 46          =3123        MOV     B,M         ;FETCH THE 2 DIGITS OF INTEREST
71BE 110400      =3124        LXI     D,4         ;
71C1 19          =3125        DAD     D           ;POINT TO FP SIGN BYTE
```

```
LOC  OBJ        LINE        SOURCE STATEMENT

71C2 7E         =3126          MOV    A,M         ;
71C3 B7         =3127          ORA    A           ;IS IS POSITIVE?
71C4 CAC971     =3128          JZ     FTI10       ;YES
71C7 0E80       =3129          MVI    C,80H       ;NO, CHANGE SIGN OF RESULT NOW
                =3130 FTI10:
71C9 23         =3131          INX    H           ;POINT TO EXPONENT
71CA 7E         =3132          MOV    A,M         ;FETCH IT
71CB FE81       =3133          CPI    81H         ;IF LESS THAN 81H, #IS LESS THAN 1
71CD DAED71     =3134          JC     FTI30       ;  SO USE MINIMUM VALUE
71D0 E607       =3135          ANI    07H         ;ELSE ONLY 3 DIGITS OF INTEREST
71D2 FE03       =3136          CPI    3           ;IS IT > 2?
71D4 D2E871     =3137          JNC    FTI20       ;YES, THEN USE MAXIMUM VALUE
71D7 2600       =3138          MVI    H,0         ;
71D9 68         =3139          MOV    L,B         ;HL = "00,digit,digit"
                =3140 FTI40:
71DA 29         =3141          DAD    H           ;SHIFT OVER 1 DIGIT
71DB 29         =3142          DAD    H           ;
71DC 29         =3143          DAD    H           ;
71DD 29         =3144          DAD    H           ;
71DE 3D         =3145          DCR    A           ;COUNT # OF DIGITS IN THE
71DF C2DA71     =3146          JNZ    FTI40       ;INTEGER PART OF VALUE
71E2 7C         =3147          MOV    A,H         ;VALUE TO ACC
71E3 CDF271     =3148          CALL   DECBIN      ;CONVERT TO BINARY
                =3149 FTI50:
71E6 B1         =3150          ORA    C           ;'OR' IN THE SIGN
71E7 C9         =3151          RET                ;THAT IS IT!!
                =3152 FTI20:
71E8 3E64       =3153          MVI    A,100       ;SET MAXIMUM VALUE
71EA C3E671     =3154          JMP    FTI50       ;GO PUT IN THE SIGN, TOO
                =3155 FTI30:
71ED 3E00       =3156          MVI    A,0         ;SET MINIMUM VALUE
71EF C3E671     =3157          JMP    FTI50       ;GO PUT IN THE SIGN, TOO
                =3158 $EJECT
                =3159 DECBIN: ;CONVERTS VALUE IN REG A FROM PACKED DECIMAL TO BINARY
                =3160        ; DONT TOUCH REGISTER C !!!!
71F2 47         =3161          MOV    B,A         ;PROTECT VALUE
71F3 E60F       =3162          ANI    0FH
71F5 57         =3163          MOV    D,A         ;'ONES' COLUMN INTO REG D FOR NOW
71F6 78         =3164          MOV    A,B         ;RETRIEVE VALUE
71F7 CD2470     =3165          CALL   SHIFTR      ;ISOLATE 'TENS' COLUMN
71FA 87         =3166          ADD    A           ;MULTIPLY BY 10--FIRST X 2
71FB 47         =3167          MOV    B,A         ;SAVE X 2 IN B REG
71FC 87         =3168          ADD    A           ;X 4
71FD 87         =3169          ADD    A           ;X 8
71FE 80         =3170          ADD    B           ;(N X 8)+(N X 2)=(N X 10)
71FF 82         =3171          ADD    D           ;ADD ONES COLUMN TO TENS COLUMN
7200 C9         =3172          RET
                =3173 $EJECT
                =3174 ; *********************
                =3175 ; ** MICROTEC ROUTINES **
                =3176 ; *********************
                =3177
                =3178 ; BASIC FOUR TAKEN FROM "FLOAT.SRC"
                =3179 ; FSQR TAKEN FROM "TRANS.SRC"
                =3180 ; "LINO" MACRO ADDED FOR PL/M LINKAGE
                =3181 ; COMPRESSED SPACES TO TABS.
                =3182 ; CORRECTED BUG IN DIVIDE. EXPONENT UNDERFLOW JUMP INSTEAD OF CALL
                =3183 ; CORRECTED BUG IN DIVIDE. DID NOT UPDATE RESULT IF DIVIDEND=0 (WAS
                =3184 ; FIXED IN PREVIOUS STATISTICS MODULE ALSO)
                =3185 ; CORRECTED BUG IN SQUARE ROOT. DID NOT RESTORE STACK ON ARG=0 EXIT.
                =3186 ; REMOVED JUMP TABLE. "CSEG" INSTEAD MAKES IT RELOCATABLE.
```

```
LOC OBJ     LINE    SOURCE STATEMENT

=3187 ; LIKEWISE VARIABLE STORAGE MADE "DSEG"
=3188 ;*********************************************
=3189 ;
=3190 ;     FLOATING POINT MATH ROUTINES
=3191 ;     COPYRIGHT 1976
=3192 ;     MICROTEC
=3193 ;     990 EAST ARQUES
=3194 ;     SUNNYVALE, CALIFORNIA  94086
=3195 ;
=3196 ;     THIS PROGRAM IS A FOUR FUNCTION FLOATING
=3197 ;     POINT MATCH PACKAGE. EACH FUNCTIONS MAY BE
=3198 ;     EXPRESSED AS (BC) = (DE) $ (HL)  WHERE
=3199 ;
=3200 ;     BC = ADDRESS OF RESULT
=3201 ;     DE = ADDRESS OF 1ST ARGUMENT
=3202 ;     HL = ADDRESS OF SECOND ARGUMENT
=3203 ;     $ IS ONE OF THE FUNCTIONS +,-,*,/.
=3204 ;
=3205 ;     ON ENTRY TO EACH FUNCTION BC,DE,HL SHOULD
=3206 ;     BE SET AS INDICATED ABOVE. ALL ADDRESSES
=3207 ;     ON ENTRY POINT TO THE EXPONENT PART OF THE
=3208 ;     FLOATING POINT NUMBER. EACH FLOATING POINT
=3209 ;     NUMBER CONSISTS OF (2*DIGIT) PACKED
=3210 ;     DECIMAL DIGITS, A SIGN AND A BIASED BINARY
=3211 ;     EXPONENT. THE EXPONENT RANGE IS 10**-127
=3212 ;     TO 10**127. THE NUMBER ZERO IS REPRESENTED
=3213 ;     BY ALL DIGITS 0 AND THE EXPONENT 0. THE
=3214 ;     NUMBERS ARE STORED IN MEMORY AS (DIGIT)
=3215 ;     BYTES OF DECIMAL DIGITS STARTING AT THE LOW
=3216 ;     ORDER ADDRESS FOLLOWED BY THE SIGN AND
=3217 ;     EXPONENT. THE SIGN IS EITHER 0 (POSITIVE)
=3218 ;     OR 1 (NEGATIVE). ALL NUMBERS ARE ASSUMED TO BE
=3219 ;     NORMALIZED. THAT IS EACH VALUE CAN BE
=3220 ;     REPRESENTED AS F**E. WHERE
=3221 ;     .1<=F<1.0
=3222 ;     E IS THE EXPONENT
=3223 ;
=3224 ;     FOR EXAMPLE THE NUMBER 123 REPRESENTED IN
=3225 ;     8 DIGIT FLOATING POINT FORMAT WOULD BE IN
=3226 ;     MEMORY AS (IN HEXADECIMAL)
=3227 ;
=3228 ;     12 30 00 00 00 83
=3229 ;
=3230 ;     THIS IS THUS .123*10**3 AND 10**3 IS REPRESENTED
=3231 ;     AS 83 IN THE EXPONENT FIELD.
=3232 $EJECT
=3233 ;*********************************************
=3234 ; NAME - FADD
=3235 ;
=3236 ; THIS ROUTINE FORMS THE FLOATING POINT SUM OF TWO
=3237 ; ARGUMENTS
=3238 ;
=3239 ; ENTRY PARAMETERS
=3240 ;     B,C  - ADDRESS TO STORE SUM
=3241 ;     D,E  - ADDRESS OF ADDEND
=3242 ;     H,L  - ADDRESS OF AUGEND
=3243 ;
=3244 ; EXIT PARAMETERS
=3245 ;     SUM PLACED IN ADDRESS POINTED TO BY BC ON ENTRY
=3246 ;     ERR1 - SET TO 1 IF SUM EXCEEDED LARGEST VALUE
=3247 ;            SET TO -1 IF SUM IS LESS THAN SMALLEST VALUE
```

| LOC OBJ | LINE | SOURCE STATEMENT | | | |
|---|---|---|---|---|---|
| | =3248 | ; | SET TO 0 IF NO ERROR CONDITIONS | | |
| | =3249 | ; | | | |
| | =3250 | ; REGISTERS DESTROYED | | | |
| | =3251 | ; ALL | | | |
| | =3252 | ;************************************************ | | | |
| | =3253 | | | | |
| 7201 C5 | =3254 | FADD: | PUSH | B | ;SAVE RESULT ADDRESS |
| 7202 CD7C73 | =3255 | | CALL | EXPCK | ;FETCH ARGUMENTS |
| 7205 0E00 | =3256 | | MVI | C,0 | |
| 7207 1B | =3257 | ADSUM: | DCX | D | ;POINT TO EXPONENT |
| 7208 EB | =3258 | | XCHG | | |
| 7209 3A4823 | =3259 | | LDA | SIGN | ;GET SIGN |
| 720C AE | =3260 | | XRA | M | ;FORM SIGN OF RESULT |
| 720D 47 | =3261 | | MOV | B,A | ;SAVE SIGN |
| 720E EB | =3262 | | XCHG | | |
| 720F 1A | =3263 | | LDAX | D | |
| 7210 1B | =3264 | | DCX | D | |
| 7211 A9 | =3265 | | XRA | C | |
| 7212 324823 | =3266 | | STA | SIGN | |
| 7215 214A23 | =3267 | | LXI | H,RCTRL | ;ROUNDING CONTROL FLAG |
| 7218 7E | =3268 | | MOV | A,M | |
| 7219 B7 | =3269 | | ORA | A | |
| 721A 23 | =3270 | | INX | H | |
| 721B 7E | =3271 | | MOV | A,M | ;GET ROUNDING DIGIT |
| 721C CA2372 | =3272 | | JZ | ADS8 | ;DIGIT IN HIGH 4 BITS |
| 721F 07 | =3273 | | RLC | | ;GET LOW 4 BITS |
| 7220 07 | =3274 | | RLC | | |
| 7221 07 | =3275 | | RLC | | |
| 7222 07 | =3276 | | RLC | | |
| 7223 C6B0 | =3277 | ADS8: | ADI | 0B0H | ;FORCE CARRY IF DIGIT > 5 |
| 7225 78 | =3278 | | MOV | A,B | |
| 7226 1F | =3279 | | RAR | | |
| 7227 DA6372 | =3280 | | JC | ADS1 | ;HAVE SUBTRACTION |
| 722A 17 | =3281 | | RAL | | ;RESTORE CARRY |
| 722B CD4272 | =3282 | | CALL | ADDX | ;PERFORM ADDITION |
| 722E D23D72 | =3283 | | JNC | ADS2 | ;DONT HAVE TO NORMALIZE |
| 7231 0604 | =3284 | | MVI | B,4 | |
| 7233 CDE273 | =3285 | | CALL | RIGHT | |
| 7236 214923 | =3286 | | LXI | H,EXP | |
| 7239 34 | =3287 | | INR | M | ;INCREMENT EXPONENT |
| 723A CA2E74 | =3288 | | JZ | OVER | ;HAVE OVERFLOW |
| | =3289 | ; ENTRY POINT TO STORE RESULT | | | |
| 723D C1 | =3290 | ADS2: | POP | B | ;GET RESULTS ADDRESS |
| 723E CD0473 | =3291 | | CALL | STORE | ;SAVE RESULTS |
| 7241 C9 | =3292 | | RET | | |
| | =3293 | ;************************************************ | | | |
| | =3294 | $EJECT | | | |
| | =3295 | ;************************************************ | | | |
| | =3296 | ; NAME - ADD | | | |
| | =3297 | ; | | | |
| | =3298 | ; THIS ROUTINE IS USED TO ADD TWO DIGIT STRINGS OF LENGTH | | | |
| | =3299 | ; (DIGIT) AND STORE THE RESULT. | | | |
| | =3300 | ; | | | |
| | =3301 | ; ENTRY PARAMETERS | | | |
| | =3302 | ;   D,E  - ADDRESS OF ONE STRING | | | |
| | =3303 | ;   BUF  - LOCATION OF SECOND STRING | | | |
| | =3304 | ; | | | |
| | =3305 | ; EXIT PARAMETERS | | | |
| | =3306 | ;   BUF  - SUM OF STRINGS WITH ANY CARRIES IN (BUF-1) | | | |
| | =3307 | ; | | | |
| | =3308 | ; REGISTERS DESTROYED | | | |

```
LOC  OBJ        LINE      SOURCE STATEMENT

=3309 ;   A,B,D,E,H,L
                =3310 ;**********************************************
                =3311
7242 214723     =3312 ADDX:  LXI    H,BUF+DIGIT-1
7245 0604       =3313        MVI    B,DIGIT    ;SET BYTE COUNT
7247 1A         =3314 ADD1:  LDAX   D          ;GET DIGITS
7248 8E         =3315        ADC    M          ;FORM SUM
7249 27         =3316        DAA               ;MAKE DECIMAL
724A 77         =3317        MOV    M,A        ;SAVE RESULT
724B 2B         =3318        DCX    H
724C 1B         =3319        DCX    D
724D 05         =3320        DCR    B
724E C24772     =3321        JNZ    ADD1
7251 D0         =3322        RNC               ;NO CARRY
7252 34         =3323        INR    M          ;INCREMENT CARRY BYTE
7253 C9         =3324        RET
                =3325 ;**********************************************
                =3326 $EJECT
                =3327 ;***********************************************
                =3328 ; NAME - FSUB
                =3329 ;
                =3330 ; THIS ROUTINE FORMS THE FLOATING POINT SUM OF TWO
                =3331 ; ARGUMENTS
                =3332 ;
                =3333 ; ENTRY PARAMETERS
                =3334 ;   B,C  - ADDRESS TO STORE DIFFERENCE
                =3335 ;   D,E  - ADDRESS OF SUBTRAHAND
                =3336 ;   H,L  - ADDRESS OF SUBTRAHEND
                =3337 ; EXIT PARAMETERS
                =3338 ;   DIFFERENCE PLACED IN ADDRESS POINTED TO BY BC ON ENTRY
                =3339 ;   ERRI - SET TO 1 IF DIFFERENCE EXCEEDED LARGEST VALUE
                =3340 ;          SET TO -1 IF DIFFERENCE IS LESS THAN SMALLEST VALUE
                =3341 ;          SET TO 0 IF NO ERROR CONDITIONS
                =3342 ;
                =3343 ; REGISTERS DESTROYED
                =3344 ;   ALL
                =3345 ;***********************************************
                =3346
7254 C5         =3347 FSUB:  PUSH   B          ;SAVE RESULT ADDRESS
7255 CD7C73     =3348        CALL   UNPCK      ;GET ARGUMENTS
7258 3A4823     =3349        LDA    SIGN
725B EE01       =3350        XRI    1          ;COMPLEMENT SIGN
725D 324823     =3351        STA    SIGN
7260 C30772     =3352        JMP    ADSUM
7263 17         =3353 ADS1:  RAL               ;RESTORE CARRY
7264 3F         =3354        CMC               ;COMPLEMENT FOR ROUNDING
7265 CDBA72     =3355        CALL   SUBX       ;SUBTRACT ARGUMENTS
7268 214823     =3356        LXI    H,SIGN
726B DA8272     =3357        JC     ADS4
                =3358 ; SUBTRACTION WAS WRONG DIRECTION - COMPLEMENT RESULT
726E 7E         =3359        MOV    A,M        ;GET SIGN
726F EE01       =3360        XRI    1          ;COMPLEMENT
7271 77         =3361        MOV    M,A        ;RESTORE SIGN
7272 2B         =3362 ADS7:  DCX    H
7273 0604       =3363        MVI    B,DIGIT
7275 3E9A       =3364 ADS3:  MVI    A,9AH      ;GET A DECIMAL 100
7277 9E         =3365        SBB    M          ;COMPLEMENT RESULT
7278 C600       =3366        ADI    0          ;SET PROPER FLAGS
727A 27         =3367        DAA               ;MAKE DECIMAL
727B 77         =3368        MOV    M,A        ;STORE RESULT
727C 2B         =3369        DCX    H
```

```
LOC  OBJ        LINE       SOURCE STATEMENT 727D 05         =3370        DCR    B
727E 3F         =3371        CMC
727F C27572     =3372        JNZ    ADS3
                =3373  ; CHECK IF RESULT IS ZERO
7282 214423     =3374 ADS4:  LXI    H,BUF
7285 010400     =3375        LXI    B,DIGIT
7288 7E         =3376 ADS5:  MOV    A,M           ;GET DIGITS
7289 B7         =3377        ORA    A
728A C29E72     =3378        JNZ    ADS6          ;NON ZERO
728D 23         =3379        INX    H
728E 04         =3380        INR    B
728F 04         =3381        INR    B
7290 0D         =3382        DCR    C
7291 C28872     =3383        JNZ    ADS5
                =3384  ; VALUE IS ZERO - SET EXPONENT TO ZERO
7294 AF         =3385 ADS10: XRA    A             ;GET A ZERO
7295 324923     =3386        STA    EXP           ;SET EXPONENT TO ZERO
7298 324823     =3387        STA    SIGN          ;SET SIGN TO ZERO
729B C33072     =3388        JMP    ADS2
                =3389  ; VALUE IS NON-ZERO - NORMALIZE VALUE
729E FE10       =3390 ADS6:  CPI    10H
72A0 D2A472     =3391        JNC    ADS9
72A3 04         =3392        INR    B
72A4 214923     =3393 ADS9:  LXI    H,EXP
72A7 7E         =3394        MOV    A,M           ;GET EXPONENT
72A8 90         =3395        SUB    B             ;ADJUST EXPONENT
72A9 CA3674     =3396        JZ     UNDER         ;VALUE TOO SMALL
72AC DA3674     =3397        JC     UNDER         ;VALUE TOO SMALL
72AF 77         =3398        MOV    M,A           ;RESTORE EXPONENT
72B0 78         =3399        MOV    A,B           ;GET NORMALIZATION COUNT
72B1 07         =3400        RLC
72B2 07         =3401        RLC
72B3 47         =3402        MOV    B,A
72B4 CD0874     =3403        CALL   LEFT          ;NORMALIZE RESULT
72B7 C33072     =3404        JMP    ADS2          ;STORE RESULT
                =3405  ;************************************************
                =3406  $EJECT
                =3407  ;************************************************
                =3408  ; NAME - SUB
                =3409  ;
                =3410  ; THIS ROUTINE IS USED TO SUBTRACT TWO DIGIT STRINGS OF
                =3411  ; LENGTH (DIGIT) AND STORE THE RESULT
                =3412  ;
                =3413  ; ENTRY PARAMETERS
                =3414  ;   D,E  - ADDRESS OF STRING TO SUBTRACT FROM
                =3415  ;   BUF  - ADDRESS OF STRING TO SUBTRACT
                =3416  ;
                =3417  ; EXIT PARAMETERS
                =3418  ;   BUF  - DIFFERENCE OF STRINGS
                =3419  ;   CARRY - CARRY = 0 IMPLIES STRING IN BUF IS GREATER
                =3420  ;           THAN STRING POINTED TO BY D,E
                =3421  ;
                =3422  ; REGISTERS DESTROYED
                =3423  ;   A,B,D,E,H,L
                =3424  ;************************************************
                =3425
72BA 214723     =3426 SUBX:  LXI    H,BUF+DIGIT-1
72BD 0604       =3427        MVI    B,DIGIT ;NUMBER OF BYTES
72BF 3E99       =3428 SUB1:  MVI    A,99H
72C1 CE00       =3429        ACI    0
72C3 96         =3430        SUB    M
```

```
LOC  OBJ          LINE        SOURCE STATEMENT

72C4 EB          =3431        XCHG
72C5 86          =3432        ADD    M
72C6 27          =3433        DAA                    ;DECIMAL ADJUST
72C7 EB          =3434        XCHG
72C8 77          =3435        MOV    M,A             ;SAVE RESULT
72C9 2B          =3436        DCX    H
72CA 1B          =3437        DCX    D
72CB 05          =3438        DCR    B
72CC C2BF72      =3439        JNZ    SUB1
72CF C9          =3440        RET
                 =3441 ;*******************************************
                 =3442 +EJECT
                 =3443 ;*******************************************
                 =3444 ; NAME - FDIV
                 =3445 ;
                 =3446 ; THIS ROUTINE FORMS THE FLOATING POINT QUOTIENT
                 =3447 ; OF TWO ARGUMENTS
                 =3448 ;
                 =3449 ; ENTRY PARAMETERS
                 =3450 ;   B,C - ADDRESS TO STORE QUOTIENT
                 =3451 ;   D,E - ADDRESS OF DIVIDEND
                 =3452 ;   H,L - ADDRESS OF DIVISOR
                 =3453 ;
                 =3454 ; EXIT PARAMETERS
                 =3455 ;   QUOTIENT PLACED IN ADDRESS POINTED TO BY BC ON ENTRY
                 =3456 ;   ERRI - SET TO 1 IF QUOTIENT EXCEEDS LARGEST VALUE
                 =3457 ;         SET TO 2 IF DIVIDE BY ZERO OCCURS
                 =3458 ;         SET TO -1 IF QUOTIENT IS LESS THAN SMALLEST VALUE
                 =3459 ;         SET TO 0 IF NO ERROR CONDITIONS
                 =3460 ;
                 =3461 ; REGISTERS DESTROYED
                 =3462 ;   ALL
                 =3463 ;*******************************************
                 =3464
72D0 C5          =3465 FDIV:  PUSH   B               ;SAVE RESULT ADDRESS
72D1 7E          =3466        MOV    A,M             ;FETCH DIVISOR EXP
72D2 B7          =3467        ORA    A
72D3 CA3B74      =3468        JZ     DIVZ            ;DIVIDE BY ZERO
72D6 1A          =3469        LDAX   D               ;GET DIVIDEND EXPONENT
72D7 B7          =3470        ORA    A               ; (ZFLAG SET IN WRONG PLACE IN ORIGINAL)
72D8 C2E672      =3471        JNZ    DVDNE0
                 =3472        ;DIVIDEND = 0
                 =3473                               ; CORRECTED BUG HERE, SET RESULT=0
                 =3474                               ; WHEN DIVIDEND=0
72DB C1          =3475        POP    B               ; BC=@RESULT, STACK ALIGNED FOR EXIT.
72DC 2E06        =3476        MVI    L,DIGIT+2       ; L=COUNT
72DE AF          =3477        XRA    A               ; A=0
72DF 02          =3478 DVDEQ0: STAX  B               ; FILL RESULT WITH 0'S
72E0 0B          =3479        DCX    B
72E1 2D          =3480        DCR    L
72E2 C2DF72      =3481        JNZ    DVDEQ0
72E5 C9          =3482        RET                    ; EXIT, FOR DIVIDEND=0
                 =3483 DVDNE0: ; DIVIDEND<>0
72E6 96          =3484        SUB    M               ;FORM EXPONENT (DIVIDEND EXP-DIVISOR EXP)
72E7 DAF072      =3485        JC     DIVUN
72EA FA2E74      =3486        JM     OVER            ;OVERFLOW
72ED C3F372      =3487        JMP    FDI1
72F0 F23674      =3488 DIVUN: JP     UNDER
72F3 C681        =3489 FDI1:  ADI    129             ;FORM QUOTIENT EXP
72F5 321E23      =3490        STA    EXPD            ;SAVE EXPONENT
72F8 EB          =3491        XCHG
```

```
LOC OBJ        LINE       SOURCE STATEMENT

72F9 D5        =3492      PUSH   D
72FA CD8E73    =3493      CALL   LOAD        ;FETCH DIVIDEND
72FD D1        =3494      POP    D
72FE EB        =3495      XCHG
72FF 3A4823    =3496      LDA    SIGN        ;GET SIGN
7302 2B        =3497      DCX    H
7303 AE        =3498      XRA    M           ;FORM QUOTIENT SIGN
7304 321D23    =3499      STA    SIGND       ;STORE SIGN
7307 EB        =3500      XCHG
7308 1B        =3501      DCX    D
7309 011923    =3502      LXI    B,HOLD1
               =3503 ; SEE HOW MANY TIMES DIVISOR GOES INTO DIVIDEND
730C 2E08      =3504 DIV0: MVI   L,DIGIT+DIGIT
730E C5        =3505 DIV1: PUSH  B
730F E5        =3506      PUSH   H
7310 0E00      =3507      MVI    C,0         ;QUOTIENT DIGIT = C
7312 37        =3508 DIV3: STC               ;SET CARRY
7313 214723    =3509      LXI    H,BUF-DIGIT-1
7316 0604      =3510      MVI    B,DIGIT
7318 3E99      =3511 DIV4: MVI   A,99H
731A CE00      =3512      ACI    0
731C EB        =3513      XCHG
731D 96        =3514      SUB    M           ;SUBTRACT DIVISOR
731E EB        =3515      XCHG
731F 86        =3516      ADD    M
7320 27        =3517      DAA                ;MAKE DECIMAL
7321 77        =3518      MOV    M,A         ;SAVE TEMPORARY RESULTS
7322 2B        =3519      DCX    H
7323 1B        =3520      DCX    D
7324 05        =3521      DCR    B
7325 C21873    =3522      JNZ    DIV4
7328 7E        =3523      MOV    A,M         ;PROCESS AND BORROWS
7329 3F        =3524      CMC
732A DE00      =3525      SBI    0
732C 77        =3526      MOV    M,A
732D 1F        =3527      RAR
732E 210400    =3528      LXI    H,DIGIT
7331 19        =3529      DAD    D
7332 EB        =3530      XCHG
7333 0C        =3531      INR    C           ;INCREMENT QUOTIENT
7334 17        =3532      RAL
7335 D21273    =3533      JNC    DIV3
7338 B7        =3534      ORA    A           ;CLEAR CARRY
7339 CD4272    =3535      CALL   ADDX        ;RESTORE DIVIDEND
733C 210400    =3536      LXI    H,DIGIT
733F 19        =3537      DAD    D
7340 EB        =3538      XCHG
7341 C5        =3539      PUSH   B
7342 0604      =3540      MVI    B,4
7344 CD0874    =3541      CALL   LEFT        ;SHIFT DIVIDEND
7347 C1        =3542      POP    B
7348 0D        =3543      DCR    C
7349 E1        =3544      POP    H
734A 61        =3545      MOV    H,C
734B C1        =3546      POP    B
734C 7D        =3547      MOV    A,L
734D C25F73    =3548      JNZ    DIV5
7350 FE08      =3549      CPI    DIGIT+DIGIT
7352 C25F73    =3550      JNZ    DIV5
7355 211E23    =3551      LXI    H,EXPD
7358 35        =3552      DCR    M
```

```
LOC  OBJ        LINE        SOURCE STATEMENT

7359 CA3674    =3553              JZ     UNDER        ; ORIGINAL HAD "CZ". NIRUK BECAUSE EXPONENT
               =3554                                  ; UNDERFLOW NOT LIKELY.
735C C30C73    =3555              JMP    DIV0
735F 1F        =3556 DIV5:        RAR
7360 7C        =3557              MOV    A,H
7361 D26F73    =3558              JNC    DIV6
7364 0A        =3559              LDAX   B
7365 07        =3560              RLC
7366 07        =3561              RLC
7367 07        =3562              RLC
7368 07        =3563              RLC
7369 84        =3564              ADD    H
736A 02        =3565              STAX   B            ;STORE QUOTIENT
736B 03        =3566              INX    B
736C C37073    =3567              JMP    DIV7
736F 02        =3568 DIV6:        STAX   B            ;STORE QUOTIENT
7370 2D        =3569 DIV7:        DCR    L            ;DECREMENT DIGIT COUNT
7371 C20E73    =3570              JNZ    DIV1
7374 211E23    =3571              LXI    H,EXP0
7377 C1        =3572              POP    B
7378 CDD773    =3573              CALL   STORO
737B C9        =3574              RET
               =3575 ;************************************************************
               =3576 $EJECT
               =3577 ;************************************************************
               =3578 ; NAME - EXPCX
               =3579 ;
               =3580 ; THIS ROUTINE IS USED TO ALIGN ARGUMENTS FOR ADDITION
               =3581 ; AND SUBTRACTION.
               =3582 ;
               =3583 ; ENTRY PARAMETERS
               =3584 ;   D,E - ADDRESS OF 1ST ARGUMENT
               =3585 ;   H,L - ADDRESS OF 2ND ARGUMENT
               =3586 ;
               =3587 ; EXIT PARAMETERS
               =3588 ;   C   - IF 1 INDICATES D,E AND H,L WERE SWAPPED
               =3589 ;   D,E - ADDRESS OF LARGER VALUE
               =3590 ;   BUF - CONTAINS SMALLER VALUE INCLUDING SIGN AND EXPONENT
               =3591 ;   RCTRL - ROUNDING CONTROL - INDICATES WHETHER
               =3592 ;           DIGIT TO ROUND IS IN HIGH OR LOW 4 BITS
               =3593 ;   RDIGI - DIGIT TO ROUND
               =3594 ;
               =3595 ; REGISTERS DESTROYED
               =3596 ;   A,D,E,H,L
               =3597 ;************************************************************
               =3598
737C 1A        =3599 EXPCX:       LDAX   D            ;GET EXPONENT
737D 96        =3600              SUB    M            ;DIFFERENCE OF EXPS
737E 0E00      =3601              MVI    C,0
7380 D28773    =3602              JNC    EXPC1        ;DONT SWAP
7383 0C        =3603              INR    C
7384 EB        =3604              XCHG
7385 2F        =3605              CMA
7386 3C        =3606              INR    A
7387 47        =3607 EXPC1:       MOV    B,A
7388 1A        =3608              LDAX   D            ;GET EXPONENT
7389 324923    =3609              STA    EXP          ;SAVE
738C 78        =3610              MOV    A,B
738D FE08      =3611              CPI    DIGIT+DIGIT
738F DA9473    =3612              JC     EXPC2
7392 3E08      =3613              MVI    A,DIGIT+DIGIT
```

```
LOC  OBJ       LINE       SOURCE STATEMENT 7394 07        =3614 EXPC2: RLC
7395 07        =3615        RLC
7396 47        =3616        MOV    B,A
7397 E604      =3617        ANI    4
7399 324A23    =3618        STA    RCTRL        ;SET ROUNDING CONTROL
739C C5        =3619        PUSH   B
739D D5        =3620        PUSH   D
739E CDBE73    =3621        CALL   LOAD         ;LOAD SMALLER VALUE
73A1 3E30      =3622        MVI    A,8*DIGIT+16
73A3 90        =3623        SUB    B
73A4 FE30      =3624        CPI    8*DIGIT+16
73A6 CAB873    =3625        JZ     EXPC3
73A9 E6F8      =3626        ANI    0F8H
73AB 1F        =3627        RAR
73AC 1F        =3628        RAR
73AD 1F        =3629        RAR
73AE 83        =3630        ADD    E
73AF 5F        =3631        MOV    E,A
73B0 7A        =3632        MOV    A,D
73B1 CE00      =3633        ACI    0
73B3 57        =3634        MOV    D,A
73B4 1A        =3635        LDAX   D            ;GET ROUNDING DIGIT
73B5 324B23    =3636        STA    RDIGI        ;SAVE
73B8 CDE273    =3637 EXPC3: CALL   RIGHT        ;ALIGN VALUES
73BB D1        =3638        POP    D
73BC C1        =3639        POP    B
73BD C9        =3640        RET
               =3641 ;***********************************************;
               =3642 $EJECT
               =3643 ;***************************************************************
               =3644 ; NAME - LOAD
               =3645 ;
               =3646 ; THIS ROUTINE IS USED TO LOAD A FLOATING POINT VALUE
               =3647 ; INTO THE WORKING BUFFER
               =3648 ;
               =3649 ; ENTRY PARAMETERS
               =3650 ;   H,L  - ADDRESS OF VALUE TO PUT IN BUFFER
               =3651 ;
               =3652 ; EXIT PARAMETERS
               =3653 ;   BUF  - CONTAINS VALUE INCLUDING SIGN AND EXPONENT
               =3654 ;   RDIGI - ROUNDING DIGIT SET TO ZERO
               =3655 ;
               =3656 ; REGISTERS DESTROYED
               =3657 ;   A,D,E,E,H,L
               =3658 ;***************************************************************
               =3659
73BE 114823    =3660 LOAD:  LXI    D,SIGN       ;POINT TO SIGN OF BUFFER
73C1 0E05      =3661        MVI    C,DIGIT+1    ;BYTE COUNT
73C3 2B        =3662        DCX    H
73C4 7E        =3663 LOAD1: MOV    A,M          ;GET VALUE
73C5 12        =3664        STAX   D            ;PUT IN BUFFER
73C6 2B        =3665        DCX    H
73C7 1B        =3666        DCX    D
73C8 0D        =3667        DCR    C
73C9 C2C473    =3668        JNZ    LOAD1
73CC AF        =3669        XRA    A
73CD 12        =3670        STAX   D            ;ZERO CARRY/BORROW BYTE
73CE 1B        =3671        DCX    D
73CF 12        =3672        STAX   D            ;SET ERROR FLAG TO ZERO
73D0 324B23    =3673        STA    RDIGI        ;ZERO ROUNDING DIGIT
73D3 C9        =3674        RET
```

```
LOC  OBJ          LINE     SOURCE STATEMENT

=3675 ;************************************************************
                =3676 $EJECT
                =3677 ;************************************************************
                =3678 ; NAME - STORE
                =3679 ;
                =3680 ; THIS ROUTINE IS USED TO STORE THE VALUE IN THE WORKING
                =3681 ; BUFFER INTO MEMORY.
                =3682 ;
                =3683 ; ENTRY PARAMETERS
                =3684 ;   B,C  - ADDRESS TO STORE BUFFER VALUE
                =3685 ;   BUF  - VALUE TO STORE
                =3686 ;
                =3687 ; EXIT PARAMETERS
                =3688 ;   BUFFER VALUE PLACED INTO MEMORY
                =3689 ;
                =3690 ; REGISTERS DESTROYED
                =3691 ;   A,B,C,E,H,L
                =3692 ;************************************************************
                =3693
73D4 214923     =3694 STORE: LXI    H,EXP       ;POINT TO BUFFER EXPONENT
73D7 1E06       =3695 STOR0: MVI    E,DIGIT+2   ;NUMBER OF BYTES
73D9 7E         =3696 STOR1: MOV    A,M         ;GET BUFFER VALUE
73DA 02         =3697         STAX   B           ;PUT IN MEMORY
73DB 0B         =3698         DCX    B
73DC 2B         =3699         DCX    H
73DD 1D         =3700         DCR    E
73DE C2D973     =3701         JNZ    STOR1
73E1 C9         =3702         RET
                =3703 ;************************************************************
                =3704 $EJECT
                =3705 ;************************************************************
                =3706 ; NAME - RIGHT
                =3707 ;
                =3708 ; THIS ROUTINE IS USED TO SHIFT THE VALUE IN THE
                =3709 ; WORKING BUFFER RIGHT A SPECIFIED NUMBER OF BYTES
                =3710 ;
                =3711 ; ENTRY PARAMETERS
                =3712 ;   B    - SHIFT COUNT (IN BITS)
                =3713 ;   BUF  - VALUE TO SHIFT
                =3714 ;
                =3715 ; EXIT PARAMETERS
                =3716 ;   BUF  - SHIFTED VALUE
                =3717 ;
                =3718 ; REGISTERS DESTROYED
                =3719 ;   A,B,C,E,H,L
                =3720 ;************************************************************
                =3721
73E2 0E05       =3722 RIGHT: MVI    C,DIGIT+1   ;BUFFER BYTE COUNT
73E4 214823     =3723 RIGH1: LXI    H,BUF-1     ;BUFFER ADDRESS
73E7 78         =3724         MOV    A,B         ;GET SHIFT COUNT
73E8 D608       =3725         SUI    A           ;CHECK IF BYTE CAN BE SHIFTED
73EA D2FB73     =3726         JNC    RIGH3       ;CAN SHIFT A WHOLE BYTE
73ED 05         =3727         DCR    B           ;DECREMENT BIT COUNT
73EE F8         =3728         RM                 ;FINISHED
73EF B7         =3729         ORA    A
73F0 7E         =3730 RIGH2: MOV    A,M         ;GET BUFFER VALUE
73F1 1F         =3731         RAR                ;SHIFT
73F2 77         =3732         MOV    M,A         ;RESTORE
73F3 23         =3733         INX    H
73F4 0D         =3734         DCR    C
73F5 C2F073     =3735         JNZ    RIGH2
```

```
LOC  OBJ       LINE        SOURCE STATEMENT

73F8 C3E273    =3736          JMP    RIGHT
               =3737 ; SHIFT RIGHT ONE BYTE
73FB 47        =3738 RIGH3:  MOV    B,A
73FC AF        =3739          XRA    A
73FD 56        =3740 RIGH4:  MOV    D,M          ;GET BYTE
73FE 77        =3741          MOV    M,A          ;PUT IN PREVIOUS BYTE
73FF 7A        =3742          MOV    A,D
7400 23        =3743          INX    H
7401 0D        =3744          DCR    C
7402 C2FD73    =3745          JNZ    RIGH4
7405 C3E273    =3746          JMP    RIGHT
               =3747 ;*******************************************;
               =3748 $EJECT
               =3749 ;*******************************************
               =3750 ; NAME - LEFT
               =3751 ;
               =3752 ; THIS ROUTINE IS USED TO SHIFT THE VALUE IN THE WORKING
               =3753 ; BUFFER LEFT A SPECIFIED NUMBER OF BITS
               =3754 ;
               =3755 ; ENTRY PARAMETERS
               =3756 ;   B   - SHIFT COUNT (IN BITS)
               =3757 ;   BUF - VALUE TO SHIFT
               =3758 ;
               =3759 ; EXIT PARAMETERS
               =3760 ;   BUF - SHIFTED VALUE
               =3761 ;
               =3762 ; REGISTERS DESTROYED
               =3763 ;   A,B,C,D,H,L
               =3764 ;*******************************************
               =3765
7408 0E05      =3766 LEFT:   MVI    C,DIGIT+1    ;BUFFER BYTE COUNT
740A 214723    =3767          LXI    H,SIGN-1     ;BUFFER ADDRESS
740D 78        =3768 LEF1:   MOV    A,B          ;GET SHIFT COUNT
740E D608      =3769          SUI    8            ;CHECK IF BYTE CAN BE SHIFTED
7410 D22174    =3770          JNC    LEF3         ;CAN SHIFT WHOLE BYTE
7413 05        =3771          DCR    B            ;DECREMENT BIT COUNT
7414 F8        =3772          RM                  ;DONE
7415 B7        =3773          ORA    A
7416 7E        =3774 LEF2:   MOV    A,M
7417 17        =3775          RAL                 ;SHIFT LEFT
7418 77        =3776          MOV    M,A
7419 2B        =3777          DCX    H
741A 0D        =3778          DCR    C
741B C21674    =3779          JNZ    LEF2
741E C30874    =3780          JMP    LEFT
               =3781 ; SHIFT LEFT ONE BYTE
7421 47        =3782 LEF3:   MOV    B,A
7422 AF        =3783          XRA    A
7423 56        =3784 LEF4:   MOV    D,M          ;GET BYTE
7424 77        =3785          MOV    M,A          ;STORE PREVIOUS BYTE
7425 7A        =3786          MOV    A,D
7426 2B        =3787          DCX    H
7427 0D        =3788          DCR    C
7428 C22374    =3789          JNZ    LEF4
742B C30874    =3790          JMP    LEFT
               =3791 $EJECT
               =3792
               =3793 ;*******************************************;
               =3794 ; SET FLAGS FOR OVERFLOW,UNDERFLOW,
               =3795 ; AND DIVIDE BY ZERO
               =3796 ;
```

```
LOC  OBJ        LINE        SOURCE STATEMENT 7428 3E01     =3797 OVER:   MVI   A,1              ;SET OVERFLOW FLAG
7430 324223   =3798 OVUN:   STA   BARI             ;SET INDICATOR
7433 33       =3799 INSP:   INX   SP               ;RESTORE STACK POINTER
7434 33       =3800         INX   SP
7435 C9       =3801         RET
7436 3EFF     =3802 UNDER:  MVI   A,-1             ;UNDERFLOW VALUE
7438 C33074   =3803         JMP   OVUN
743B 3E02     =3804 DIVZ:   MVI   A,2              ;DIVIDE BY ZERO VALUE
743D C33074   =3805         JMP   OVUN
              =3806 ;************************************************
              =3807
              =3808         END
```

ASSEMBLY COMPLETE,  NO ERRORS

ISIS-II ASSEMBLER SYMBOL CROSS REFERENCE, V2.1

| Symbol | References |
|---|---|
| ACL05  | 676   703# |
| ACL10  | 706   713# |
| ACL20  | 710   712   719   721# |
| ACTDUN | 988   993   1003  1008# |
| ACTLED | 681   686   978# |
| ACTLIM | 680   687   691# |
| ACTLOP | 995#  1002  1007 |
| ACTSEG | 170#  1258 |
| ADD1   | 3314# 3321 |
| ADDOPS | 1720  1725  1743  1748  1790  1811# 1944  2002  2135 |
| ADDX   | 3282  3312# 3335 |
| ADS1   | 3280  3353# |
| ADS10  | 3385# |
| ADS2   | 3283  3290# 3298  3404 |
| ADS3   | 3364# 3372 |
| ADS4   | 3357  3374# |
| ADS5   | 3376# 3383 |
| ADS6   | 3378  3390# |
| ADS7   | 3362# |
| ADS8   | 3272  3277# |
| ADS9   | 3391  3393# |
| ADSUM  | 3257# 3352 |
| AFLIMS | 167#  1853  1905 |
| ASCBUF | 204#  205   534   539   1216  1217  1227  1230  1410  1411  3013 |
| ASCCTR | 205#  206   1174  1181  1193 |
| ASCNFP | 1217  1413  2994# |
| ASCPTR | 232#  233   540   1185  1192  1228 |
| ATP10  | 2998# 3003 |
| AU     | 90#   2579  2582  2593  2594  2597 |
| AUTFET | 1329  1407# |
| AUTGST | 190#  1212  1318  1338 |
| AVGFAC | 251#  548   1462  1477  1739  1956  2057 |
| AVGPOS | 174#  2052 |
| AVUPD  | 1947  1952# |
| BARACE | 676#  1266 |
| BARACP | 634#  1267 |
| BARBUF | 221#  222   983   999   1008  1021  1025  1046  1067  1070  1076  1084 |
| BARCTL | 249#  521   647   1243  1717  2037 |
| BARDSP | 141#  572   573   582   583   2276 |
| BARDVE | 729#  1268 |
| BARDVP | 735#  1269 |
| BARDYN | 645   1984  1993  2577# |
| BARERR | 1395  2576# |
| BARLGT | 142#  2297 |

| | | | | | | | | | | | | | | |
|---|---|---|---|---|---|---|---|---|---|---|---|---|---|---|
| BARREL | 1252 | 1256# | | | | | | | | | | | | |
| BARTAB | 1245 | 1265# | | | | | | | | | | | | |
| BD05 | 2804# | 2814 | | | | | | | | | | | | |
| BD10 | 2805# | 2807 | | | | | | | | | | | | |
| BGAVIN | 152# | | | | | | | | | | | | | |
| BINDEC | 1936 | 2785 | 2801# | | | | | | | | | | | |
| BINFLT | 550 | 1479 | 2782# | | | | | | | | | | | |
| BL | 91# | 2593 | 2594 | 2595 | 2596 | | | | | | | | | |
| BUF | 2661# | 2662 | 3312 | 3374 | 3426 | 3509 | 3723 | | | | | | | |
| CL | 93# | 2582 | | | | | | | | | | | | |
| CPU10 | 1939# | 1944 | | | | | | | | | | | | |
| CPUUPD | 1862 | 1914 | 1933# | | | | | | | | | | | |
| CR | 269# | 1168 | | | | | | | | | | | | |
| CU | 92# | | | | | | | | | | | | | |
| CURDUN | 1740 | 1747# | | | | | | | | | | | | |
| CURDVA | 229# | 230 | | | | | | | | | | | | |
| CURF | 1724 | 1728# | | | | | | | | | | | | |
| CURFVA | 234# | 235 | 385 | 1742 | 1855 | 1861 | 1907 | 1913 | 1934 | 1953 | 2058 | | | |
| CVF20 | 1951 | 1957# | | | | | | | | | | | | |
| DAT10 | 1173 | 1179# | | | | | | | | | | | | |
| DAT20 | 1201 | 1215# | | | | | | | | | | | | |
| DAT30 | 1213 | 1227# | | | | | | | | | | | | |
| DAT40 | 1171 | 1178 | 1184 | 1185 | 1188 | 1195 | 1210 | 1234# | | | | | | |
| DBEN10 | 2013# | 2021 | | | | | | | | | | | | |
| DBEN20 | 2015# | 2023 | | | | | | | | | | | | |
| DBENTS | 1980 | 2006# | | | | | | | | | | | | |
| DCPPUS | 175# | 1735 | 1848 | 1900 | 1946 | 2063 | | | | | | | | |
| DEC31H | 3148 | 3159# | | | | | | | | | | | | |
| DECBUF | 206 | 207 | 2870 | 2873 | 2893 | 2946 | | | | | | | | |
| DECFLT | 553 | 556 | 1401 | 1543 | 2249 | 2830# | | | | | | | | |
| DEL10 | 2352# | 2360 | | | | | | | | | | | | |
| DEL20 | 2354# | 2356 | | | | | | | | | | | | |
| DELAY | 575 | 585 | 1130 | 1150 | 1621 | 1704 | 1754 | 1776 | 1872 | 1924 | 1991 | 2017 | 2296 | 2347# |
| DEVDIR | 209 | 210 | 1033 | | | | | | | | | | | |
| DEVDUN | 1039 | 1084# | | | | | | | | | | | | |
| DEVINT | 1044 | 1046# | | | | | | | | | | | | |
| DEVLED | 733 | 740 | 757 | 1014# | | | | | | | | | | |
| DEVLIM | 732 | 739 | 743# | | | | | | | | | | | | |
| DEVLOP | 1049# | 1062 | 1073 | | | | | | | | | | | |
| DEVSEG | 171# | | | | | | | | | | | | | |
| DIG7SG | 2044 | 2069# | | | | | | | | | | | | |
| DIGAVG | 2053 | 2056# | | | | | | | | | | | | |
| DIGBAR | 2035 | 2066# | | | | | | | | | | | | |
| DIGDU2 | 2059# | 2070 | | | | | | | | | | | | |
| DIGDUN | 2055 | 2058# | | | | | | | | | | | | |
| DIGEST | 1992 | 2032# | | | | | | | | | | | | |
| DIGI1 | 2641# | 2649 | 2653 | 2654 | 2655 | 2656 | 2657 | 2658 | 2659 | 2667 | | | | |
| DIGI2 | 2642# | 2651 | 2660 | | | | | | | | | | | |
| DIGI3 | 2643# | 2648 | | | | | | | | | | | | |
| DIGIT | 2640# | 2641 | 2642 | 2643 | 2647 | 2662 | 2666 | 3312 | 3313 | 3363 | 3375 | 3426 | 3427 | 3476 | 3504 | 3504 |
| | 3509 | 3510 | 3528 | 3536 | 3549 | 3549 | 3611 | 3611 | 3613 | 3613 | 3622 | 3624 | 3681 | 3695 | 3722 | 3766 |
| DIGOTH | 2042 | 2046# | | | | | | | | | | | | |
| DIGSEG | 2035 | 2040# | | | | | | | | | | | | |
| DIGSEN | 2050 | 2167# | | | | | | | | | | | | |
| DIGTGT | 2048 | 2165# | | | | | | | | | | | | |
| DISELP | 1702 | 1707# | | | | | | | | | | | | |
| DISPUP | 2103 | 2115 | 2119# | | | | | | | | | | | |
| DIV0 | 3504# | 3555 | | | | | | | | | | | | |
| DIV1 | 3505# | 3570 | | | | | | | | | | | | |
| DIV3 | 3508# | 3533 | | | | | | | | | | | | |
| DIV4 | 3511# | 3522 | | | | | | | | | | | | |
| DIV5 | 3548 | 3550 | 3556# | | | | | | | | | | | |
| DIV6 | 3558 | 3568# | | | | | | | | | | | | |

```
DIV7    3567   3569#
DIVUN   3485   3488#
DIVZ    3468   3804#
DL       94#   2595   2596   2598
DP      271#   1172
DPCURP  1737   1741#
DPIN    2153   2157#
DPINTG  2128   2141#
DPMOD   1815   2590#
DPP     252#   1093   1741   1750   2054   2225   2833   2902   2937
DPPLIM  168#   1851   1903
DPTGLP  2152#  2156
DRIVER  312    342#
DSP10   1719   1722#
DSPRDY  490    561#
DTPENT  2739#  2847
DTMP1   2646#  2647   2784   2786
DTOS    1940   2449#  2557
DTS100  2190   2193#
DTS50   2172   2179
DTS75   2175   2182#
DVDE00  3479#  3481
DVDNE0  3471   3483#
DVL10   749    756#
DWEEN   1902   2109#
DVTGT   1899   2107#
DXERW   2506   2513#
DXSP10  1686   1689#
DXSP20  1688   1690#
DXSPSW  149#   1676
DXUPD   2114   2501#  2520
DXUP20  1901   1905#
DXUP40  1904   1906#
DXUP50  1909   1912#
DXUP60  1911   1913#
DXUP65  1915   2116
DXUP70  1920   1922#
DXUPSW  155#   1891
E2BUSY  184#   1125   2411   2414
E2REDY  185#   1155
E2U20   505    510    516#
E2UPD   491    496#
EEPADD  228#   229    1142   2402
EEPCUP  227#   228    1143   2400
EEPER   1127   1147   2585#
ENDFIF  235#   236    1342   1474   1503   1566
ENDLOC  77#    363    370
ENDTRA  1159   1196#
ENTSW   153#   2011   2019
EPRSTR  78#
ERAMSG  1986   2588#
ERRI    2660#  2661   3798
EU      95#    2593   2595   2597   2598   2601
EXP     2663#  2664   3286   3386   3393   3607   3694
EXPC1   3602   3607#
EXPC2   3612   3614#
EXPC3   3625   3637#
EXPCK   3255   3348   3599#
EXPD    2667#  3490   3551   3571
EXPON   233#   234    1094   1177   1215   1409
EXPTM   2649#  2650
FADD    1529   3254#
FDI1    3487   3489#
FDIV    790    937    1225   3465#
```

```
FETGT   1206   1323#
FIPUIN  535    1442#  2061
FLDC10  2877#  2889
FLDC20  2908   2910#
FLDC30  2914#
FLDC35  2921#
FLDC40  2923   2927#  2964
FLDC50  2933   2937#
FLDC70  2950   2906   2946#
FLDC80  2955#  2958
FLTDEC  612    826    1373   1535   2864#
FLTINT  794    941    3121#
FNDPRM  1709   1794#  2081
FPAVG   218#   219    906    1352   1354   1452   1526   1531   1545   1575   1583
FPDEV   219#   220    825    910    914    923    926    928    934
FPLAST  220#   221    774    809    819    1218   1220   1222   1357
FPNORM  778    792    927    939    2792   3026   3036#
FPSEN   214#   215    544    552    574    789    935    1777   2217
FPTGT   215#   216    546    555    775    820    909    921    1360   1372   1397   1400   1412   1755   2206
FPTMP1  210#   211    593    773    777    780    786    1528   1530   1534
FPTMP2  211#   212    787    791    793    936    938    940    1353   1355   1380   1582
FPTMP3  212#   213    821    823
FPTRUN  2763#
FPVARS  489    589#
FPWTS   213#   214    542    549    1223   1475   1478
PROMT   202#   203    1448   1516   1561   1564   1577
FRETDG  238#   239    833    843    1382   1541   2915   2947   2953
FSUB    776    822    924    1354   1581   3347#
FTEM1   2648#  2649
FTEM2   2650#  2651
FTEMP   2647#  2648
FTI10   3128   3130#
FTI20   3137   3152#
FTI30   3134   3155#
FTI40   3140#  3146
FTI50   3149#  3154   3157
FU      96#    2583   2584   2585
FULLFL  236#   237    1366   1459   1490   1524   1589
GU      97#    2593   2594   2595   2596   2597   2598   2602
HL      99#
HOLD1   2652#  2653   2666   2667   3502
HOLD2   2653#  2654
HOLD3   2654#  2655
HOLD4   2655#  2656
HOLD5   2656#  2657
HOLD6   2657#  2658
HOLD7   2658#  2659
HOLD8   2659#  2660
HOST    136#   541    613    1166
HU      98#    2583   2584   2585
ICTLGT  79#    523
ID75    1282   1290#
ID7510  1304#  1311
ID7520  1307   1316#
ID7530  1315   1319#
IDCTL   522    2609#
IDSLGT  80#
IL      101#
INF10   1492   1494#
INF20   1506   1509   1512#
INF30   1511   1514#
INF40   1519   1522   1525#
INF45   1538   1545#
```

```
IHF50    1544    1549#
INFFLT   216#    217     1224    1497    1527
INFIFO   1226    1464#
INITFL   543     545     547     1398    1475    1540    2245    2971#
INRNG    188#    2848
INSP     3799#
INST10   783     784#
INST20   785     795#
INSTCH   679     685     731     737     767#
INTR     1157    1235    1287    1428#
ISE210   1146    1152#
ISRDAT   321     1164#
ISREPV   318     1137#
ISRTGT   328     1277#
ISRWD    315     1120#
ISWD10   1126    1131#
IU       100#
IVSEH    2050    2097#
IVTGT    1847    2096#
IXCRY    2475    2482#
IXSP10   1658    1661#
IXSP20   1660    1662#
IXSPSW   150#    1648
IXUP5    2102    2470#   2488    2926
IXVP20   1849    1853#
IXVP40   1852    1854#
IXVP50   1857    1860#
IXVP60   1859    1861#
IXVP65   1863#   2104
IXVP70   1868    1870#
IXVPSW   156#    1839
JU       102#
KDTAB    2455    2614#
LAST75   173#    2041
LASTEG   172#    2034
LASTDG   239#    240     837     2918    2924    2932    2950
LEDDSP   646     1009    1085    1394    1985    1989    1994    2295#
LEF1     3768#
LEF2     3774#   3779
LEF3     3770    3782#
LEF4     3784#   3789
LEFT     3493    3541    3766#   3780    3790
LF       270#    1170
LL       104#
LOAD     3493    3621    3660#
LOAD1    3663#   3668
LU       103#
MAINLP   388#    393     396
MATGST   191#    1314
MATRAM   2645#   2646
MIN      116#    850     857     862
MINLP    851#    854
MINMAX   226#    227     1854    1906
MODDSP   1816    2308#
MODLP    2311#   2313
MSGDSP   423     480     882     886     1129    1148    1394    1714    1767    1789    1918    1952    1997    2001    2137    2272#
         2284
MSGLGT   139#    2274
MXEEP    520     524     1385    2085    2187    2433#   2439
MXFER    912     1353    1362    1499    1530    1548    1563    1585    1712    1761    1783    1955    2275    2298    2331#   2337
NEGDIR   1029    1032#
NEGINT   1042    1045#
NL       105#    2601    2602
```

| Symbol | | | | | | | | | | | | | | |
|---|---|---|---|---|---|---|---|---|---|---|---|---|---|---|
| NORM10 | 3049# | 3071 | | | | | | | | | | | | |
| NORM30 | 3057 | 3073# | | | | | | | | | | | | |
| NORM40 | 3046 | 3084# | | | | | | | | | | | | |
| NTEROF | 193# | 1204 | | | | | | | | | | | | |
| NTERUN | 192# | 1209 | 1404 | | | | | | | | | | | |
| NUMLED | 230# | 231 | 692 | 702 | 703 | 721 | 745 | 755 | 756 | 795 | 905 | 942 | 954 | 973 | 990 | 1026 |
| NUMWTS | 231# | 232 | 902 | 986 | 1331 | 1363 | 1460 | 1549 | 1583 | | | | | |
| NXBYDV | 1060 | 1064# | | | | | | | | | | | | |
| NXTBAR | 1000 | 1004# | | | | | | | | | | | | |
| NXTDUN | 1069 | 1072# | | | | | | | | | | | | |
| NXTNEG | 1066 | 1070# | | | | | | | | | | | | |
| OL | 107# | 2580 | 2581 | 2586 | 2587 | | | | | | | | | |
| OTF10 | 1569 | 1572 | 1575# | | | | | | | | | | | |
| OTF20 | 1574 | 1577# | | | | | | | | | | | | |
| OTFFLT | 217# | 218 | 1559 | 1579 | | | | | | | | | | |
| OU | 106# | | | | | | | | | | | | | |
| OUTFIF | 1493 | 1554# | | | | | | | | | | | | |
| OVER | 3288 | 3486 | 3797# | | | | | | | | | | | |
| OVRERR | 885 | 2586# | | | | | | | | | | | | |
| OVRNG | 189# | 830 | 1375 | 1537 | 2962 | | | | | | | | | |
| OVUN | 3798# | 3803 | 3805 | | | | | | | | | | | |
| PACK | 2677# | 2787 | 2845 | 3019 | | | | | | | | | | |
| PACK2 | 2678 | 2681 | 2691# | | | | | | | | | | | |
| PARMCN | 169# | 519 | 1657 | 1689 | | | | | | | | | | |
| PARMID | 255# | 502 | 507 | 511 | 518 | 1800 | | | | | | | | |
| PIDINT | 501 | 506 | 512 | 517 | 2593# | | | | | | | | | |
| PLED10 | 959# | 967 | | | | | | | | | | | | |
| PLED20 | 960 | 969# | | | | | | | | | | | | |
| PLEDCO | 686 | 738 | 946# | | | | | | | | | | | |
| PNUM | 81# | 364 | 371 | | | | | | | | | | | |
| POINT | 117# | 874 | | | | | | | | | | | | |
| POWER | 311# | 325 | | | | | | | | | | | | |
| PROPTA | 957 | 2605# | | | | | | | | | | | | |
| PU | 108# | 2580 | 2581 | 2594 | 2595 | | | | | | | | | |
| RAM05 | 410# | 419 | | | | | | | | | | | | |
| RAMAMT | 73# | 408 | | | | | | | | | | | | |
| RAMBAS | 200# | 201 | 202 | | | | | | | | | | | |
| RAMER | 422 | 2583# | | | | | | | | | | | | |
| RAMERR | 354 | 413 | 422# | | | | | | | | | | | |
| RAMOK | 376 | 2579# | | | | | | | | | | | | |
| RAMSTA | 72# | 407 | | | | | | | | | | | | |
| RAMTST | 375 | 407# | | | | | | | | | | | | |
| RAMUPD | 492 | 528# | | | | | | | | | | | | |
| RATE | 237# | 238 | 1834 | 1863 | 1871 | 1885 | 1915 | 1923 | | | | | | |
| RCLR | 538 | 595 | 598 | 908 | 985 | 1023 | 1232 | 1451 | 1454 | 1457 | 2374# | 2381 | 2875 | 2974 |
| RCTRL | 2664# | 2665 | 3267 | 3618 | | | | | | | | | | |
| RDENTE | 656 | 1975# | | | | | | | | | | | | |
| RDIGI | 2665# | 3636 | 3673 | | | | | | | | | | | |
| RDMOD1 | 1619# | 1627 | 1633 | | | | | | | | | | | |
| RDMOD2 | 1625 | 1630# | | | | | | | | | | | | |
| RDMODS | 389 | 620 | 657 | 1607# | | | | | | | | | | |
| RDXP10 | 1889# | 1925 | | | | | | | | | | | | |
| RDXSEL | 653 | 1674# | 1692 | | | | | | | | | | | |
| RDXVAL | 655 | 1883# | | | | | | | | | | | | |
| REAR | 203# | 204 | 1335 | 1349 | 1449 | 1495 | 1501 | 1514 | | | | | | |
| REFRES | 614 | 1233 | 1239# | | | | | | | | | | | |
| REPCTR | 164# | 1617 | 1631 | 2014 | | | | | | | | | | |
| RESTRT | 324# | | | | | | | | | | | | | |
| REVBAR | 1988 | 2589# | | | | | | | | | | | | |
| RFPAVG | 241# | 811 | 919 | 922 | 1455 | 1537 | 1542 | 1546 | | | | | | |
| RIGH1 | 3723# | | | | | | | | | | | | | |
| RIGH2 | 3730# | 3735 | | | | | | | | | | | | |
| RIGH3 | 3726 | 3738# | | | | | | | | | | | | |

```
RIGH4   3740#  3745
RIGHT   3285   3637   3722#  3736   3748
RIMB    261#   378    1139   1299   1304   1375   1387   2404
RIXP10  1838#  1873
RIXSEL  652    1646#  1664
RIXVAL  654    1832#
RL      109#   2579   2580   2581   2586   2587
RNDUP   616#   622
ROM1    74#    361
ROM10K  366    2580#
ROM2    75#    363
ROM20K  373    2581#
ROMER   479    2584#
ROMERR  470    479#
ROMLGT  76     362    369
ROMT10  443    448#
ROMT20  451#   455    457
ROMT30  471#
ROMTST  365    372    439#   477
ROTDUN  1057   1059#
RDTNEG  1055   1058#
ROUNDG  240#   241    2920   2952
RSAV    1138   1165   1281   1417#
RSSWIT  154#   1615   1623
RUN     391    395#
RUNMOD  395    612#
RUNPOS  161#   390    621
S0      119#   878    2599   2600
S1      120#   2580   2583   2586   2599
S2      121#   2581   2584   2587
S3      122#   2585
S4      123#
S5      124#
S6      125#
S7      126#
S7AVIN  151#   807    817
S8      127#
S9      128#
SA5     808    811#
SA6     810    812#
SD5     815    825#
SD6     824    826#
SEGACT  805#   1260
SEGDIF  222#   223    834   848   856   861   863   977   1710  1713  1763  1766  1785  1788  1817  1949
        1953   1961   2000  2083  2124  2136  2151  2309
SEGCTL  250#   1257   1722  2043
SEGDAT  836    1765   1787  2136  2555# 2562
SEGDEV  815#   1262
SEGDSP  138#   569    570   579   580   2273
SEGERR  831    884#
SELPAR  208#   209    648   1655  1662  1683  1690  1715  1801  1842  1874  1945  1995  2033  2062  2069
        2188
SENFAC  253#   254    551   1779  1794  2215
SENPOS  176#   1998   2049  2189
SETDIR  1031   1033#
SETEXP  615    1089#  1229
SETLOO  650#   660
SETMOD  392    640#
SETUP   392#
SETUFO  162#   658
SHIFTL  2693   2705#  2938
SHIFTR  866    2726   2730#  3165
SHLN10  3102#  3106
```

| Symbol | | | | | | | | | | | | | | | |
|---|---|---|---|---|---|---|---|---|---|---|---|---|---|---|---|
| SHLNYB | 3059 | 3066 | 3088# | | | | | | | | | | | | |
| SHLR10 | 2746# | 2754 | | | | | | | | | | | | | |
| SHLRGT | 2744# | | | | | | | | | | | | | | |
| SHOSEG | 813 | 827# | | | | | | | | | | | | | |
| SHSG10 | 846 | 854# | | | | | | | | | | | | | |
| SHSG12 | 847 | 861# | | | | | | | | | | | | | |
| SHSG15 | 842 | 855 | 860 | 863# | | | | | | | | | | | |
| SHSG20 | 868# | 872 | | | | | | | | | | | | | |
| SHSG30 | 869 | 873# | | | | | | | | | | | | | |
| SHSG40 | 877# | | | | | | | | | | | | | | |
| SHSG45 | 880 | 882# | | | | | | | | | | | | | |
| SIGN | 2662# | 2663 | 3259 | 3266 | 3349 | 3351 | 3356 | 3387 | 3496 | 3660 | 3767 | | | | |
| SIGND | 2666# | 3499 | | | | | | | | | | | | | |
| SIMB | 262# | 380 | 617 | 624 | 1141 | 1380 | 1390 | 2407 | | | | | | | |
| SLOMSG | 359 | 367 | 374 | 377 | 2284# | | | | | | | | | | |
| SLOW | 165# | 1703 | 1753 | 1775 | 1833 | 1834 | 1990 | | | | | | | | |
| SPC | 115# | 861 | 2579 | 2579 | 2583 | 2584 | 2585 | 2586 | 2587 | 2588 | 2588 | 2588 | 2588 | | |
| ST10 | 351# | 357 | | | | | | | | | | | | | |
| STACKT | 242# | 311 | 346 | | | | | | | | | | | | |
| STACUR | 358 | 2582# | | | | | | | | | | | | | |
| STABEP | 2060 | 2241 | 2391# | 2435 | | | | | | | | | | | |
| STAKA | 2651# | 2652 | | | | | | | | | | | | | |
| STE2DU | 2398 | 2416# | | | | | | | | | | | | | |
| STE2P | 2413# | 2415 | | | | | | | | | | | | | |
| STKAMT | 71# | | | | | | | | | | | | | | |
| STOR1 | 3696# | 3701 | | | | | | | | | | | | | |
| STORE | 3291 | 3694# | | | | | | | | | | | | | |
| STORO | 3573 | 3695# | | | | | | | | | | | | | |
| SU | 110# | 2582 | 2597 | 2592 | 2601 | 2601 | | | | | | | | | |
| SUB1 | 3429# | 3439 | | | | | | | | | | | | | |
| SUEX | 3355 | 3426# | | | | | | | | | | | | | |
| SWDELA | 163# | 1620 | 2016 | | | | | | | | | | | | |
| SWITCH | 148# | 763 | 806 | 816 | 1614 | 1622 | 1647 | 1675 | 1638 | 1890 | 2010 | 2018 | | | |
| SYSCTL | 207# | 208 | 384 | 641 | 829 | 1124 | 1153 | 1199 | 1202 | 1207 | 1283 | 1312 | 1316 | 1327 | 1367 | 1374 |
| | 1402 | 1536 | 1651 | 1679 | 1835 | 1886 | 1976 | 2409 | 2413 | 2866 | 2960 | | | | |
| SYSINI | 382 | 488# | | | | | | | | | | | | | |
| TGERR | 1393 | 2567# | | | | | | | | | | | | | |
| TGT10 | 1338 | 1341 | 1344# | | | | | | | | | | | | |
| TGT20 | 1343 | 1347 | 1349# | | | | | | | | | | | | |
| TGT30 | 1367# | 1414 | | | | | | | | | | | | | |
| TGTERR | 1376 | 1392# | | | | | | | | | | | | | |
| TGTOFF | 183# | 1369 | | | | | | | | | | | | | |
| TGTON | 182# | 1200 | 1285 | | | | | | | | | | | | |
| TGTPOS | 177# | 1732 | 1846 | 1898 | 1996 | 2047 | | | | | | | | | |
| TGTWT | 254# | 255 | 554 | 1383 | 1399 | 1757 | 1762 | 2204 | | | | | | | |
| TL | 111# | 2582 | 2602 | 2602 | | | | | | | | | | | |
| TRNTRK | 3 | | | | | | | | | | | | | | |
| TRUDWN | 1080 | 1083# | | | | | | | | | | | | | |
| TRUNC | 1063 | 1074# | | | | | | | | | | | | | |
| TRUNEG | 1077 | 1081# | | | | | | | | | | | | | |
| UL | 113# | | | | | | | | | | | | | | |
| UNDER | 3396 | 3397 | 3488 | 3553 | 3802# | | | | | | | | | | |
| UNITSE | 677 | 684 | 730 | 736 | 901# | | | | | | | | | | |
| UNPACK | 2721# | 2879 | | | | | | | | | | | | | |
| UPDAD | 224# | 225 | 1758 | 1780 | 2130 | 2183 | 2205 | 2216 | 2232 | 2248 | | | | | |
| UPDATP | 649 | 1663 | 1691 | 1701# | | | | | | | | | | | |
| UPDBUF | 223# | 224 | 1759 | 1781 | 1935 | 1937 | 1945 | 1952 | 2100 | 2112 | 2123 | 2132 | 2145 | 2170 | 2181 | 2182 |
| | 2185 | | | | | | | | | | | | | | |
| UPDFP | 225# | 226 | 1756 | 1778 | 2207 | 2218 | 2244 | 2246 | | | | | | | |
| UPDTAB | 2051 | 2079# | | | | | | | | | | | | | |
| UPDTS | 2208 | 2219 | 2223# | | | | | | | | | | | | |
| UPSEN | 1738 | 1772# | | | | | | | | | | | | | |
| UPSENX | 1779# | 1999 | | | | | | | | | | | | | |

| | | | | | | | | |
|---|---|---|---|---|---|---|---|---|
| UPCH | 2066 | 2193 | 2211# | | | | | |
| UPTG | 2065 | 2191 | 2198# | | | | | |
| UPTGT | 1734 | 1748# | | | | | | |
| UPTGTX | 1757# | 1997 | | | | | | |
| USC5 | 904 | 917# | | | | | | |
| US06 | 915 | 925# | | | | | | |
| US10 | 931 | 934# | | | | | | |
| US15 | 933 | 942# | | | | | | |
| UU | 112# | | | | | | | |
| VALIDS | 166# | 1729 | 1843 | 1975 | | | | |
| VALOFF | 187# | 643 | | | | | | |
| VALON | 164# | 1653 | 1681 | 1834 | 1857 | 1977 | | |
| VERUPD | 504 | 509 | 514 | 2134 | 2535# | 2542 | | |
| WDTMR | 144# | 343 | 388 | 414 | 482 | 619 | 651 | 1152 | 2395 | 2408 |
| WTFIFO | 201# | 1334 | 1447 | 1472 | 1510 | 1573 | | |
| YU | 114# | | | | | | | |
| ZCK10 | 1104# | 1108 | | | | | | |
| ZERCHK | 920 | 1098# | 1221 | | | | | |

CROSS REFERENCE COMPLETE

What I claim is:

1. A display system, comprising:
   interface means for adjusting data received from a host system to be compatible with said display system;
   data processing means for controlling said interface means and processing said adjusted data to provide a quantitative function; and
   display means controlled by said date processing means for displaying said quantitative function as provided by said data processing means.

2. A display system as defined in claim 1 wherein said display means comprises a bar-graph display.

3. A display system as defined in claim 2 wherein said bar-graph display is comprised of light emitting diode segments.

4. A display system as defined in claim 2 wherein said quantitative function is a linear function of a single host system occurrence as received by said interface means.

5. A display system as defined in claim 2 wherein said quantitative function is a proportional function of a single host system occurrence as received by said interface means.

6. A display system as defined in claim 2 wherein said quantitative function is a linear function of a plurality of host system occurrences as received by said interface means.

7. A display system as defined in claim 2 wherein said quantitative function is a proportional function of a plurality of host system occurrences as received by said interface means.

8. A display system as defined in claim 2 wherein said quantitative function is a linear deviation from a preset value of a single host system occurrence as received by said interface means.

9. A display system as defined in claim 2 wherein said quantitative function is a proportional deviation from a preset value of a single host system occurrence as received by said interface means.

10. A display system as defined in claim 2 wherein said quantitative function is a linear deviation from a preset value of a plurality of host system occurrences as received by said interface means.

11. A display system as defined in claim 2 wherein said quantitative function is a proportional deviation from a preset value of a plurality of host system occurrences as received by said interface means.

12. A display system as defined in claim 1 wherein said display means comprises a numerical display.

13. A display system as defined in claim 12 wherein said display means is a plurality of 7-segment LED numerical displays.

14. A display system as defined in claim 12 wherein said quantitative function is a linear function of a single host system occurrence as received by said interface means.

15. A display system as defined in claim 12 wherein said quantitative function is a linear function of a plurality of host system occurrences as received by said interface means.

16. A display system as defined in claim 12 wherein said quantitative function is a linear deviation from a preset value of a single host system occurrence as received by said interface means.

17. A display system as defined in claim 12 wherein said quantitative function is a linear deviation from a preset value of a plurality of host system occurrences as received by said interface means.

18. A display system as defined in claim 1 wherein said display means comprises a bar-graph display and a numerical display.

19. A display system as defined in claim 18 wherein tthe quantitative function displayed by said bar-graph display is selected from the group comprised of:
   linear function of a single host system occurrence as received by said interface means, proportional function of a single host system occurrence as received by said interface means, linear function of a plurality of host system occurrences as received by said interface means, proportional function of a plurality of host system occurrences as received by said interface means, linear deviation from a preset value of a single host system occurrence as received by said interface means, proportional deviation from a preset value of a single host system occurrence as received by said interface means, linear deviation from a preset value of a plurality of host system occurrences as received by said interface means, proportional deviation from a preset value of a plurality of host system occurrences as received by said interface means; and said quantitative function displayed by said numerical display is selected from the group comprised of: linear function of a single host system occurrence as received by said interface means, linear function of a plurality of host system occurrences as received by said interface means, linear deviation from a preset value of a single host system occurrence as received by said interface means, linear deviation from a preset value of a plurality of host system occurrences as received by said interface means.

20. A display system as defined in claim 1 wherein said interface means adjusts said data received from said host system for format and timing.

21. A display system as defined in claim 20 wherein said format adjustment is provided by a plurality of operator controlled switches.

22. A display system as defined in claim 20 wherein said timing adjustment is selected from a plurality of available timing adjustments via operator control switching means.

23. A display system as defined in claim 1, further comprising latch means interconnected between said display means and said data processing means for maintaining said quantitative function input to said display means while said data processing means is processing additional adjusted data received from said interface means.

24. A display system as defined in claim 1, wherein said interface means comprises a universal asynchronous receiver-transmitter.

25. A display system as defined in claim 1 wherein said data processing means comprises:
 a central processor unit;
 a programmable read only memory for storing the system program; and
 a random access memory for storing data upon which said quantitative function is based.

26. A display system as defined in claim 1 wherein said interface means converts data received in serial format to a parallel format.

27. A display system, comprising:
 a plurality of numerical display digits;
 a numerical display latch register for each of said numerical display digits for maintaining energizing potentials for said numerical display;
 a bar-graph display including a plurality of individual light emitting segments;
 a bar-graph display latch register for providing energizing potentials to said bar-graph display;
 a universal asynchronous receiver-transmitter for converting host system data from a serial format to a parallel word format;
 a central processor unit;
 a divider for converting a clock pulse train produced by said central processing unit into a plurality of timing pulse trains, each of different duration;
 timing switch means for selectively connecting one of said plurality of timing pulse trains to said universal asynchronous receiver-transmitter;
 programmable read-only memory means for storing a program for said central processing unit;
 random access memory means for storing data in response to the requirements of said program;
 bidirectional data flow control means;
 a first data bus means for coupling parallel data words between said universal asynchronous receiver-transmitter, said numerical latch registers, and said bar-graph indicator latch register and said bidirectional data flow control means;
 second bus means for coupling said bidirectional data flow control means to said central processing unit;
 decoder means responsive to putputs from said central processing unit for controlling data loading into said numerical display latch registers and said bar-graph display latch registers;
 a line driver coupled to said first data bus;
 a mode selection switching means coupled to said central processing unit through said line driver for controlling the operational mode of the system;
 a run/setup switch coupled to said central processing unit through said line driver for setting the central processing unit to function in a data processing mode or enable said central processing unit and associated random access memory to receive parameter data;
 increment switch means coupled to said first data bus through said line driver for incrementing said parameter data;
 decrement switch means coupled to said first data bus through said line driver for decrementing said parameter data;
 enter switch means coupled to said first data bus through said line driver for causing the storage of said incremented or decremented data; and
 a plurality of switch means for controlling the format of serial data to be recognized by said universal asynchronous receiver-transmitter.

28. A display system, comprising:
 interface means for adjusting data received from a weight determining system to be compatible with said display system;
 data processing means for controlling said interface means and processing said adjusted data to provide a quantitative function; and
 display means controlled by said data processing means for displaying said quantitative function as provided by said data processing means.

29. A display system as defined in claim 28 wherein said display means comprises a bar-graph display and a numerical display.

30. A display system as defined in claim 29 wherein the quantitative function displayed by said bar-graph display is selected from the group comprised of:
 linear function of a single host system occurrence as received by said interface means, proportional function of a single host system occurrence as received by said interface means, linear function of a plurality of hot system occurrences as received by said interface means, proportional function of a plurality of host system occurrences as received by said interface means, linear deviation from a preset value of a single host system occurrence as received by said interface means, proportional deviation from a preset value of a single host system occurrence as received by said interface means, linear deviation from a preset value of a plurality of host system occurrences as received by said interface means, proportional deviation from a preset value of a plurality of host system occurrences ad received by said interface means; and said quantitative function displayed by said numerical display is selected from the group comprised of:

linear function of a plurality of host system occurrences as received by said interface means, linear deviation from a preset value of a single host system occurrence as received by said interface means, linear deviation from a preset value of a plurality of host system occurrences as received by said interface means.

* * * * *